United States Patent
Park et al.

(10) Patent No.: US 12,218,193 B2
(45) Date of Patent: *Feb. 4, 2025

(54) INTEGRATED CIRCUIT DEVICE AND METHOD OF FORMING THE SAME

(71) Applicant: Samsung Electronics Co., Ltd., Suwon-si (KR)

(72) Inventors: Jae-hyun Park, Hwaseong-si (KR); Kye-hyun Baek, Suwon-si (KR); Yong-ho Jeon, Hwaseong-si (KR); Cheol Kim, Hwaseong-si (KR); Sung-il Park, Suwon-si (KR); Yun-il Lee, Anyang-si (KR); Hyung-suk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 281 days.

This patent is subject to a terminal disclaimer.

(21) Appl. No.: 17/528,251

(22) Filed: Nov. 17, 2021

(65) Prior Publication Data

US 2022/0077285 A1    Mar. 10, 2022

Related U.S. Application Data

(63) Continuation of application No. 16/033,488, filed on Jul. 12, 2018, now Pat. No. 11,211,450.

(30) Foreign Application Priority Data

Mar. 12, 2018 (KR) .................. 10-2018-0028730

(51) Int. Cl.
*H01L 29/06* (2006.01)
*H01L 21/8234* (2006.01)
(Continued)

(52) U.S. Cl.
CPC .. *H01L 29/0653* (2013.01); *H01L 21/823431* (2013.01); *H01L 27/0886* (2013.01); *H01L 29/66818* (2013.01)

(58) Field of Classification Search
CPC ......... H01L 29/0653; H01L 21/823431; H01L 27/0886; H01L 29/66818; H01L 29/66545;
(Continued)

(56) References Cited

U.S. PATENT DOCUMENTS 8,304,824 B2   11/2012  Kim et al.
8,809,920 B2    8/2014  Khakifirooz et al.
(Continued)

FOREIGN PATENT DOCUMENTS

CN    102034824 A    4/2011
CN    103811535 A    5/2014
(Continued)

OTHER PUBLICATIONS

Korean Office action mailed Apr. 27, 2022 for corresponding KR Patent Application No. 10-2018-0028730.
(Continued)

*Primary Examiner* — Shahed Ahmed
*Assistant Examiner* — Sun Mi Kim King
(74) *Attorney, Agent, or Firm* — Muir Patent Law, PLLC

(57) ABSTRACT

An integrated circuit (IC) device includes a first region and a second region adjacent to each other along a first direction on a substrate, fin patterns in each of the first and second regions extending along a second direction perpendicular to the first direction; gate electrodes extending along the first direction and intersecting the fin patterns; and an isolation region between the first and second regions, a bottom of the isolation region having a non-uniform height relative to a bottom of the substrate.

19 Claims, 120 Drawing Sheets

(51) Int. Cl.
*H01L 27/088* (2006.01)
*H01L 29/66* (2006.01)

(58) Field of Classification Search
CPC ........... H01L 29/1033; H01L 29/42356; H01L 21/823412; H01L 21/823481; H01L 21/823437
See application file for complete search history.

(56) References Cited

U.S. PATENT DOCUMENTS

| | | |
|---|---|---|
| 9,331,074 B1 | 5/2016 | Chang et al. |
| 9,412,616 B1 | 8/2016 | Xie et al. |
| 9,490,129 B2 | 11/2016 | Hu et al. |
| 9,564,369 B1 | 2/2017 | Kim et al. |
| 9,659,930 B1 | 5/2017 | Yu et al. |
| 9,728,643 B2 | 8/2017 | Park et al. |
| 9,741,854 B2 | 8/2017 | Bai et al. |
| 9,754,936 B2 | 9/2017 | Park et al. |
| 9,761,495 B1 | 9/2017 | Xie et al. |
| 9,786,507 B2 | 10/2017 | Anderson et al. |
| 9,812,365 B1 | 11/2017 | Zhang et al. |
| 9,837,276 B2 | 12/2017 | Greene et al. |
| 9,899,267 B1 * | 2/2018 | Liou ............... H01L 21/823481 |
| 9,905,468 B2 | 2/2018 | Kim et al. |
| 10,177,148 B2 | 1/2019 | Ha et al. |
| 11,211,450 B2 * | 12/2021 | Park ................ H01L 27/0886 |
| 2002/0024111 A1 | 2/2002 | Shin |
| 2012/0018783 A1 | 1/2012 | Iwasawa et al. |
| 2014/0227857 A1 | 8/2014 | Youn et al. |
| 2015/0325482 A1 * | 11/2015 | Hu ................... H01L 21/31111 438/585 |
| 2016/0027700 A1 | 1/2016 | Cai et al. |
| 2016/0351568 A1 | 12/2016 | Chang et al. |
| 2017/0148682 A1 | 5/2017 | Basker et al. |
| 2017/0200802 A1 | 7/2017 | Myung et al. |
| 2017/0221893 A1 | 8/2017 | Tak et al. |
| 2017/0345911 A1 | 11/2017 | Yu et al. |
| 2018/0005870 A1 | 1/2018 | Hsu et al. |

FOREIGN PATENT DOCUMENTS

| | | |
|---|---|---|
| CN | 106057803 A | 10/2016 |
| CN | 106057808 A | 10/2016 |
| CN | 106158746 A | 11/2016 |
| CN | 106384717 A | 2/2017 |
| CN | 107039526 A | 8/2017 |
| CN | 107275213 A | 10/2017 |
| CN | 107644816 A | 1/2018 |
| CN | 107689373 A | 2/2018 |
| KR | 10-2017-0046337 A | 5/2017 |

OTHER PUBLICATIONS

Notice Of Allowance dated Mar. 25, 2024 for corresponding Application No. CN 201811058096.1.

* cited by examiner

X2 - X2'

X1 – X1'

X1 – X1'

X1 – X1'

X2 – X2'

X1 - X1'

X2 – X2'

X2 − X2'

X2 – X2'

X2 − X2'

X2 – X2'

X2 – X2'

INTEGRATED CIRCUIT DEVICE AND METHOD OF FORMING THE SAME

CROSS-REFERENCE TO RELATED APPLICATION

This is a continuation of U.S. patent application Ser. No. 16/033,488, filed Jul. 12, 2018, which is incorporated by reference herein in its entirety.

Korean Patent Application No. 10-2018-0028730, filed on Mar. 12, 2018, in the Korean Intellectual Property Office, and entitled: "INTEGRATED CIRCUIT DEVICE," is incorporated by reference herein in its entirety.

BACKGROUND

1. Field

Embodiments relate to an integrated circuit (IC) device, and more particularly, to an IC device including a fin-type active region.

2. Description of the Related Art

Highly integrated IC devices require high operation speed and accuracy of operations. Therefore, such IC devices require a reduced area occupied by interconnections and contacts, while stably maintaining an insulation distance between the contacts.

SUMMARY

According to an aspect of embodiments, there is provided an IC device, including a first region and a second region adjacent to each other along a first direction on a substrate, fin patterns in each of the first and second regions extending along a second direction perpendicular to the first direction; gate electrodes extending along the first direction and intersecting the fin patterns; and an isolation region between the first and second regions, a bottom of the isolation region having a non-uniform height relative to a bottom of the substrate.

According to an aspect of embodiments, there is provided an IC device, including fin patterns on a substrate along a first direction, gate electrodes along a second direction perpendicular to the first direction, source/drain regions on the fin patterns, and an isolation region between and in parallel with two adjacent fin patterns of the fin patterns, the isolation region separating at least one gate electrode of the gate electrodes into first and second gate electrodes, wherein the isolation region includes a first portion between the first and second gate electrodes, and a second portion having a non-overlapping relationship with the first and second gate electrodes, a thickness of the first portion being larger than a thickness of the second portion, the thicknesses being measured along a direction normal to a bottom of the substrate.

According to an aspect of embodiments, there is provided an IC device, including fin patterns on a substrate along a first direction, gate electrodes along a second direction perpendicular to the first direction, source/drain regions on the fin patterns, and an isolation region between and in parallel with two adjacent fin patterns of the fin patterns, the isolation region separating at least one gate electrode of the gate electrodes into first and second gate electrodes, wherein the isolation region includes a first portion between the first and second gate electrodes, and a second portion having a non-overlapping relationship with the first and second gate electrodes, a thickness of the first portion being larger than a thickness of the second portion relative to a bottom of the substrate, and lower parts of the first and second portions having decreasing widths towards respective bottoms thereof.

BRIEF DESCRIPTION OF THE DRAWINGS

Features will become apparent to those of skill in the art by describing in detail exemplary embodiments with reference to the attached drawings, in which:

FIGS. 4A to 16A, 4B to 16B, and 4C to 16C illustrate cross-sectional views of stages in a method of manufacturing an IC device according to embodiments;

FIGS. 24A to 26A, 24B to 26B, and 24C to 26C illustrate cross-sectional views of stages in a method of manufacturing an IC device, according to embodiments;

FIGS. 29A to 31A, 29B to 31B, and 29C to 31C illustrate cross-sectional views of stages in a method of manufacturing an IC device, according to embodiments;

FIGS. 35A to 37A, 35B to 37B, and 35C to 37C illustrate cross-sectional views of stages in a method of manufacturing an IC device, according to embodiments;

FIGS. 40A to 42A, 40B to 42B, and 40C to 42C illustrate cross-sectional views of stages in a method of manufacturing an IC device, according to embodiments;

DETAILED DESCRIPTION

Figure 1:
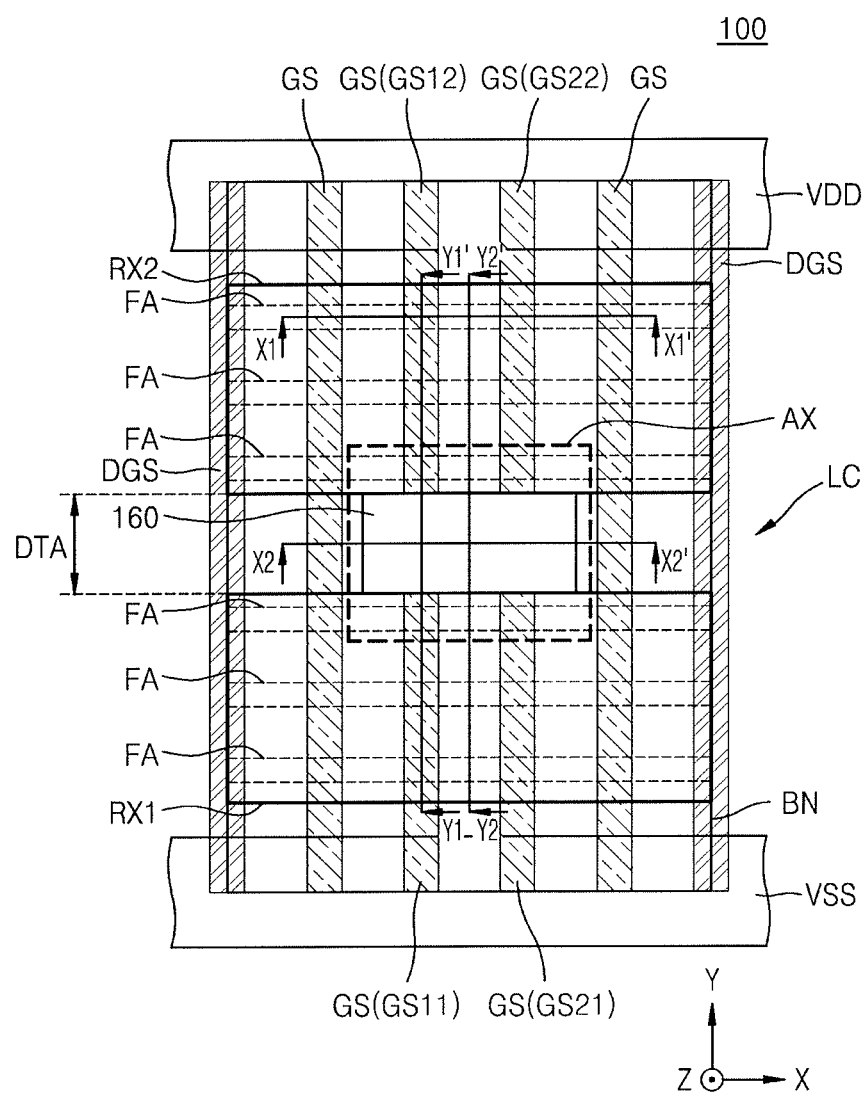
FIG. 1 illustrates a plan layout of an IC device according to embodiments.
Figure 2A:
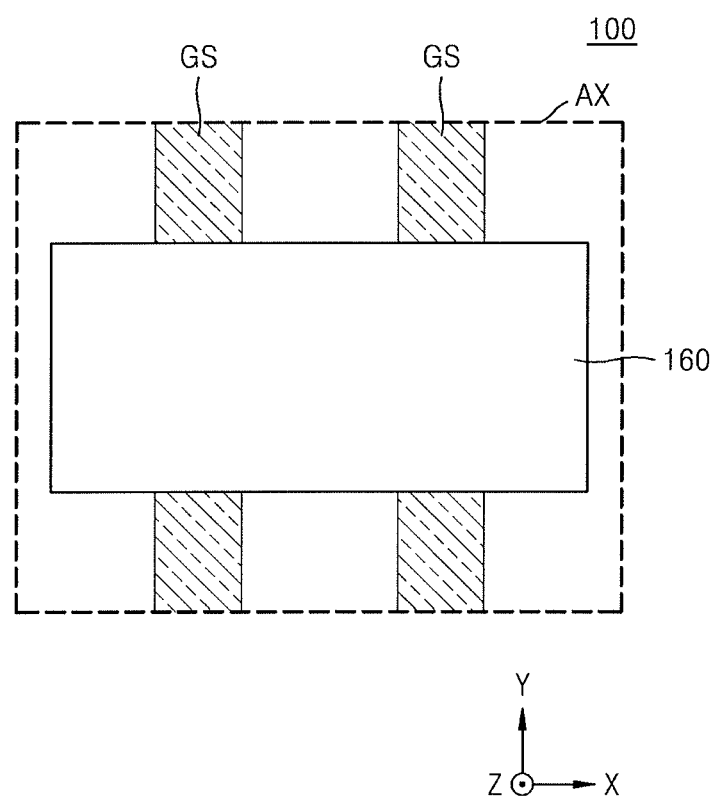
FIG. 2A illustrates an enlarged plan view of region "AX" in FIG. 1.
Figure 2B:
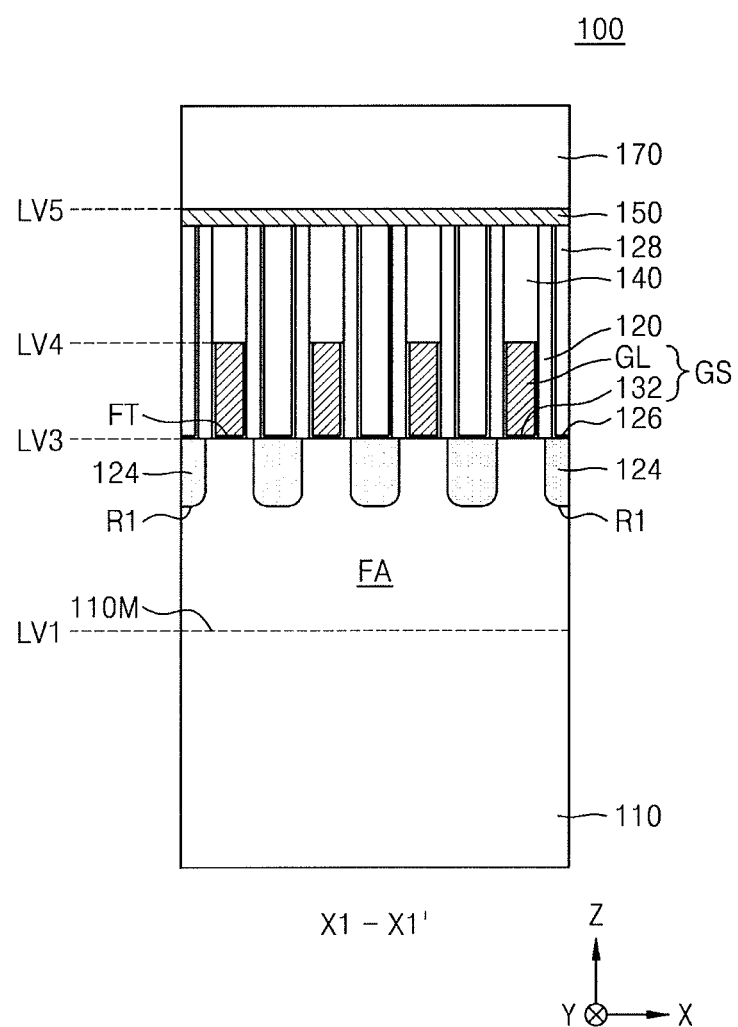
FIG. 2B illustrates a cross-sectional view taken along line X1-X1' of FIG. 1.
Figure 2C:
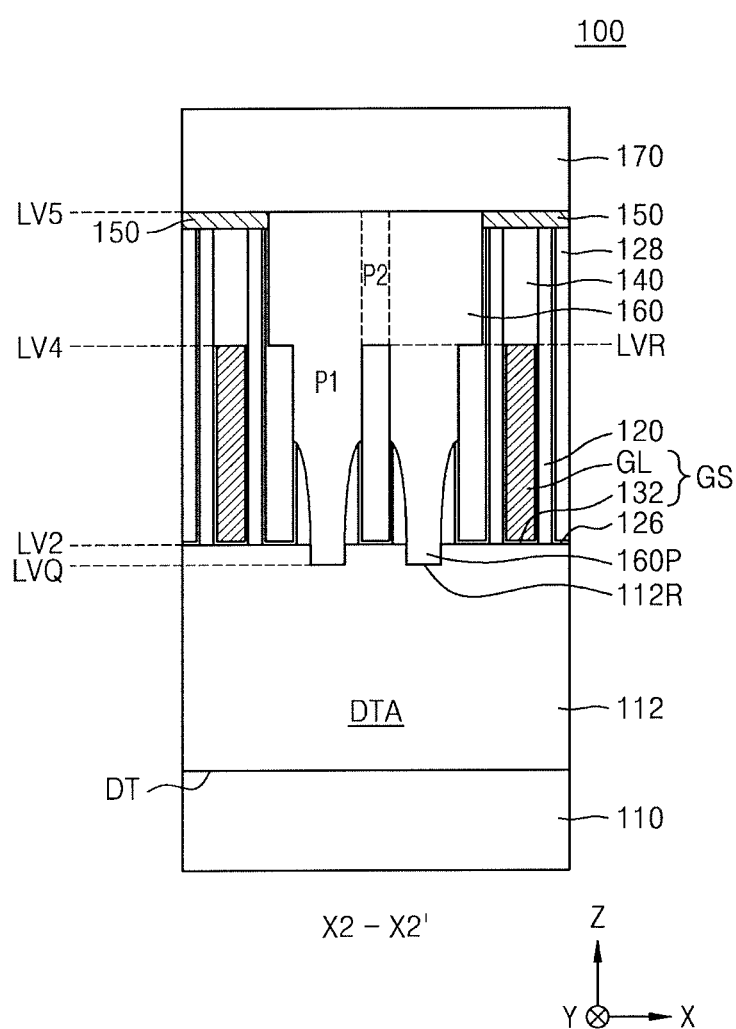
FIG. 2C illustrates a cross-sectional view taken along line X2-X2' of FIG. 1.
Figure 2D:
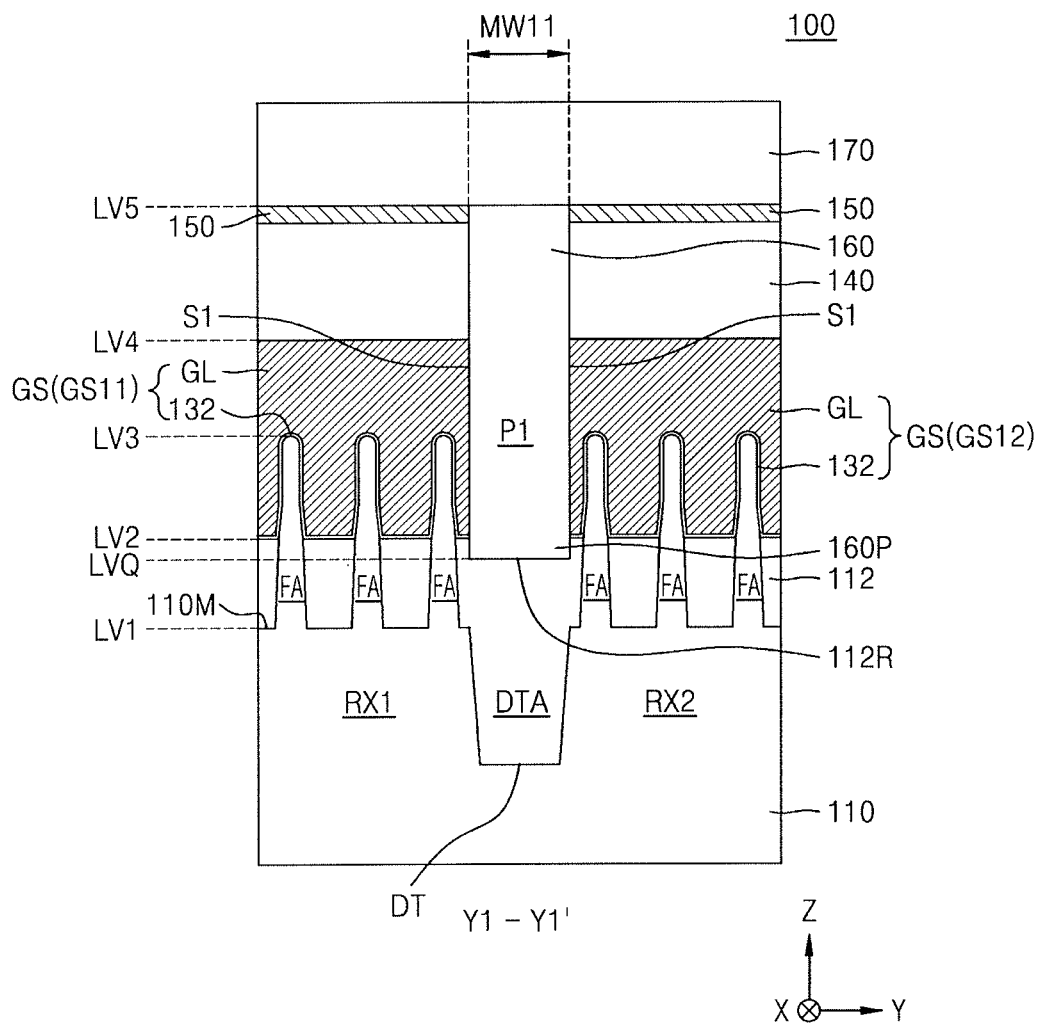
FIG. 2D illustrates a cross-sectional view taken along line Y1-Y1' of FIG. 1.
Figure 2E:
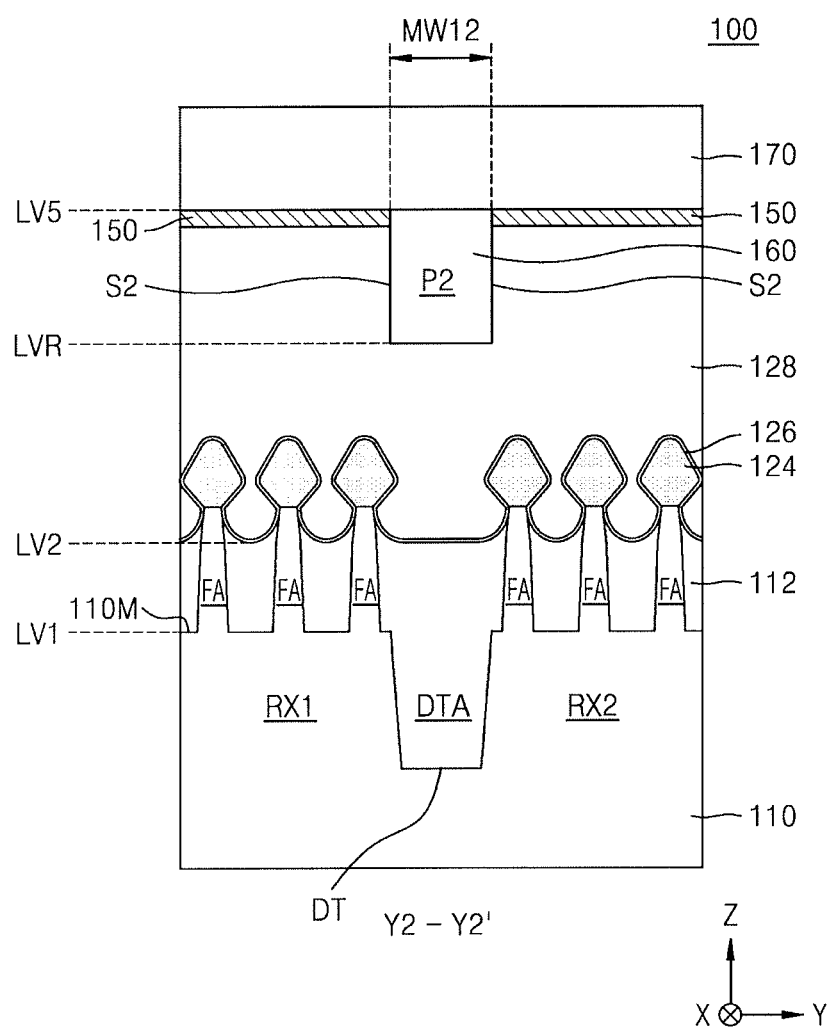
FIG. 2E illustrates a cross-sectional view taken along line Y2-Y2' of FIG. 1.

FIGS. 1 and 2A to 2E are diagrams of an integrated circuit (IC) device 100 according to embodiments. FIG. 1 is a plan layout diagram of main components of the IC device 100. FIG. 2A is an enlarged plan view of some components in a region "AX" illustrated with a dashed line in FIG. 1. FIG. 2B is a cross-sectional view taken along line X1-X1' of FIG. 1. FIG. 2C is a cross-sectional view taken along line X2-X2' of FIG. 1. FIG. 2D is a cross-sectional view taken along line Y1-Y1' of FIG. 1. FIG. 2E is a cross-sectional view taken along line Y2-Y2' of FIG. 1. The IC device 100 may include a logic cell LC including a fin field-effect transistor (FinFET) device.

Referring to FIGS. 1 to 2A to 2E, the IC device 100 may include the logic cell LC formed in a region defined by a cell boundary BN on a substrate 110.

The substrate 110 may have a main surface 110M, which may extend in a lateral direction (X-Y plane direction) at a vertical level LV1 relative to a bottom of the substrate 110, e.g., active fins may extend from and above the main surface 110M (FIGS. 2D and 2E). The substrate 110 may include a semiconductor, e.g., silicon (Si) or germanium (Ge), or a compound semiconductor, e.g., silicon germanium (SiGe), silicon carbide (SiC), gallium arsenide (GaAs), indium arsenide (InAs), or indium phosphide (InP). The substrate 110 may include a conductive region, e.g., a doped well or a doped structure.

The logic cell LC may include a first device region RX1 and a second device region RX2. A plurality of fin-type active regions FA may be formed in each of the first device region RX1 and the second device region RX2 and protrude from the substrate 110. As illustrated in FIGS. 2D-2E, a deep trench DT may be formed in the substrate 110 between the first device region RX1 and the second device region RX2, and an inter-device isolation region DTA may be formed in the deep trench DT.

As illustrated in FIG. 1, the plurality of fin-type active regions FA may extend parallel to each other in a widthwise direction (X direction) of the logic cell LC. As shown in FIG. 2D, a device isolation film 112 may be formed in regions between each of the plurality of fin-type active regions FA and in the inter-device isolation region DTA on the substrate 110. In the first device region RX1 and the second device region RX2, each of the plurality of fin-type active regions FA may protrude as a fin type over the device isolation film 112.

As further illustrated in FIG. 1, a plurality of gate structures GS, i.e., gate electrodes GS, may be provided over the substrate 110 and extend in a lengthwise direction (Y direction) of the logic cell LC, which is a direction intersecting the plurality of fin-type active regions FA. As illustrated in FIGS. 2B-2D, each of the plurality of gate structures GS may have a stack structure of a gate dielectric film 132 and a gate line GL. The gate dielectric film 132 may cover a bottom surface and opposite sidewalls of the gate line GL.

The plurality of gate structures GS may extend to cover a top surface and opposite sidewalls of each of the plurality of fin-type active regions FA and a top surface of the device isolation film 112. In the first device region RX1 and the second device region RX2, a plurality of MOS transistors may be formed along the plurality of gate structures GS. The plurality of MOS transistors may be three-dimensional (3D) MOS transistors having channels formed on top surfaces and opposite sidewalls of the plurality of fin-type active regions FA, respectively.

As further illustrated in FIG. 1, a plurality of dummy gate structures DGS may extend from a portion of the cell boundary BL, which may extend in the lengthwise direction of the logic cell LC (Y direction). Similar to the gate structures GS, each of the plurality of dummy gate structures DGS may have a stack structure of the gate dielectric film 132 and the gate line GL. The gate structures GS may include the same material as the dummy gate structures DGS. However, the dummy gate structures DGS may remain electrically floated during an operation of the IC device 100. In some embodiments, the dummy gate structures DGS may be omitted.

The plurality of gate structures GS and the plurality of dummy gate structures DGS may have the same width in a widthwise direction (X direction) of the logic cell LC and may be arranged at a constant pitch in the widthwise direction (X direction).

The plurality of gate dielectric films 132 may include, e.g., a silicon oxide film, a high-k dielectric film, or a combination thereof. The high-k dielectric film may include a material having a higher dielectric constant than the silicon oxide film. The high-k dielectric film may include, e.g., a metal oxide or a metal oxynitride. An interface film may be between the fin-type active regions FA and the gate dielectric films 132. The interface film may include, e.g., an oxide film, a nitride film, or an oxynitride film.

Each of the plurality of gate lines GL may have a structure formed by sequentially stacking a metal nitride layer, a metal layer, a conductive capping layer, and a gap-fill metal film. Each of the metal nitride layer and the metal layer may include at least one metal of, e.g., titanium (Ti), tantalum (Ta), tungsten (W), ruthenium (Ru), niobium (Nb), molybdenum (Mo), and hafnium (Hf). The gap-fill metal film may include a W film or an Al film. Each of the plurality of gate lines GL may include a work-function metal-containing layer. The work-function metal-containing layer may include at least one metal of, e.g., titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). In some embodiments, each of the plurality of gate lines GL may include, e.g., a stack structure of TiAlC/TiN/W, a stack structure of TiN/TaN/TiAlC/TiN/W, or a stack structure of TiN/TaN/TiN/TiAlC/TiN/W, but embodiments are not limited thereto.

A top surface of each of the plurality of gate structures GS and the plurality of dummy gate structures DGS may be covered by a gate insulating capping layer 140. The plurality of gate insulating capping layers 140 may include, e.g., a silicon nitride film.

A plurality of insulating spacers 120 may extend in line shapes in the lengthwise direction of the logic cell LC (Y direction) to cover opposite sidewalls of each of the plurality of gate structures GS and the plurality of dummy gate structures DGS. The plurality of insulating spacers 120 may include, e.g., a silicon nitride film, a silicon oxycarbonitride (SiOCN) film, a silicon carbonitride (SiCN) film, or a combination thereof.

Recesses R1 may be formed in opposite sides of each of the gate structures GS in the plurality of fin-type active regions FA. A plurality of recesses R1 may be in one fin-type active region FA. The plurality of recesses R1 may be filled with a plurality of source/drain regions 124. In some embodiments, each of the plurality of source/drain regions 124 may have an embedded SiGe structure including a plurality of SiGe layers that are epitaxially grown. The plurality of SiGe layers may have different Ge contents. In some embodiments, the plurality of source/drain regions 124 may include an epitaxially grown Si layer or an epitaxially grown SiC layer. Although FIG. 2E illustrates a case in which each of the source/drain regions 124 has a specific sectional shape, embodiments are not limited thereto. For example, each of the plurality of source/drain regions 124 may have one of various sectional shapes, e.g., a polygonal shape (e.g., a tetragonal shape, a pentagonal shape, and a hexagonal shape), a circular shape, or an elliptical shape.

The plurality of source/drain regions 124 may be covered by an insulating liner 126. The insulating liner 126 may conformally cover the device isolation film 112, the plurality of insulating spacers 120, and the plurality of source/drain regions 124. The insulating liner 126 may include, e.g., a silicon nitride film.

The source/drain regions 124 may be insulated from the gate structures GS with the insulating spacers 120 therebetween. The source/drain regions 124 may include a semiconductor layer, which may be epitaxially grown from surfaces of the fin-type active regions FA that may form inner walls of the recesses R1. In some embodiments, the source/drain regions 124 may have top surfaces disposed at about the same vertical level as a vertical level LV3 of top surfaces FT of the fin-type active regions FA, but embodiments are not limited thereto. As used herein, the term "vertical level" refers to a length taken in a vertical direction (i.e., a ±Z direction) relative to the main surface 110M of the substrate 110.

An inter-gate dielectric film 128 may be between the plurality of gate structures GS and between the gate structures GS and the dummy gate structures DGS. The plurality of source/drain regions 124 may be covered by the inter-gate dielectric film 128. The insulating liner 126 may be between the plurality of source/drain regions 124 and the inter-gate dielectric film 128. The inter-gate dielectric film 128 may include a silicon oxide film.

An insulating thin film 150 may extend parallel to the main surface 110M of the substrate 110 on the substrate 110. The insulating thin film 150 may cover the plurality of gate structures GS, the plurality of dummy gate structures DGS, the plurality of gate insulating capping layers 140, the plurality of insulating spacers 120, and the inter-gate dielectric film 128. The insulating thin film 150 may include, e.g., a silicon oxide film, a silicon nitride film, a polysilicon film, or a combination thereof. An interlayer insulating film 170 may be formed on the insulating thin film 150. The interlayer insulating film 170 may include, e.g., a silicon oxide film, a silicon nitride film, or a combination thereof.

An isolation insulating pattern 160 may be formed on the inter-device isolation region DTA between the first device region RX1 and the second device region RX2 of the logic cell LC. Although the present embodiment illustrates an example in which the IC device 100 includes one isolation insulating pattern 160, embodiments are not limited thereto. For example, a plurality of isolation insulating patterns 160 may be formed in the logic cell LC. In addition, FIGS. 1 and 2A illustrate an example in which the isolation insulating pattern 160 of the IC device 100 extends across two gate structures GS in the widthwise direction (X direction) of the logic cell LC, but embodiments are not limited thereto. For example, the isolation insulating pattern 160 may be formed to extend across only one gate structure GS in the widthwise direction (X direction) in the logic cell LC.

The plurality of gate structures GS may include a pair of gate structures GS, which may be spaced apart from each other in the lengthwise direction (Y direction) of the logic cell LC with the isolation insulating pattern 160 therebetween, and extend in a straight line, e.g., collinear, in the Y direction. For example, the pair of gate structures GS may include a first gate structure GS11 in the first device region RX1 and a second gate structure GS12 in the second device region RX2, which may be spaced apart from each other in the Y direction with the isolation insulating pattern 160 therebetween, and extend in a straight line in the Y direction. Also, the pair of gate structures GS may include a first gate structure GS21 in the first device region RX1 and a second gate structure GS22 in the second device region RX2, which may be spaced apart from each other in the Y direction with the isolation insulating pattern 160 therebetween, and extend in a straight line in the Y direction.

Opposite sidewalls of the isolation insulating pattern 160, which face in opposite directions in the Y direction, from among sidewalls of the isolation insulating pattern 160, may face the first gate structures GS11 and GS21, the second gate structures GS12 and GS22, and the inter-gate dielectric film 128, and may be in contact with the first gate structures GS11 and GS21, the second gate structures GS12 and GS22, and the inter-gate dielectric film 128. The opposite sidewalls of the isolation insulating pattern 160, which face in the opposite directions in the Y direction, from among the sidewalls of the isolation insulating pattern 160, may include a first sidewall portions S1 in contact with the first gate structure GS11 and the second gate structure GS12 (FIG. 2D), and a second sidewall portions S2 in contact with the inter-gate dielectric film 128 (FIG. 2E). For example, referring to FIGS. 1 and 2D-2E, each of the first and second sidewall portions S1 and S2 may extend in the X and Z direction while facing, e.g., contacting, the gate structures GS and the inter-gate dielectric film 128, respectively, e.g., portions of the first and second sidewall portions S1 and S2 may be level with each other in the XZ plane to define a same side of the isolation insulating pattern 160.

In detail, the isolation insulating pattern 160 may include a first portion P1 (refer to FIG. 2D) and a second portion P2 (refer to FIG. 2E). The first portion P1 may have opposite sidewalls facing a pair of gate structures GS (e.g., the first gate structure GS11 and the second gate structure GS12), which may extend in a straight line. The second portion P2 may have opposite sidewalls facing the inter-gate dielectric film 128. For example, referring to FIGS. 1 and 2C, the first and second portions P1 and P2 may alternate in the X direction while being integral with each other to define a single, seamless insulating pattern.

Referring to FIGS. 2C-2E, in the isolation insulating pattern 160, a vertical level LVQ of a lowermost surface of the first portion P1 may be different from a vertical level LVR of a lowermost surface of the second portion P2. Thus, a vertical level of a lowermost surface of the isolation insulating pattern 160 may vary along the widthwise direction (X direction) of the logic cell LC, e.g., a bottom of the isolation insulating pattern 160 may have a non-uniform height along the X direction relative to a bottom of the substrate 100. For example, as shown in FIGS. 2C to 2E, the vertical level LVQ of the lowermost surface of the first portion P1 may be lower than the vertical level LVR of the lowermost surface of the second portion P2 e.g., a bottom of the isolation insulating pattern 160 may have an alternating height variation along the X direction relative to a bottom of the substrate 100 and with respect to positions of the gate structures GS. Accordingly, the lowermost surface of the first portion P1 may be closer to the substrate 110 than the lowermost surface of the second portion P2, e.g., a distance between the lowermost surface of the first portion P1 and the bottom of the substrate 110 may be smaller than a distance between the lowermost surface of the second portion P2 and the bottom of the substrate 110.

In other words, referring to FIG. 2C, the isolation insulating pattern 160 may include a plurality of protrusions 160P, which may protrude toward the substrate 110. The plurality of protrusions 160P may be arranged in line in the widthwise direction (X direction) of the logic cell LC. The plurality of protrusions 160P may be included in the first portion P1 of the isolation insulating pattern 160. Thus, the first portion P1 of the isolation insulating pattern 160 may have a greater vertical thickness (Z-direction length) than the second portion P2 thereof. That is, referring to FIG. 2C, the isolation insulating pattern 160 may include a first part that is uniform and continuous along an entirety of the isolation insulating pattern 160, e.g., having a prismatic shape, and the plurality of protrusions 160p may extend from prismatic shape toward the substrate 110 while being spaced apart from each other along the X direction. For example, referring to FIGS. 2C and 2E, the protrusions 160P may be arranged to have a center of the second portion P2 between source/drain regions 124 facing each other across the inter-device isolation region DTA along the Y direction, e.g., the protrusions 160P may have a non-overlapping relationship with the source/drain regions 124.

A bottom surface of each of the plurality of protrusions 160P may be the lowermost surface of the first portion P1. The vertical level LVQ of the lowermost surface of each of the plurality of protrusions 160P may be lower than a vertical level LV2 of the top surface of the device isolation film 112. That is, the vertical level LVQ of the lowermost surface of the first portion P1 of the isolation insulating pattern 160 may be lower than the vertical level LV2 of the top surface of the device isolation film 112. The device isolation film 112 may have a plurality of isolation recesses 112R, which may surround the plurality of protrusions 160P formed in the isolation insulating pattern 160.

Although FIGS. 2C and 2D illustrate an example in which the bottom surface of each of the plurality of protrusions 160P has a planar surface, embodiments are not limited thereto. For example, the bottom surface of each of the plurality of protrusions 160P may have a curved surface, which forms a portion of a circle or a portion of an ellipse, or may have a non-planar surface having a sharply protruding point toward the substrate 110. In yet another example, a lower portion of each of the plurality of protrusions 160P may have a, e.g., gradually, decreased width toward the bottom surface thereof, e.g., so a part of the first portion P1 may have a decreased width with a decreasing distance from the substrate 119.

The vertical level LVQ of the lowermost surface of the first portion P1 of the isolation insulating pattern 160 may be higher than the vertical level LV1 of the main surface 110M of the substrate 110, may be lower than the vertical level LV3 of the top surface FT of the fin-type active region FA, and may be lower than a vertical level of uppermost surfaces of the plurality of source/drain regions 124.

The vertical level LVR of the lowermost surface of the second portion P2 of the isolation insulating pattern 160 may be higher than the vertical level LV2 of the top surface of the device isolation film 112, may be higher than the vertical level LV3 of the top surfaces FT of the fin-type active regions FA, and may be higher than the vertical level of the uppermost surfaces of the plurality of source/drain regions 124. In some embodiments, the vertical level LVR of the lowermost surface of the second portion P2 of the isolation insulating pattern 160 may be substantially equal to or higher than a vertical level LV4 of uppermost surfaces of the gate structures GS, but embodiments are not limited thereto.

Each of the first portion P1 and the second portion P2 of the isolation insulating pattern 160 may have a planar top surface. An upper portion of the isolation insulating pattern 160 may pass through the insulating thin film 150. In the isolation insulating pattern 160, an uppermost surface of the first portion P1 and an uppermost surface of the second portion P2 may extend on substantially the same planar surface, e.g., top surface of the first portion P1 and the second portion P2 may be level with each other (FIG. 2C). A vertical level of the uppermost surface of each of the first portion P1 and the second portion P2 of the isolation insulating pattern 160 may be substantially equal to a vertical level LV5 of an uppermost surface of the insulating thin film 150.

In the lengthwise direction (Y direction) of the logic cell LC, a maximum width MW11 of the first portion P1 of the isolation insulating pattern 160 (FIG. 2D) may be substantially equal to a maximum width MW12 of the second portion P2 thereof (FIG. 2E). However, embodiments are not limited thereto, e.g., widths of the first and second portions P1 and P2 may be variously modified. For example, in the lengthwise direction (Y direction) of the logic cell LC, a width of at least a portion of the second portion P2 of the isolation insulating pattern 160 may be less than a width of the first portion P1.

In some embodiments, the isolation insulating pattern 160 may include a single insulating film or a compound insulating film including a combination of a plurality of insulating films. In some embodiments, the isolation insulating pattern 160 may include air gaps. The insulating film included in the isolation insulating pattern 160 may include, e.g., a silicon oxide film, a silicon nitride film, a SiOCN film, a SiCN film, or a combination thereof, but embodiments are not limited thereto.

Referring to FIG. 1, in the logic cell LC, a ground line VSS may be connected to the fin-type active region FA in the first device region RX1 through a contact plug connected to the source/drain region 124 in the first device region RX1. A power line VDD may be connected to the fin-type active region FA in the second device region RX2 through a contact plug connected to the source/drain region 124 in the second device region RX2. Each of the ground line VSS and the power line VDD may include a conductive barrier film and an interconnection conductive layer. The conductive barrier film may include, e.g., Ti, Ta, TiN, TaN, or a combination thereof. The interconnection conductive layer may include, e.g., Co, Cu, W, an alloy thereof, or a combination thereof.

The IC device 100 shown in FIGS. 1 and 2A to 2E may include the isolation insulating pattern 160 with a bottom having different vertical levels relatively to the bottom of the substrate 110, e.g., so portions of the bottom of the isolation insulating pattern 160 (second portion P2) may be higher than the vertical level of the uppermost surfaces of the plurality of source/drain regions 124. Accordingly, even if the density of interconnections and contact regions formed at a same level increases in the logic cell LC, of which an area is reduced with the downscaling of the IC device 100, a vertical spacing distance between the isolation insulating pattern 160 and conductive regions (e.g., the plurality of source/drain regions 124) may be ensured, e.g., due to the portions of the bottom of the isolation insulating pattern 160 (second portion P2) that are higher than the vertical level of the uppermost surfaces of the plurality of source/drain regions 124. Thus, the isolation insulating pattern 160 may be prevented from adversely affecting the structure of the conductive regions, e.g., the structure of the source/drain regions 124.

Figure 3A:
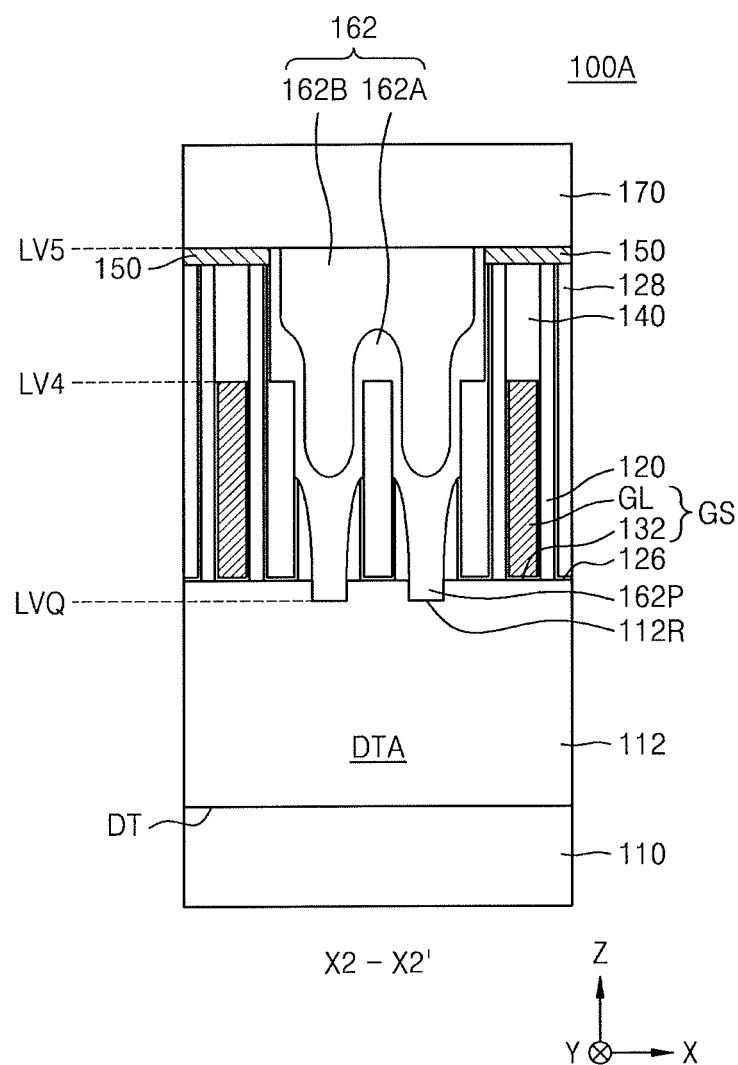
FIGS. 3A-3C illustrate cross-sectional views of an IC device according to embodiments.
Figure 3B:
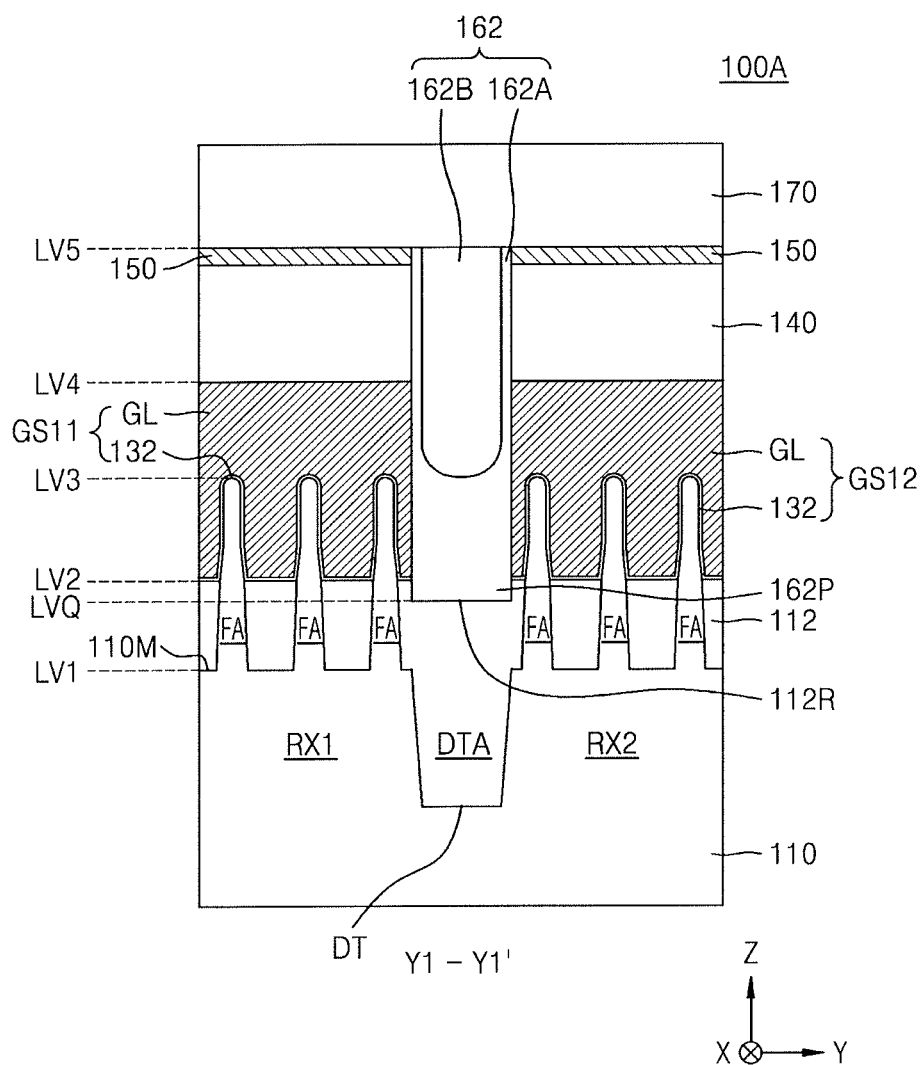
Figure 3C:
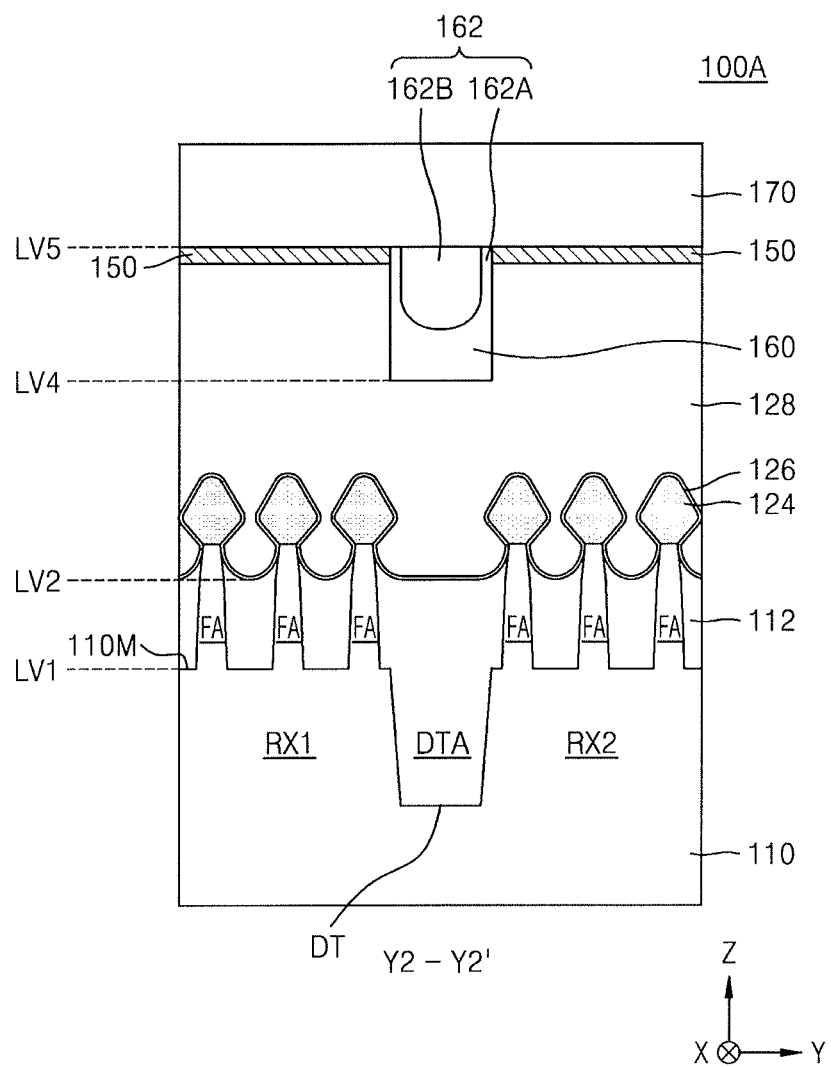

FIGS. 3A, 3B, and 3C are cross-sectional views of an IC device 100A according to some embodiments. FIG. 3A is a cross-sectional view of a portion corresponding to a cross-section taken along line X2-X2' of FIG. 1. FIG. 3B is a cross-sectional view of a portion corresponding to a cross-section taken along line Y1-Y1' of FIG. 1. FIG. 3C is a cross-sectional view of a portion corresponding to a cross-section taken along line Y2-Y2' of FIG. 1. In FIGS. 3A to 3C, the reference numerals are used to denote the same elements as with reference to FIGS. 1 and 2A to 2E, and detailed descriptions thereof will be omitted.

Referring to FIGS. 3A to 3C, the IC device 100A may have substantially the same configuration as the IC device 100 shown in FIGS. 1 and 2A to 2E. However, in the IC device 100A, an isolation insulating pattern 162 may have a multilayered structure including a lower insulating pattern 162A and an upper insulating pattern 162B including different materials. A thickness of the lower insulating pattern 162A may vary according to position, e.g., same material amount may be deposited to a higher thickness in a narrower width. For example, a thickness of a portion of the lower insulating pattern 162A that covers a bottom surface of the upper insulating pattern 162B, e.g., measured along the Z direction and fills a protrusion 162P, may be greater than a thickness of a portion of the lower insulating pattern 162A that covers a sidewall of the upper insulating pattern 162B, e.g., measured along the X direction from a sidewall of the upper insulating pattern 162B.

In some embodiments, the lower insulating pattern 162A may include substantially the same material as a material included in the inter-gate dielectric film 128, while the upper insulating pattern 162B may include a different material from the material included in the inter-gate dielectric film 128. For example, the inter-gate dielectric film 128 and the lower insulating pattern 162A may include a silicon oxide film, while the upper insulating pattern 162B may include a silicon nitride film. The plurality of source/drain regions 124 may be spaced apart from the upper insulating pattern 162B with the lower insulating pattern 162A therebetween. In this case, the silicon oxide film may be provided between the plurality of source/drain regions 124 and the upper insulating pattern 162B to ensure a relatively long spacing distance therebetween. When a contact plug connected to the plurality of source/drain regions 124 is formed at a position adjacent to the upper insulating pattern 162B in a subsequent process, a satisfactory process margin may be provided.

The isolation insulating pattern 162 may include the plurality of protrusions 162P. A specific configuration of the isolation insulating pattern 162 may be substantially the same as that of the isolation insulating pattern 160 described with reference to FIGS. 1 and 2A-2E.

FIGS. 4A to 16A, 4B to 16B, and 4C to 16C are cross-sectional views of stages in a method of manufacturing an IC device, according to embodiments. FIGS. 4A to 11A each show a sectional configuration of a portion corresponding to the cross-section taken along line X1-X1' of FIG. 1, FIGS. 4B to 11B and 12A to 16A each show a sectional configuration of a portion corresponding to the cross-section taken along line X2-X2' of FIG. 1, FIGS. 12B to 16B each show a sectional configuration of a portion corresponding to the cross-section taken along line Y1-Y1' of FIG. 1, and FIGS. 4C to 16C each show a sectional configuration of a portion corresponding to the cross-section along line Y2-Y2' of FIG. 1. A method of manufacturing the IC device 100 shown in FIGS. 1 and 2A to 2E will be described with reference to FIGS. 4A to 16C. In FIGS. 4A to 16C, same reference numerals are used to denote the same elements as with reference to FIGS. 1 and 2A to 2E, and detailed descriptions thereof will be omitted.

Figure 4A:
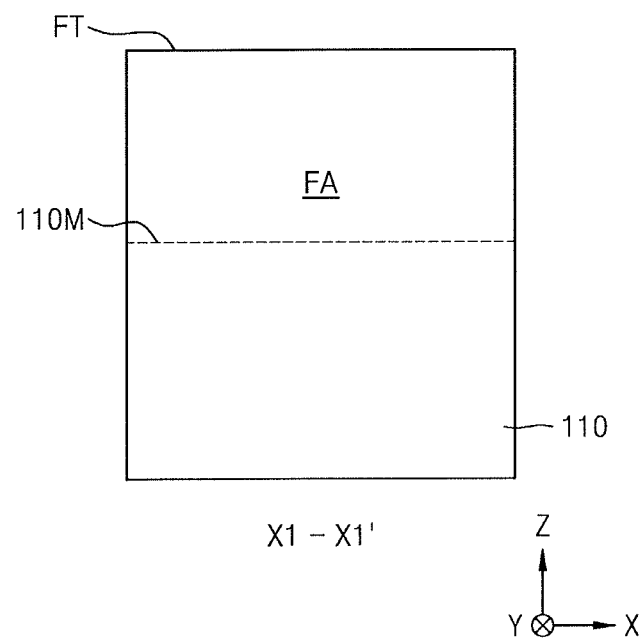
Figure 4B:
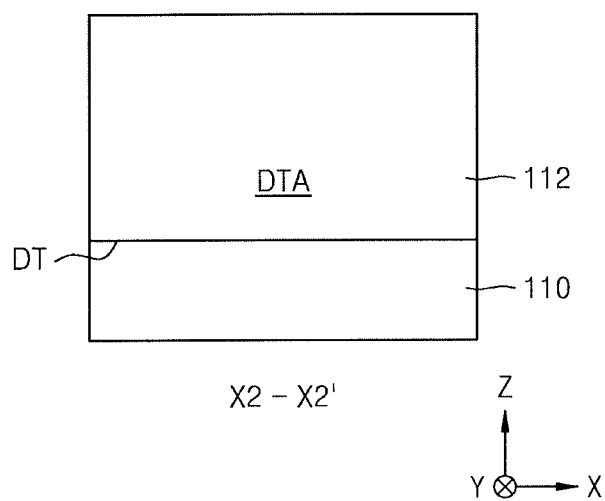
Figure 4C:
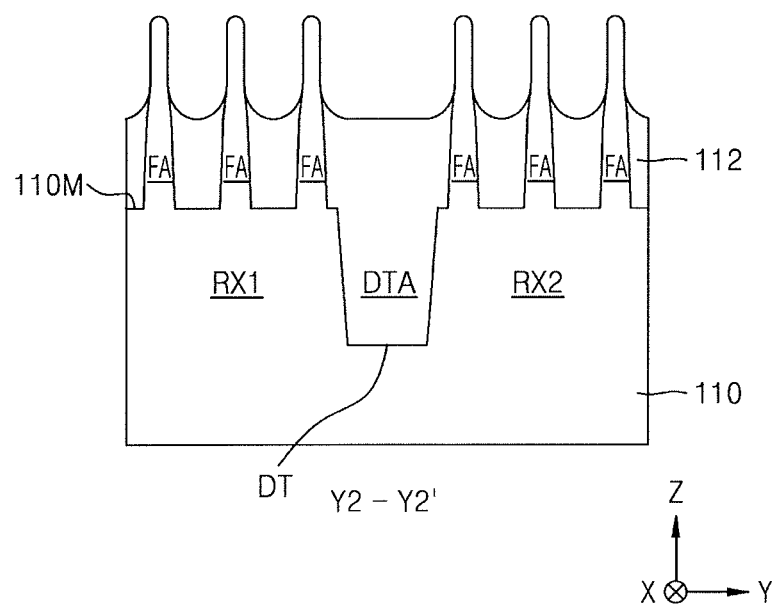

Referring to FIGS. 4A, 4B, and 4C, partial regions of the substrate 110 may be etched to form the plurality of fin-type active regions FA, which may protrude in an upward direction (Z direction) from the main surface 110M of the substrate 110 and extend in one direction (X direction). The deep trench DT may be formed in the substrate 110 to define the first device region RX1 and the second device region RX2. The device isolation film 112 may be formed to cover opposite lower sidewalls of each of the fin-type active regions FA and fill the deep trench DT. In the first device region RX1 and the second device region RX2, the plurality of fin-type active regions FA may protrude over the top surface of the device isolation film 112.

Figure 5A:
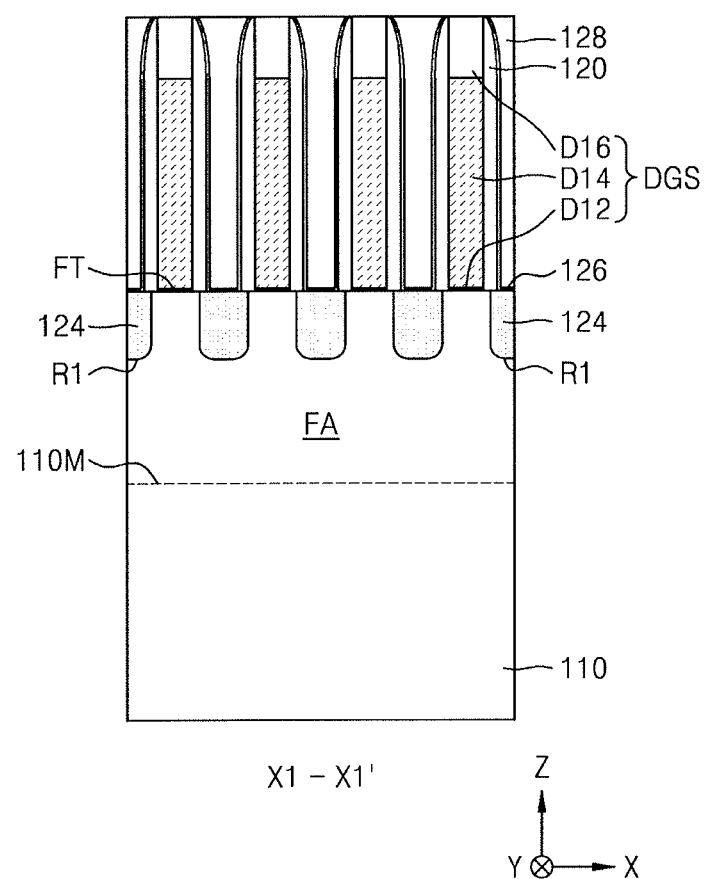
Figure 5B:
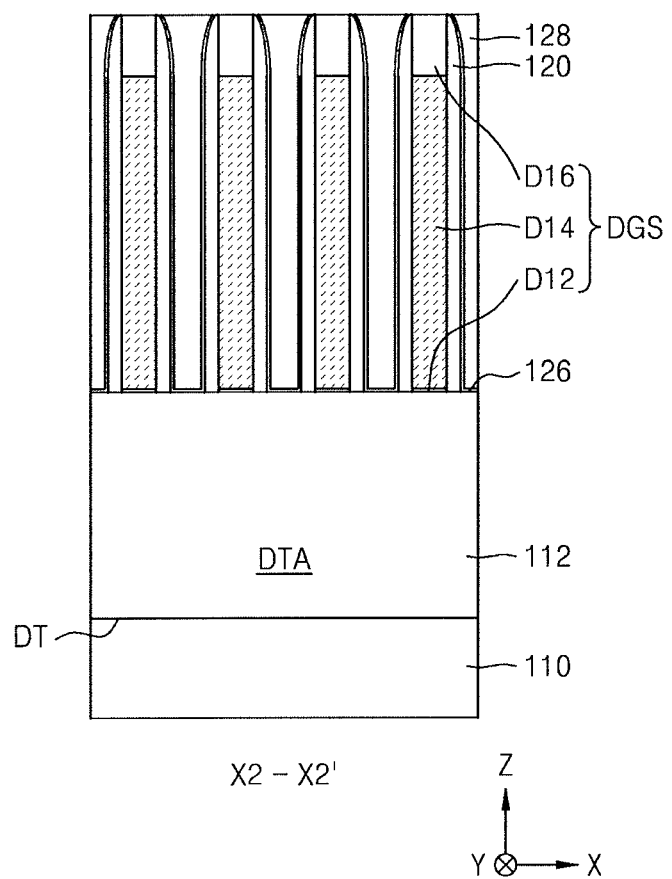
Figure 5C:
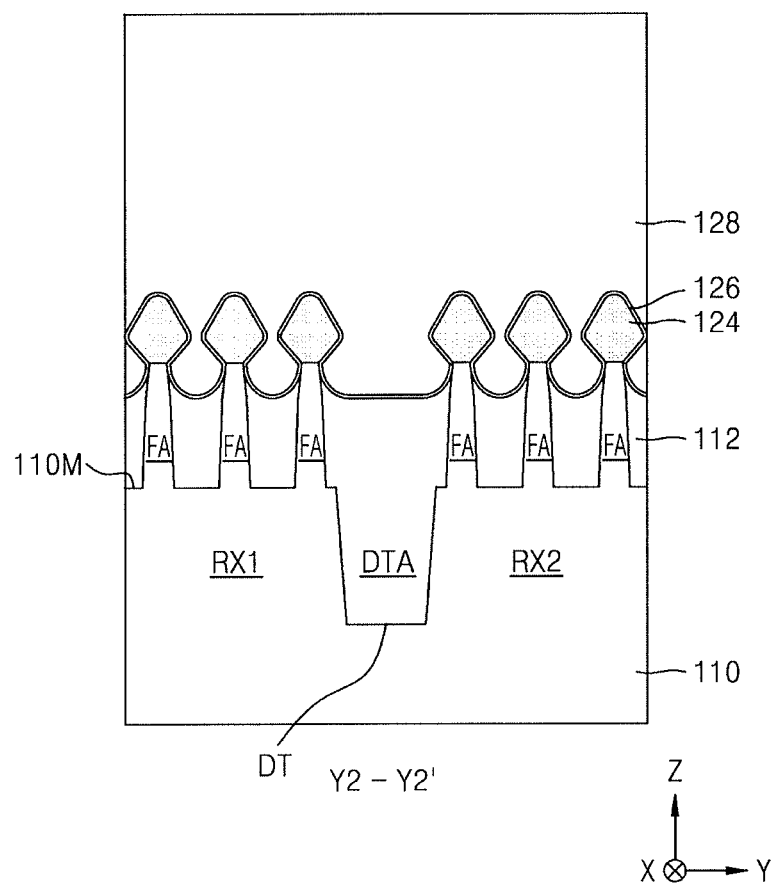

Referring to FIGS. 5A, 5B, and 5C, the plurality of dummy gate structures DGS may be formed on the plurality of fin-type active regions FA and extend to intersect the plurality of fin-type active regions FA. Each of the plurality of dummy gate structures DGS may include a dummy gate insulating film D12, a dummy gate line D14, and a dummy gate insulating capping layer D16, which may be sequentially stacked on the fin-type active region FA. The dummy gate insulating film D12 may include, e.g., silicon oxide. The dummy gate line D14 may include, e.g., polysilicon. The dummy gate insulating capping layer D16 may include, e.g., silicon nitride.

The insulating spacers 120 may be formed on opposite sidewalls of each of the dummy gate structures DGS. The insulating spacers 120 may be formed using an atomic layer deposition (ALD) process or a chemical vapor deposition (CVD) process.

The fin-type active regions FA may be partially etched on opposite sides of the dummy gate structures DGS to form the plurality of recesses R1. Semiconductor layers may be formed using an epitaxial growth process to form the plurality of source/drain regions 124 in the plurality of recesses R1. The insulating liner 126 may be formed to conformally cover the plurality of source/drain regions 124, the plurality of dummy gate structures DGS, and the insulating spacers 120.

The inter-gate dielectric film 128 may be then formed on the insulating liner 126. To form the inter-gate dielectric film 128, an insulating film, e.g., silicon oxide, may be formed on the insulating liner 126 to cover a structure including the plurality of dummy gate structures DGS and the plurality of source/drain regions 124 to a sufficient thickness, and the insulating film may be planarized to expose a top surface of the dummy gate insulating capping layer D16.

Figure 6A:
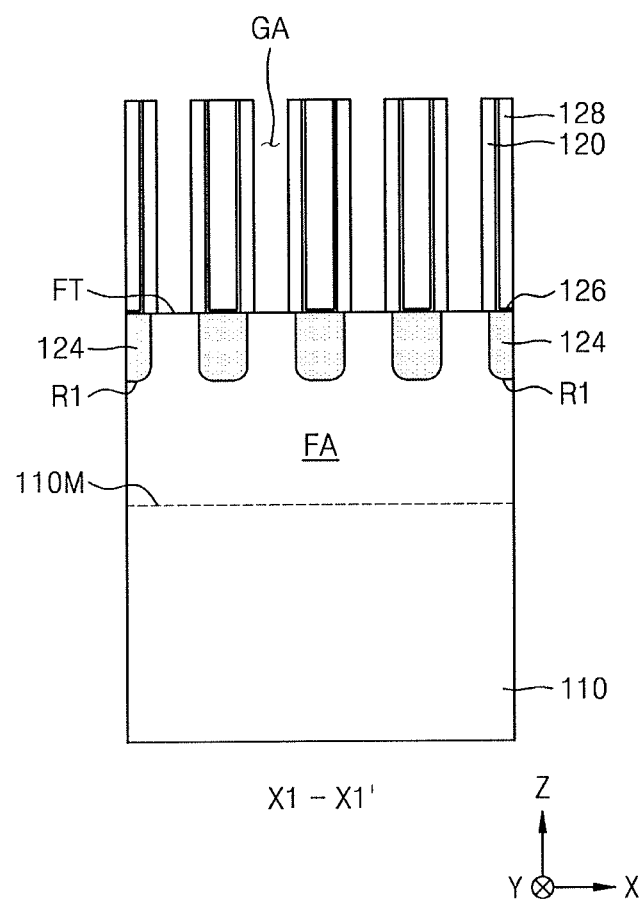
Figure 6B:
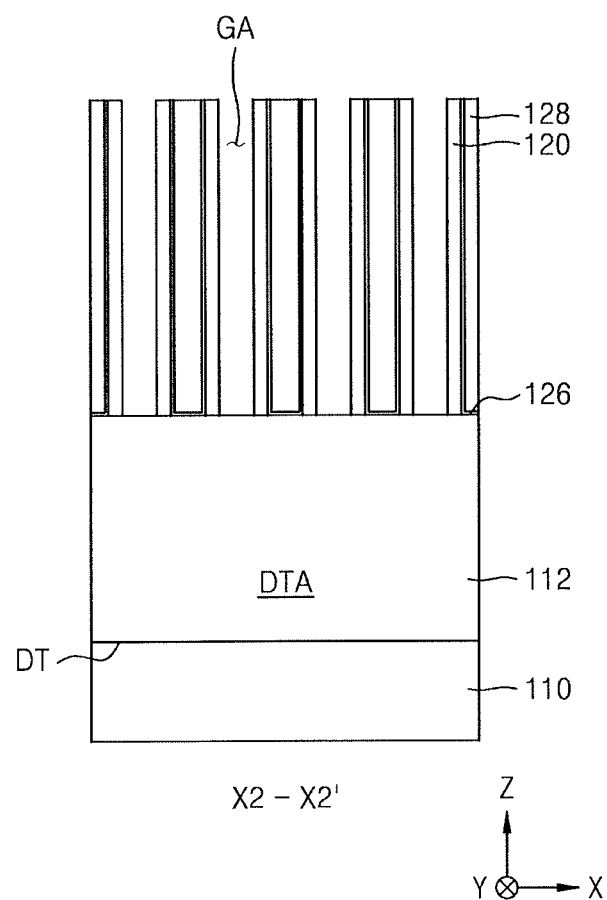
Figure 6C:
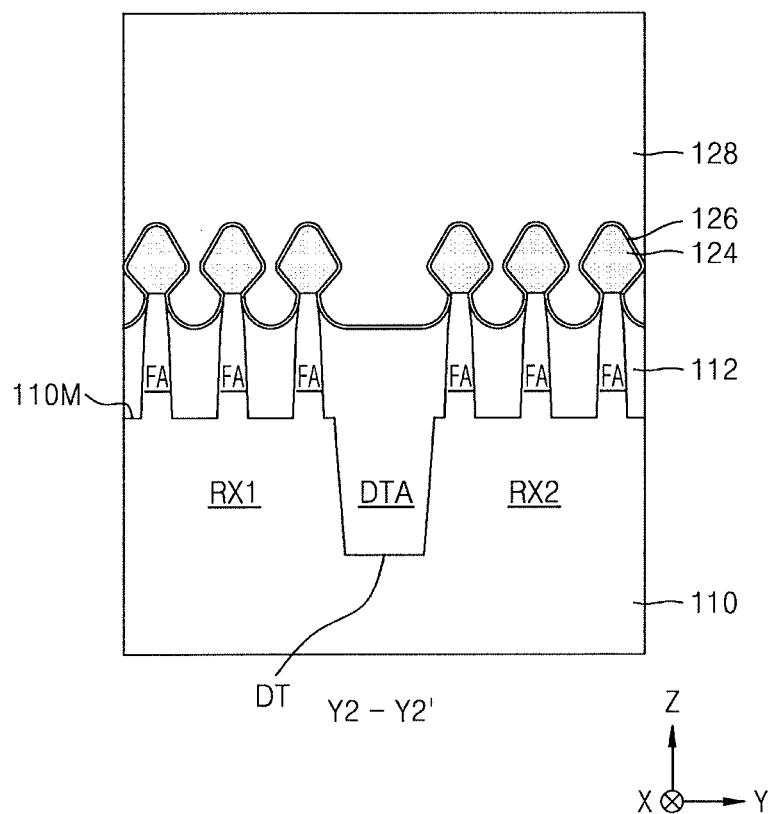

Referring to FIGS. 6A, 6B, and 6C, the plurality of dummy gate structures DGS may be removed from the resultant structure of FIGS. 5A, 5B, and 5C to provide a plurality of gate structure spaces GA. The insulating spacers 120, the fin-type active regions FA, and the device isolation film 112 may be exposed through the plurality of gate structure spaces GA.

Figure 7A:
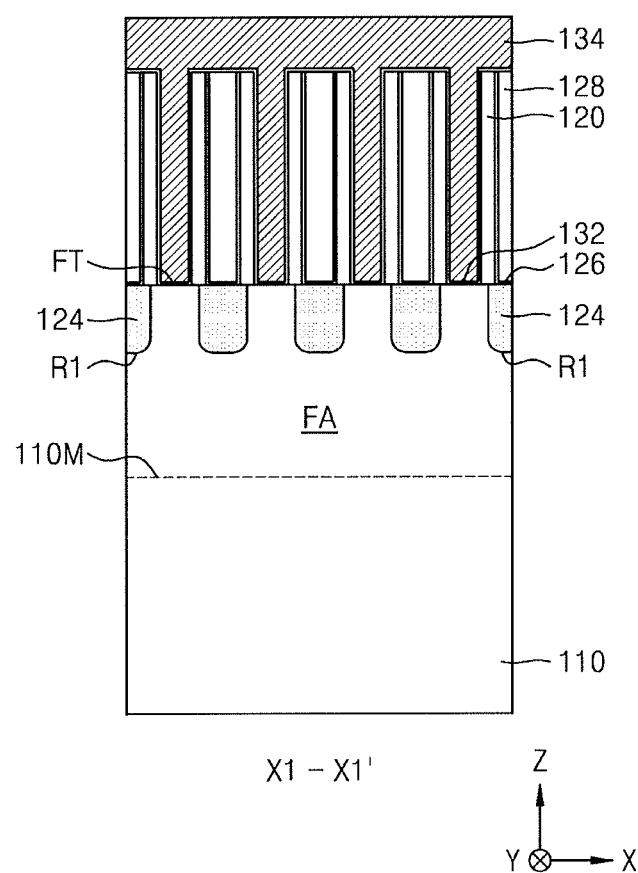
Figure 7B:
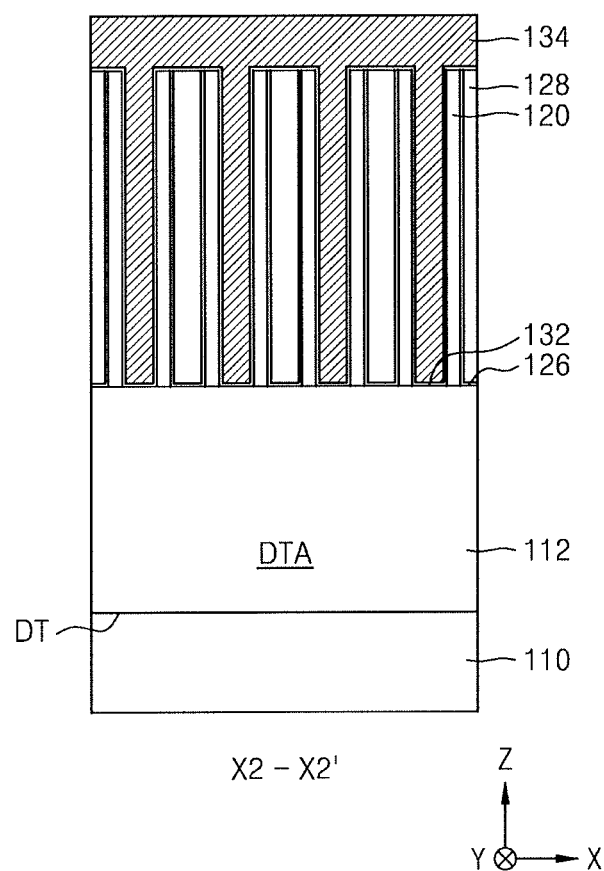
Figure 7C:
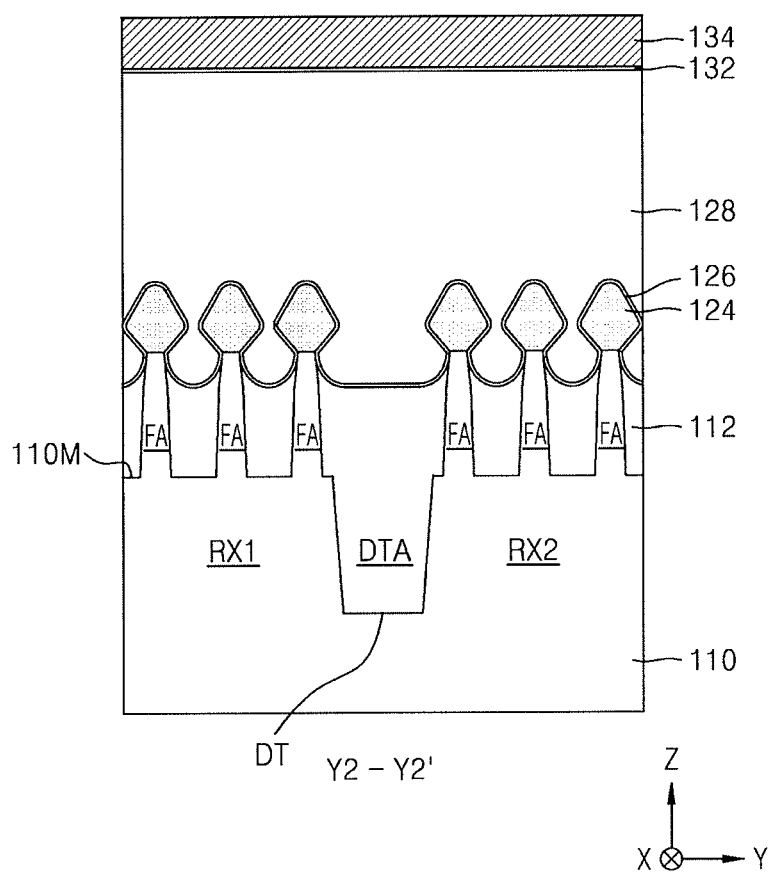

Referring to FIGS. 7A, 7B, and 7C, the gate dielectric film 132 and the gate conductive layer 134 may be formed in the plurality of gate structure spaces GA (refer to FIGS. 6A, 6B, and 6C). Before the gate dielectric film 132 is formed, an interface film may be further formed on surfaces of the fin-type active regions FA that are exposed through the plurality of gate structure spaces GA. The interface film may be obtained by oxidizing portions of the fin-type active regions FA exposed at the plurality of gate structure spaces GA.

The gate dielectric film 132 and the gate conductive layer 134 may be formed to fill the gate structure spaces GA and cover a top surface of the inter-gate dielectric film 128. Each of the gate dielectric film 132 and the gate conductive layer 134 may be formed using an atomic layer deposition (ALD) process, a chemical vapor deposition (CVD) process, a physical vapor deposition (PVD) process, a metal organic ALD (MOALD) process, or a metal organic CVD (MOCVD) process.

Figure 8A:
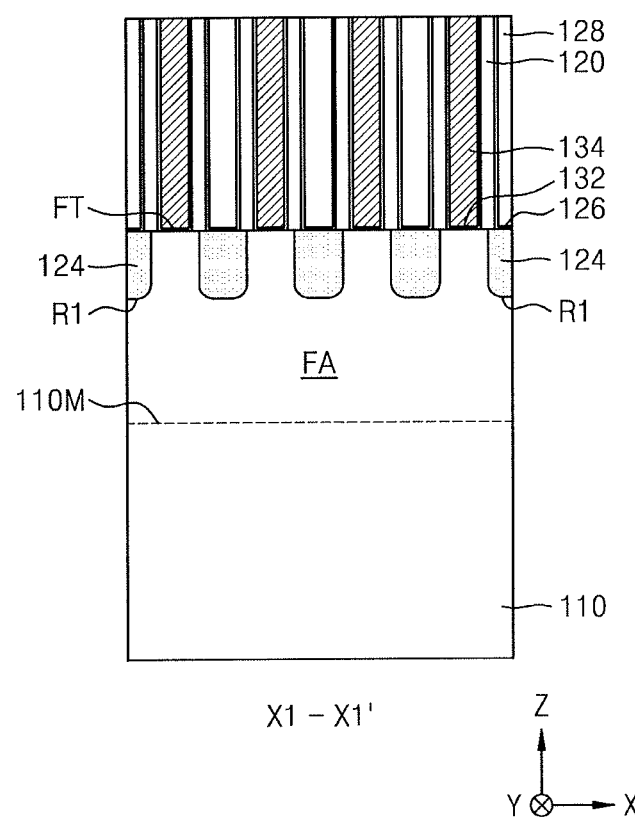
Figure 8B:
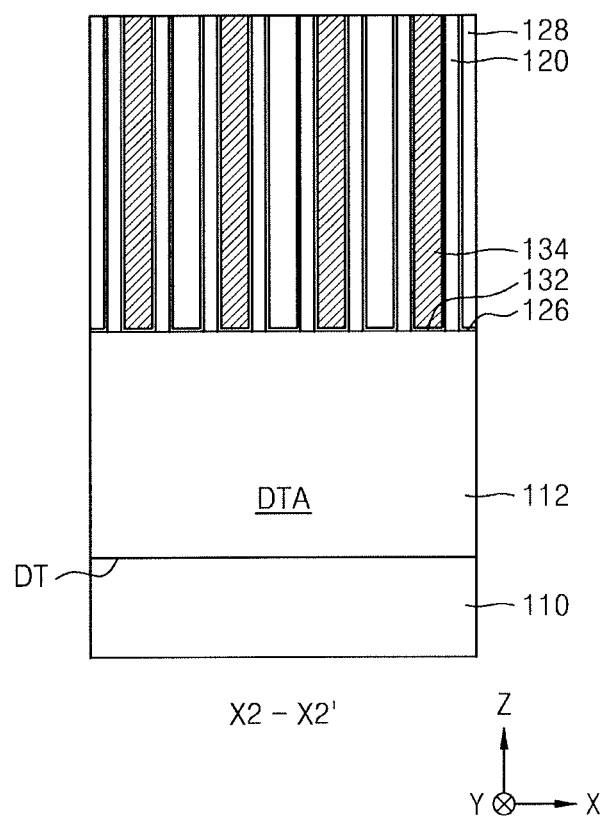
Figure 8C:
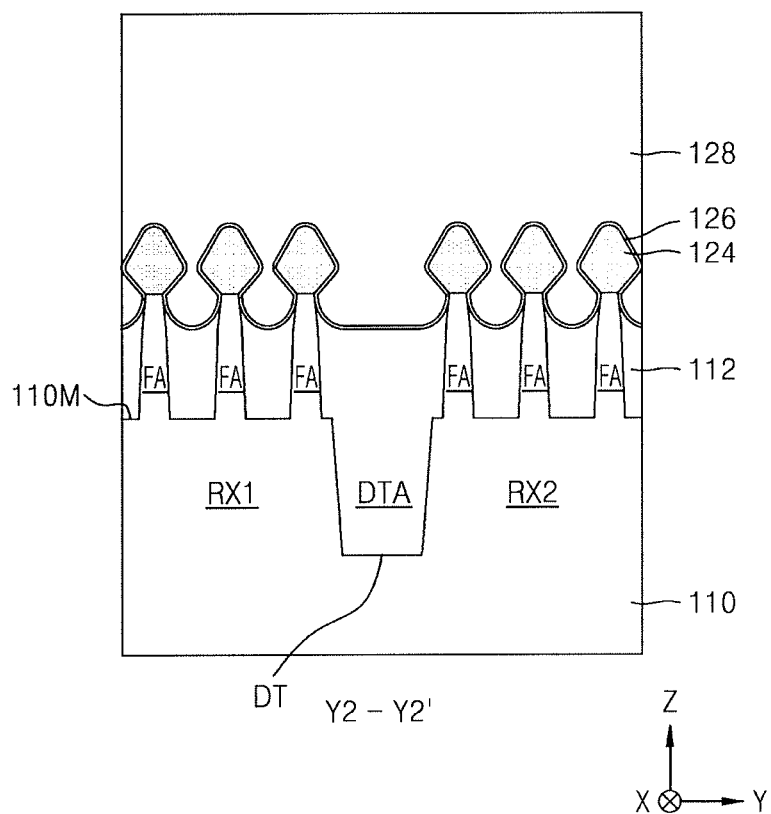

Referring to FIGS. 8A, 8B, and 8C, unnecessary portions of the gate dielectric film 132 and the gate conductive layer 134 (refer to FIGS. 7A, 7B, and 7C) may be removed, e.g., etching via chemical mechanical planarization (CMP), to expose the top surface of the inter-gate dielectric film 128.

Figure 9A:
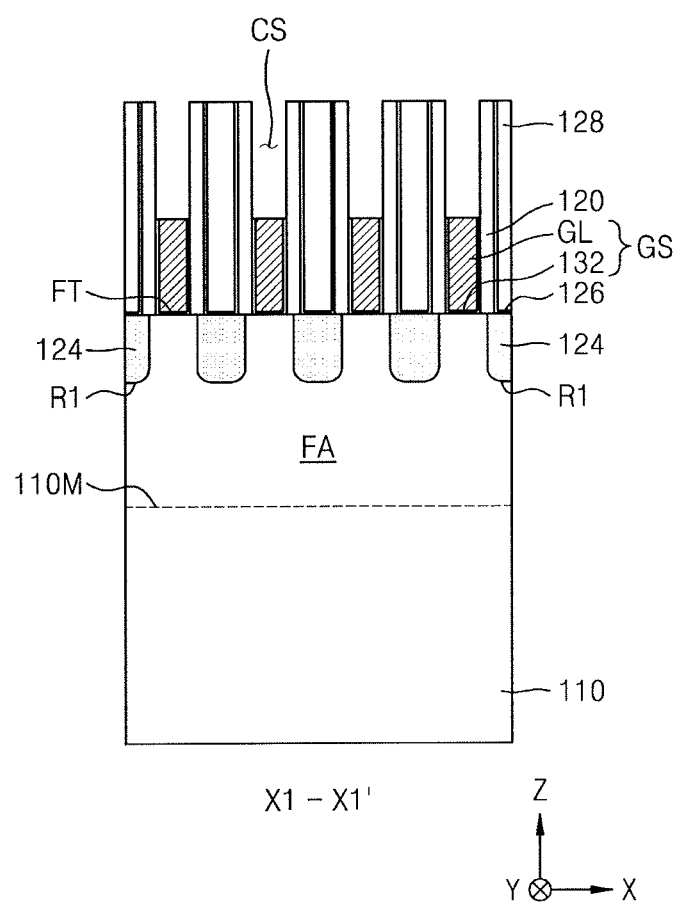
Figure 9B:
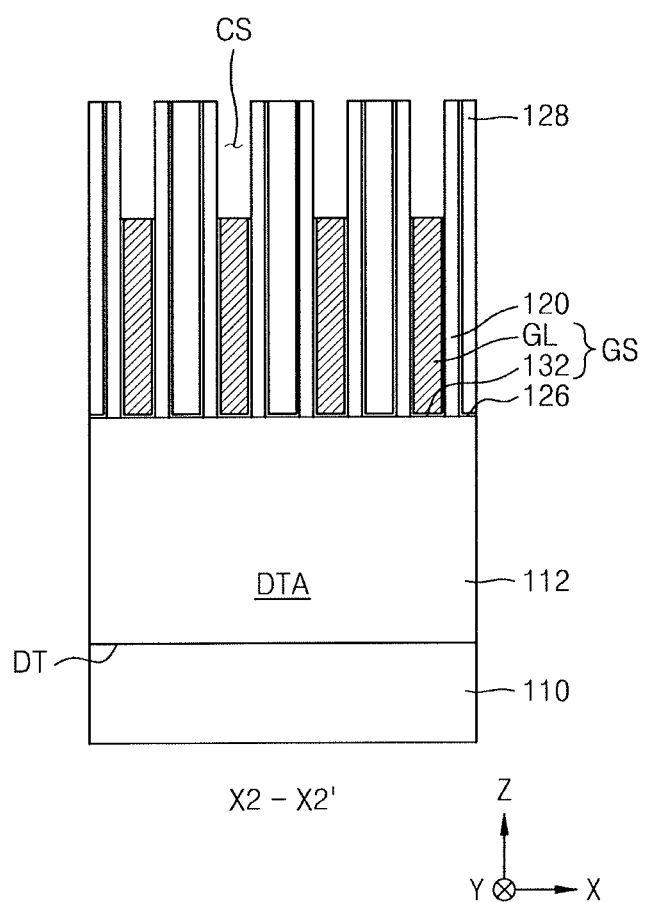
Figure 9C:
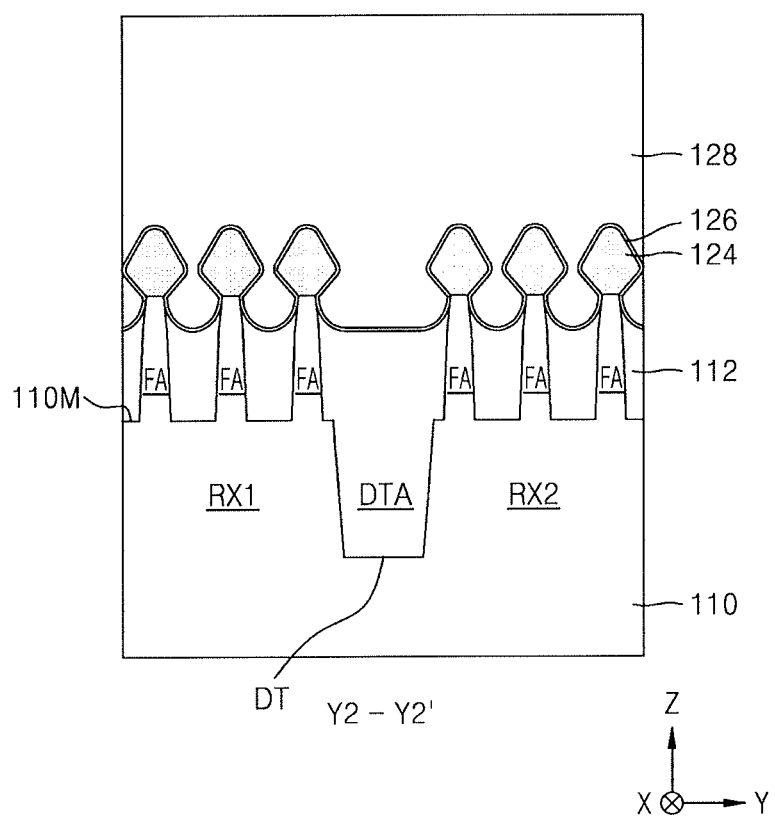

Referring to FIGS. 9A, 9B, and 9C, an upper portion of each of the gate dielectric film 132 and the gate conductive layer 134 may be further removed from the resultant structure of FIGS. 8A, 8B, and 8C, thereby providing a plurality of capping spaces CS. A portion of the gate conductive layer 134, which remains in the gate structure space GA (refer to FIGS. 6A, 6B, and 6C), may constitute the gate line GL.

Figure 10A:
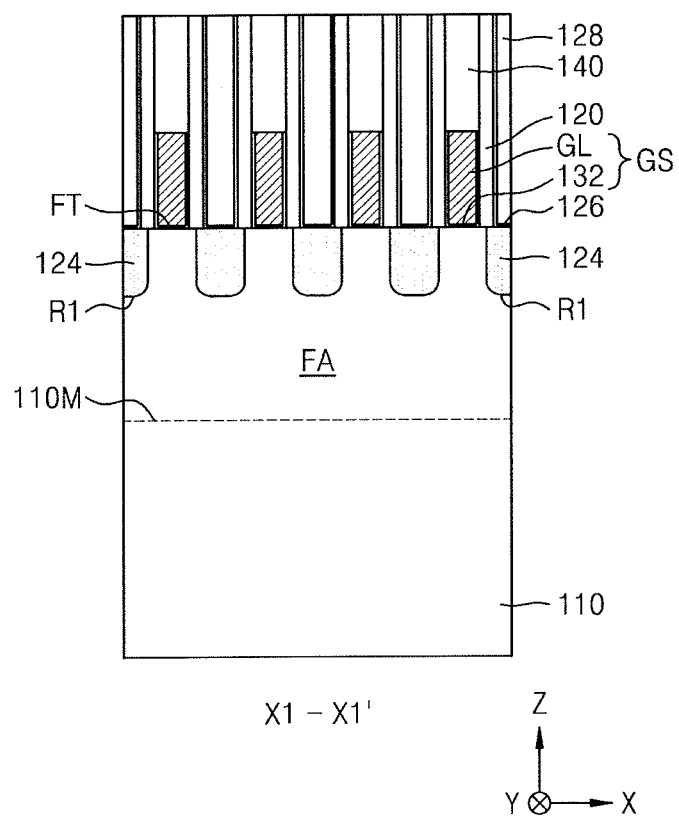
Figure 10B:
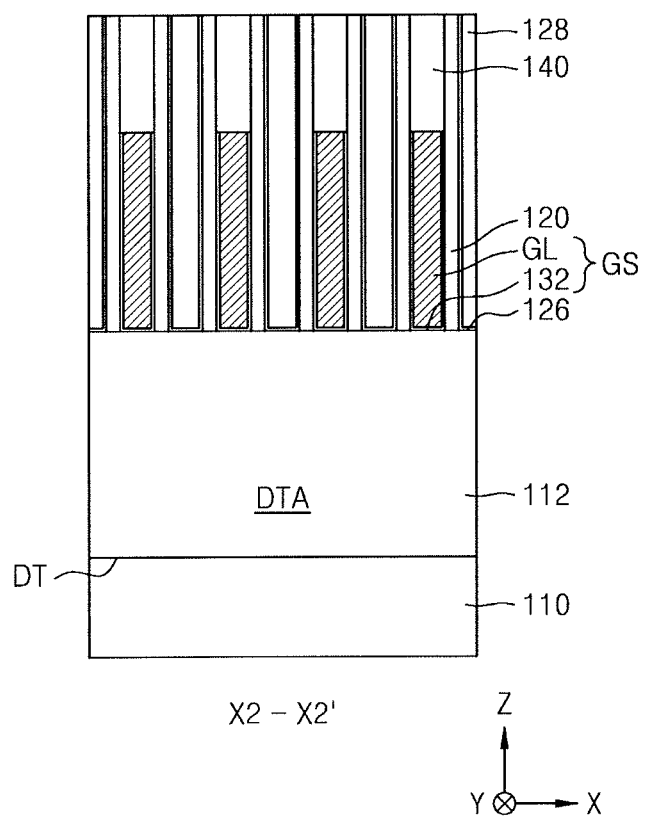
Figure 10C:
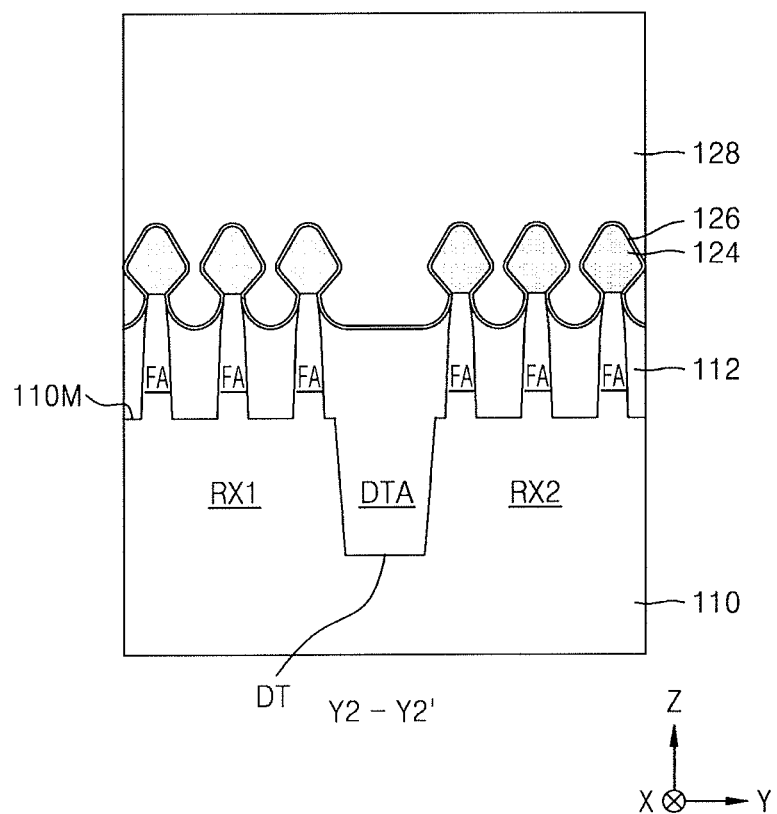

Referring to FIGS. 10A, 10B, and 10C, the plurality of gate insulating capping layers 140 may be formed on the resultant structure of FIGS. 9A, 9B, and 9C to fill the plurality of capping spaces CS. The formation of the gate insulating capping layer 140 may include forming a capping insulating film on the substrate 110 to a sufficient thickness as to fill the plurality of capping spaces CS and removing unnecessary portions of the capping insulating film, e.g., etching via CMP, to expose the top surface of the inter-gate dielectric film 128. The gate insulating capping layer 140 may include a silicon nitride film.

Figure 11A:
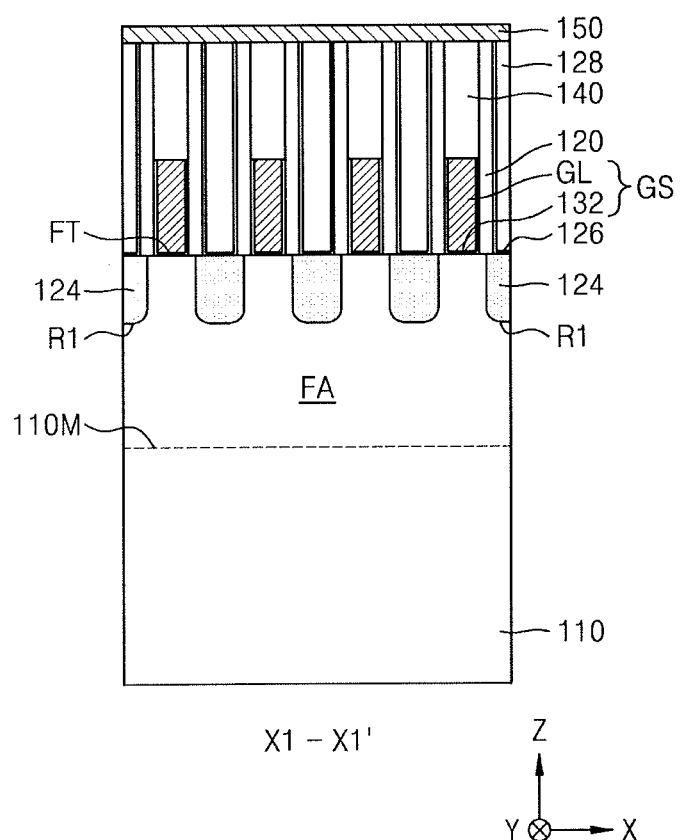
Figure 11B:
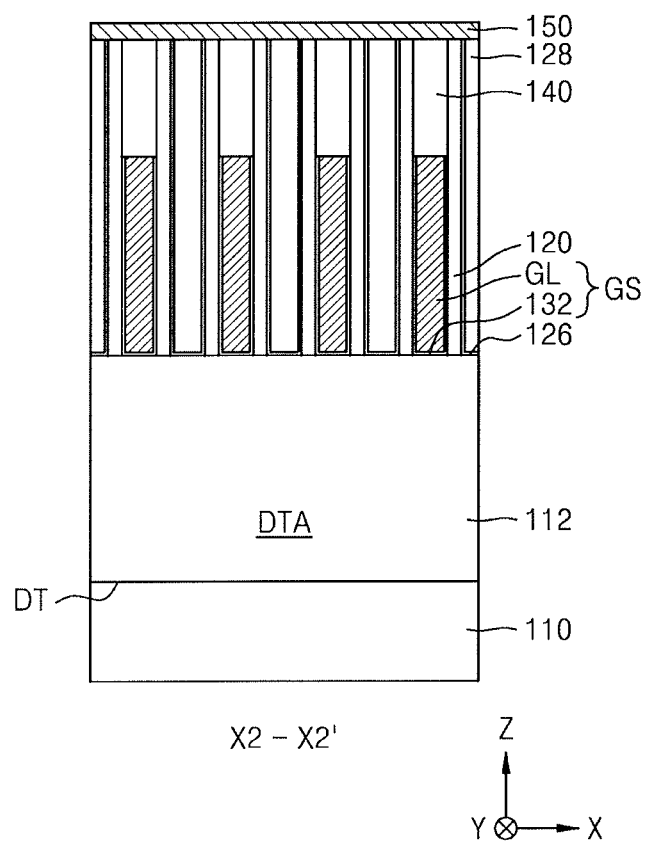
Figure 11C:
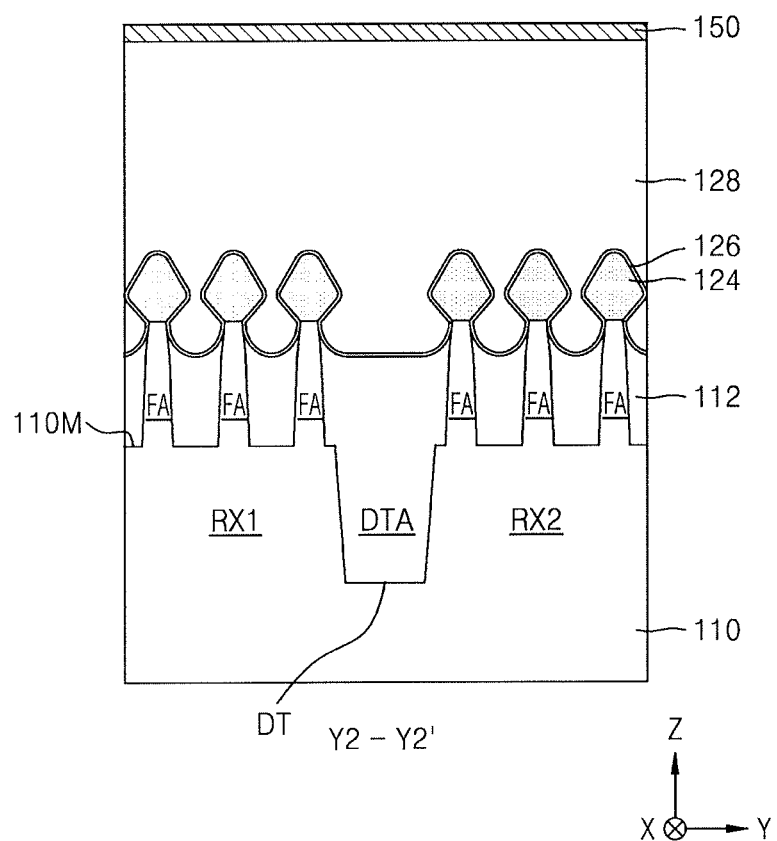

Referring to FIGS. 11A, 11B, and 11C, the insulating thin film 150 may be formed on the resultant structure of FIGS. 10A, 10B, and 10C. In some embodiments, the insulating thin film 150 may include a different material from a material included in the plurality of gate insulating capping layers 140. For example, when the plurality of gate insulating capping layers 140 includes a silicon nitride film, the insulating thin film 150 may include a silicon oxide film. However, embodiments are not limited thereto. For example, the insulating thin film 150 may include a silicon oxide film, a silicon nitride film, a polysilicon film, or a combination thereof.

Figure 12A:
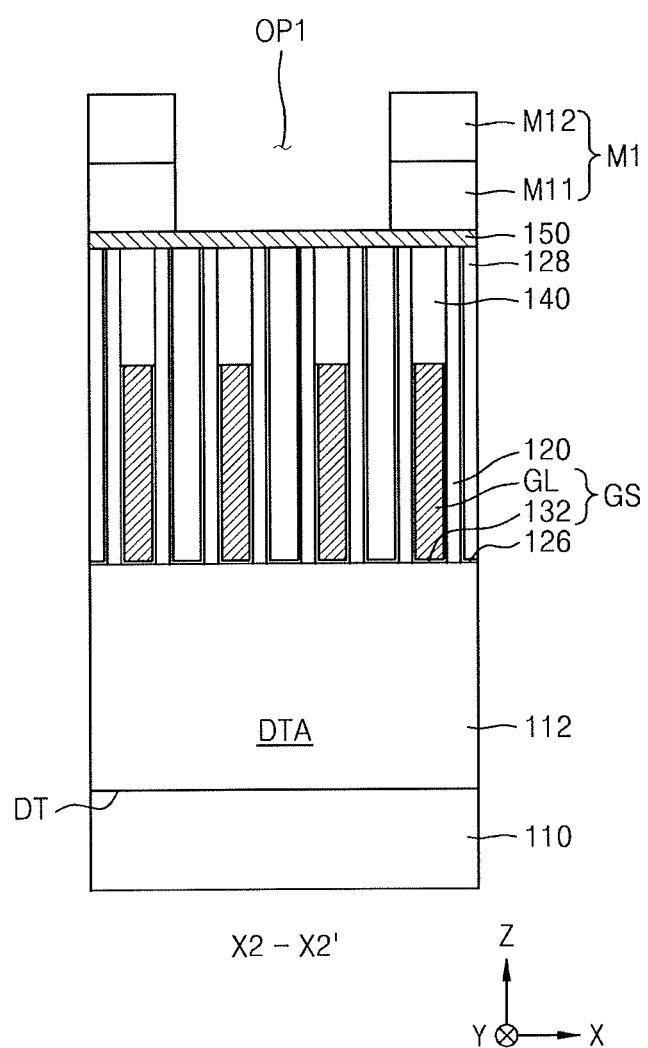
Figure 12B:
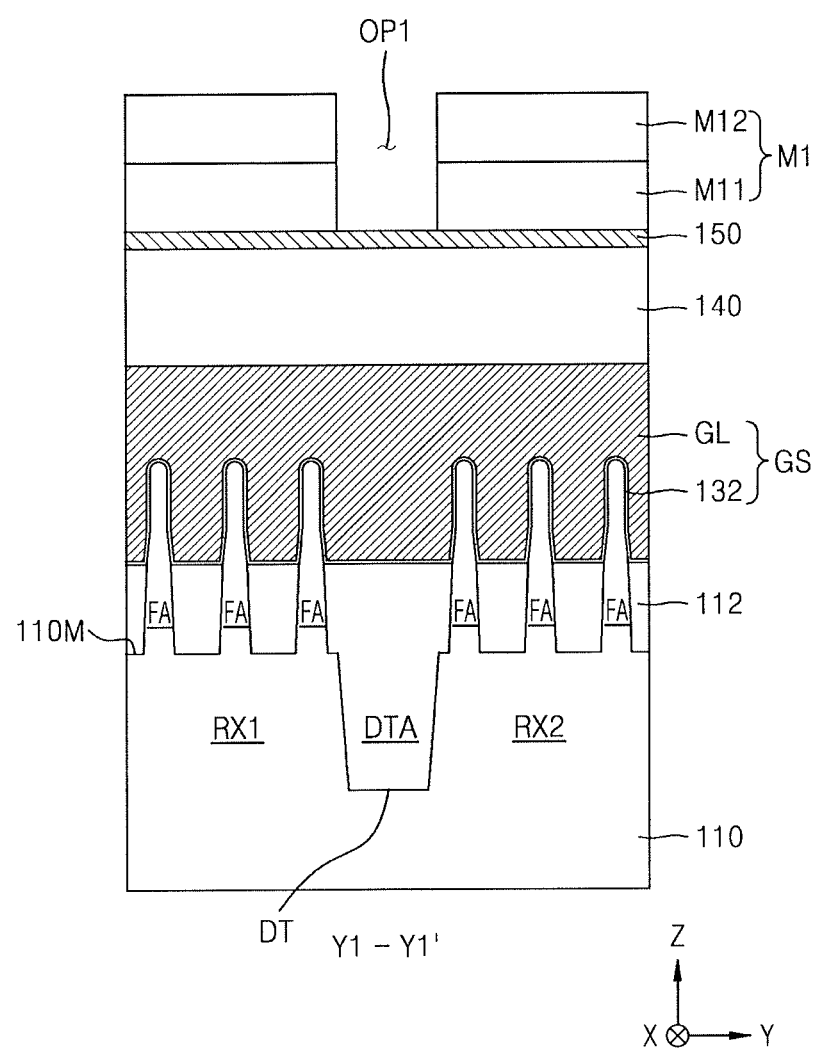
Figure 12C:
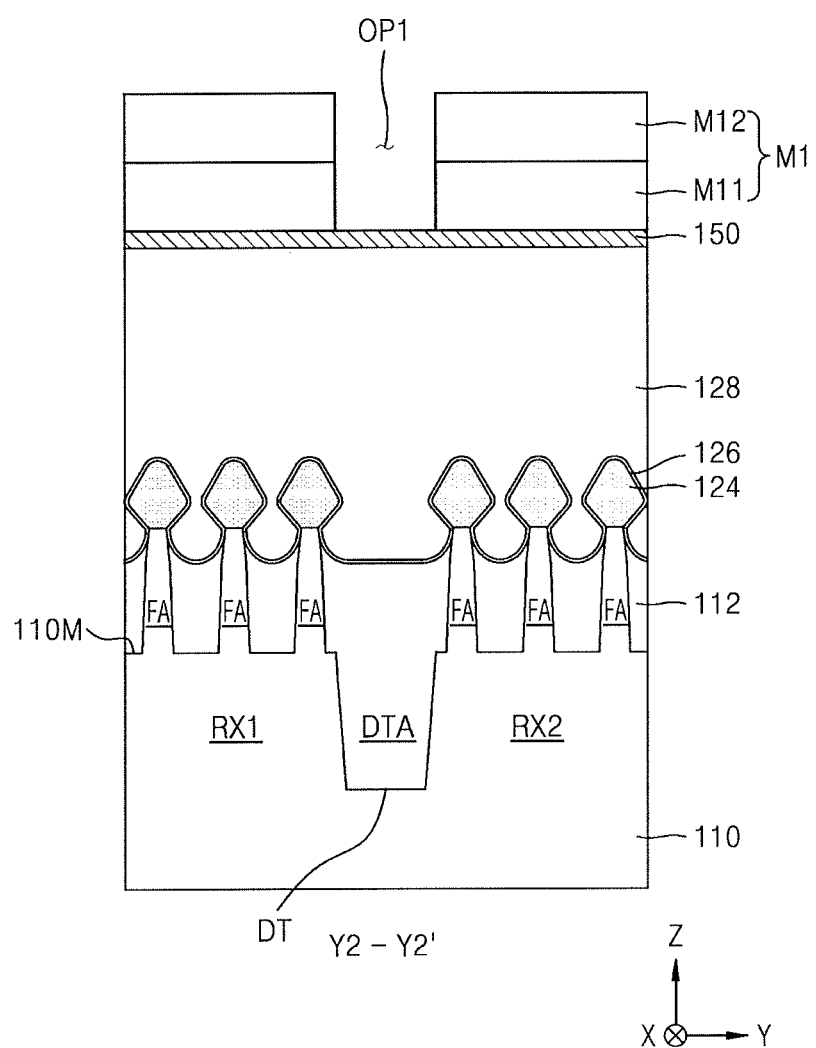

Referring to FIGS. 12A, 12B, and 12C, a mask pattern M1 may be formed on the insulating thin film 150.

The mask pattern M1 may have an opening OP1 exposing the insulating thin film 150. A planar shape of the opening OP1 may correspond to a planar shape of the isolation insulating pattern 160 shown in FIG. 1. The mask pattern M1 may have a multilayered structure including a plurality of hard mask layers that are stacked. In some embodiments, the mask pattern M1 may include, e.g., a silicon nitride film, a silicon oxide film, a polysilicon film, a carbon-containing film, or a combination thereof. The carbon-containing film may include, e.g., a spin-on hardmask (SOH) material. The SOH material may include, e.g., a hydrocarbon compound or derivatives thereof, which has relatively high carbon content of between about 80% to about 99% by weight, based on the total weight of the SOH material.

In some embodiments, the mask pattern M1 may have a stack structure of a first mask pattern M11 and a second mask pattern M12. For example, the first mask pattern M11 may include a silicon nitride film, and the second mask pattern M12 may include a silicon oxide film.

Figure 13A:
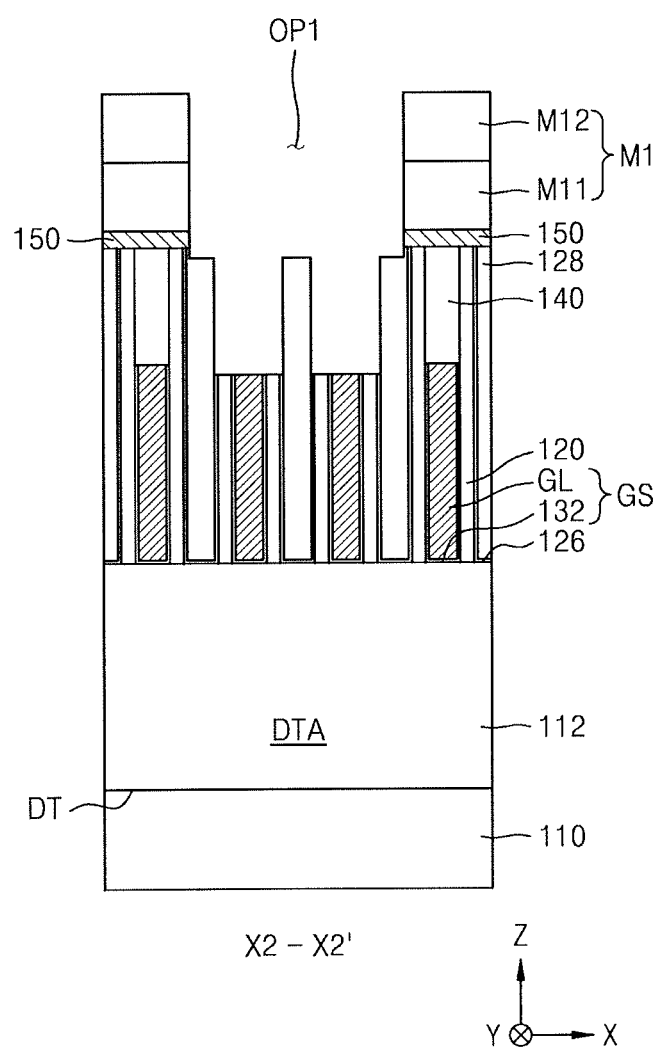
Figure 13B:
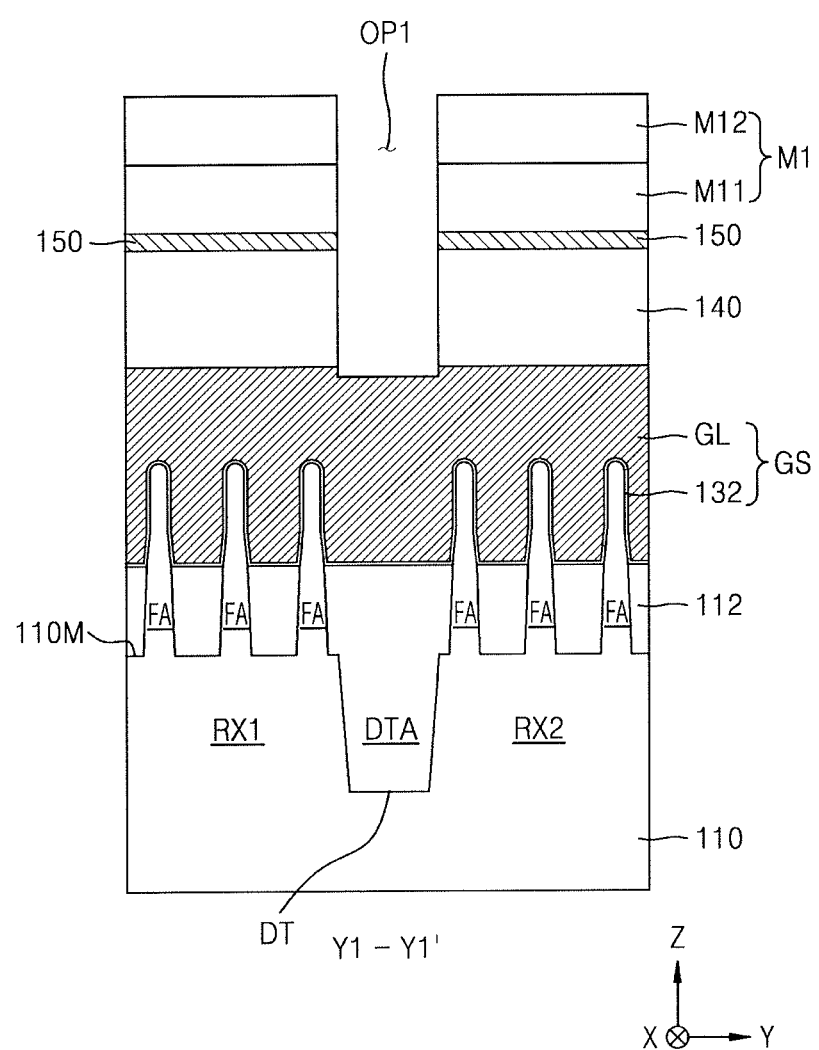
Figure 13C:
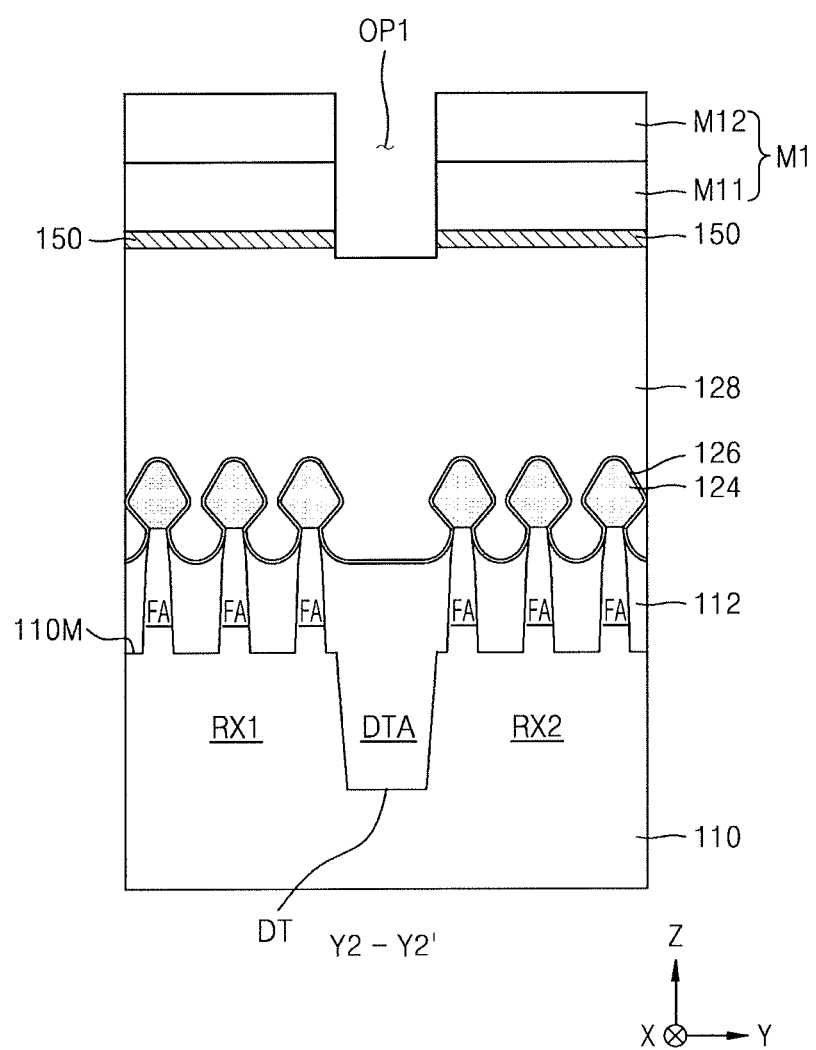

Referring to FIGS. 13A, 13B, and 13C, the insulating thin film 150 exposed through the opening OP1 may be etched using the mask pattern M1 as an etch mask, e.g., using $CCl_4$ gas. Thereafter, the gate insulating capping layer 140, which is exposed by etching the insulating thin film 150, may be etched to expose a gate structure GS through the opening OP1.

When the gate insulating capping layer 140 includes a silicon nitride film and the inter-gate dielectric film 128 includes a silicon oxide film, the silicon nitride film may be selectively etched using an etch selectivity between the silicon nitride film and the silicon oxide film, so that the consumed amount of the inter-gate dielectric film 128 may be minimized during the process of etching the gate insulating capping layer 140 through the opening OP1. That is, the content of the etch gas, e.g., $CCl_4$ gas, may be adjusted and controlled so that the silicon nitride of the gate insulating capping layer 140 is etched faster than the silicon oxide of the inter-gate dielectric film 128, i.e., so the amount of the gate insulating capping layer 140 removed may be larger than that of the inter-gate dielectric film 128. As such, the resultant opening OP1 through the gate insulating capping layer 140 (FIG. 13B) may be deeper than that through the inter-gate dielectric film 128 (FIG. 13C), e.g., the depth of the opening OP1 through the gate insulating capping layer 140 may be adjusted to achieve a desired depth based on time. In this case, portions of the insulating spacers 120, which cover sidewalls of the gate insulating capping layer 140, may be also removed during the removal of the gate insulating capping layer 140.

Further, a small portion of the inter-gate dielectric film 128 exposed together with the gate insulating capping layer 140 may be consumed through the opening OP1 (FIG. 13C). Also, an upper portion of the gate structure GS may be consumed due to an over etching process. To selectively etch the gate insulating capping layer 140, the second mask pattern M12 including the silicon oxide film may be used as an etch mask.

Figure 14A:
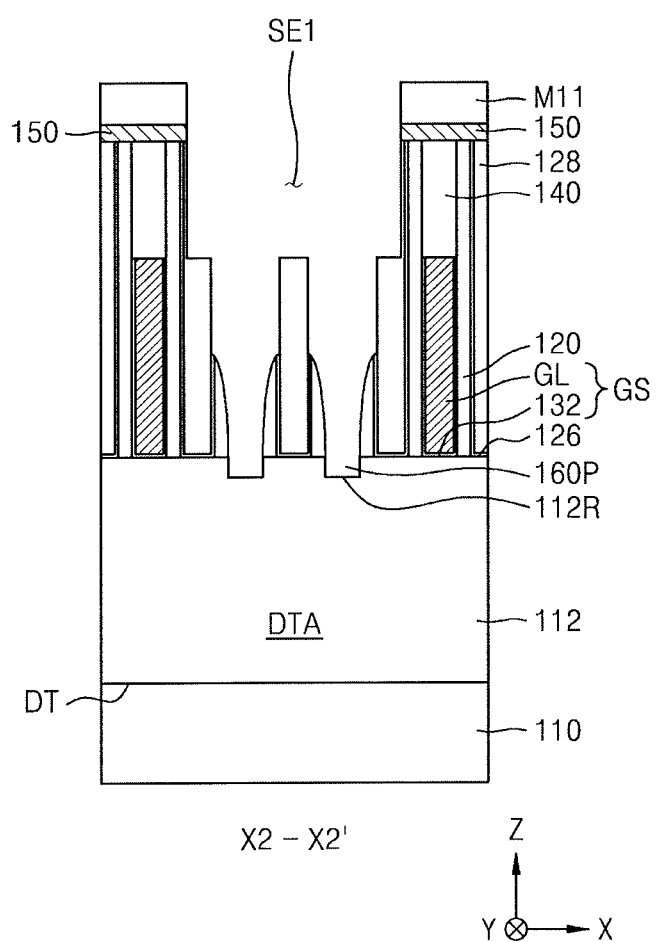
Figure 14B:
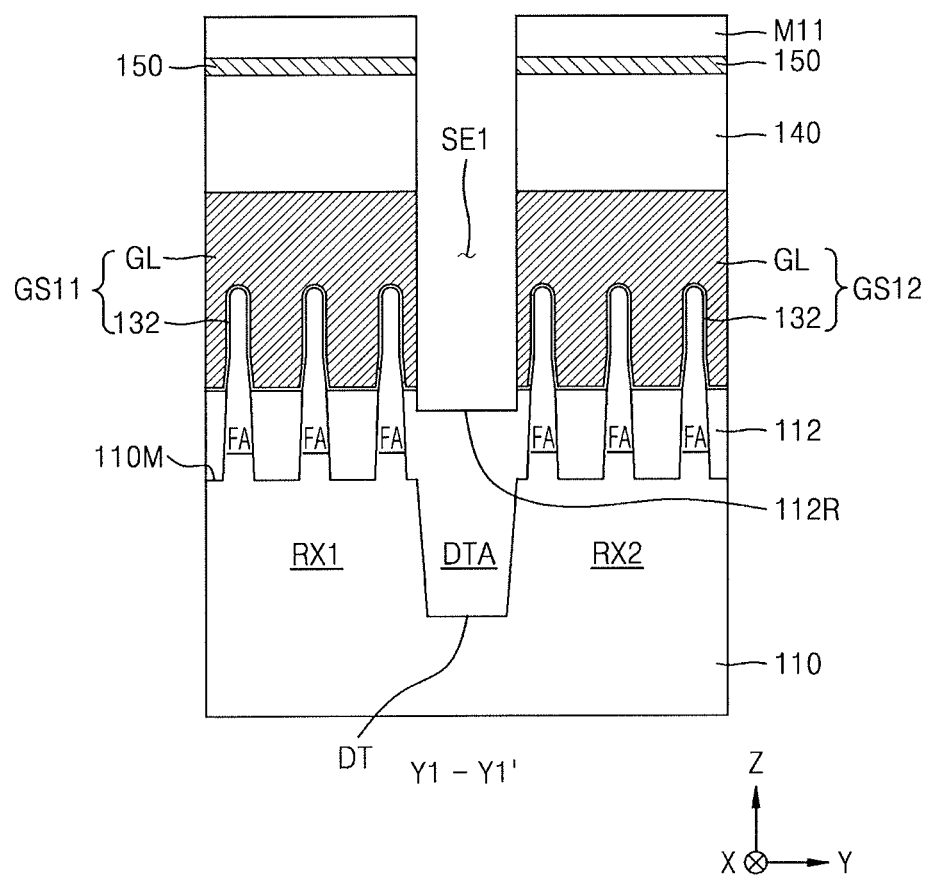
Figure 14C:
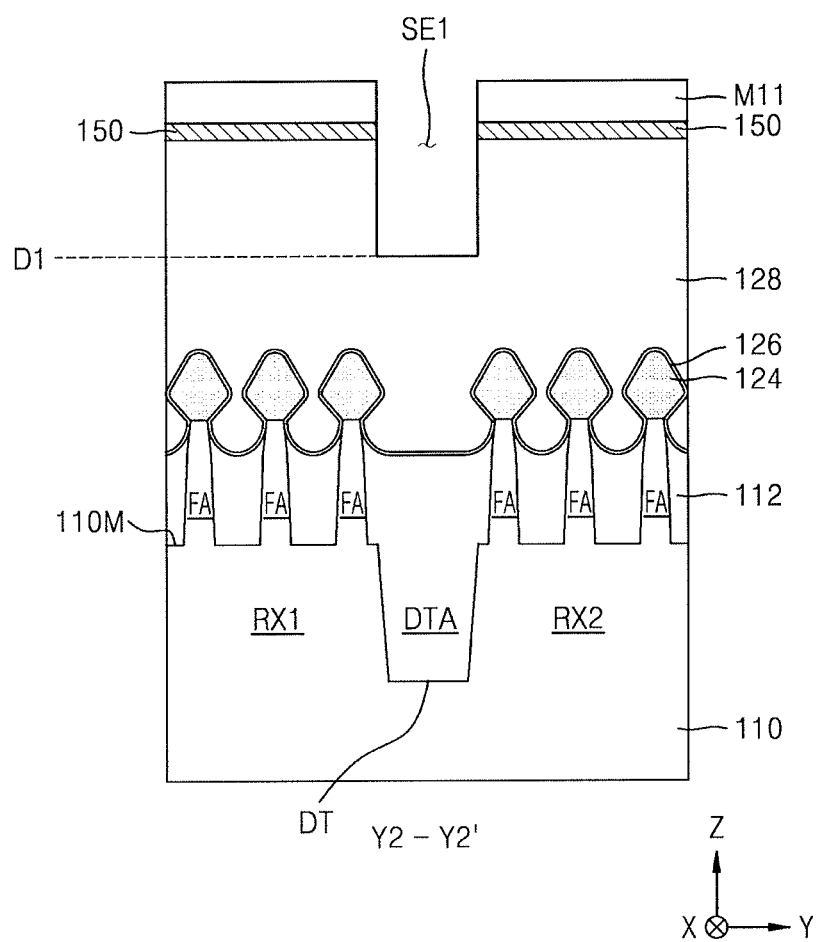

Referring to FIGS. 14A, 14B, and 14C, the second mask pattern M12 may be removed, and the gate structure GS exposed through the opening OP1 may be etched using the first mask pattern M11 as an etch mask and removed from the resultant structure of FIGS. 13A, 13B, and 13C. In this case, the insulating spacers 120 and the insulating liner 126 located around the gate structure GS may also be partially consumed due to an etching atmosphere of the gate structure GS so that heights of the insulating spacers 120 and the insulating liner 126 may be reduced. During the etching of the gate structure GS, a portion of the device isolation film 112 may also be etched due to an over etching process so that a plurality of isolation recesses 112R may be formed in the device isolation film 112.

In detail, the etching of the gate structure GS may be performed using an etch selectivity between a metal film and/or a metal-containing film included in the gate line GL and the silicon oxide film included in the inter-gate dielectric film 128. For example, a $BCl_3$-containing etch gas may be used, and the $BCl_3$ content of the $BCl_3$-containing etch gas may be controlled so that the etching of the silicon oxide film (in the inter-gate dielectric film 128) may be suppressed and an etch rate of the metal film and/or the metal-containing film (in the gate structure GS) may be relatively high. The $BCl_3$-containing etch gas may include $BCl_3$ or a combination of $BCl_3$ and $SiCl_4$. While the gate line GL exposed through the opening OP1 is removed by etching, the gate dielectric film 132 having a relatively small thickness may also be removed. As a result, the device isolation film 112 may be exposed through the opening OP1.

The etch rate of the inter-gate dielectric film 128 may be relatively low in the atmosphere of a $BCl_3$-containing etch gas for etching the gate structure GS. As such, the resultant opening through the gate line GL (FIG. 14B) may be substantially deeper than that through the inter-gate dielectric film 128 (FIG. 14C) e.g., the depth of the resultant opening through the gate line GL may be adjusted to achieve a desired depth based on time. Accordingly, an etch depth level D1 of the inter-gate dielectric film 128 (FIG. 14C) may be at a vertical level higher than a vertical level of uppermost surfaces of the plurality of source/drain regions 124. For example, a lower part of the resultant opening may have a, e.g., gradually, decreasing width toward the bottom surface thereof, e.g., narrows down to a tip, due to the slower etching of the inter-gate dielectric film 128.

After the gate structure GS is etched, a separation space SE1 including a plurality of isolation recesses 112R may remain on the substrate 110. Also, during the etching of the gate structure GS, the second mask pattern M12 covering the first mask pattern M11 may be consumed and removed, while the first mask pattern M11 may be partially consumed and have a reduced thickness.

Figure 15A:
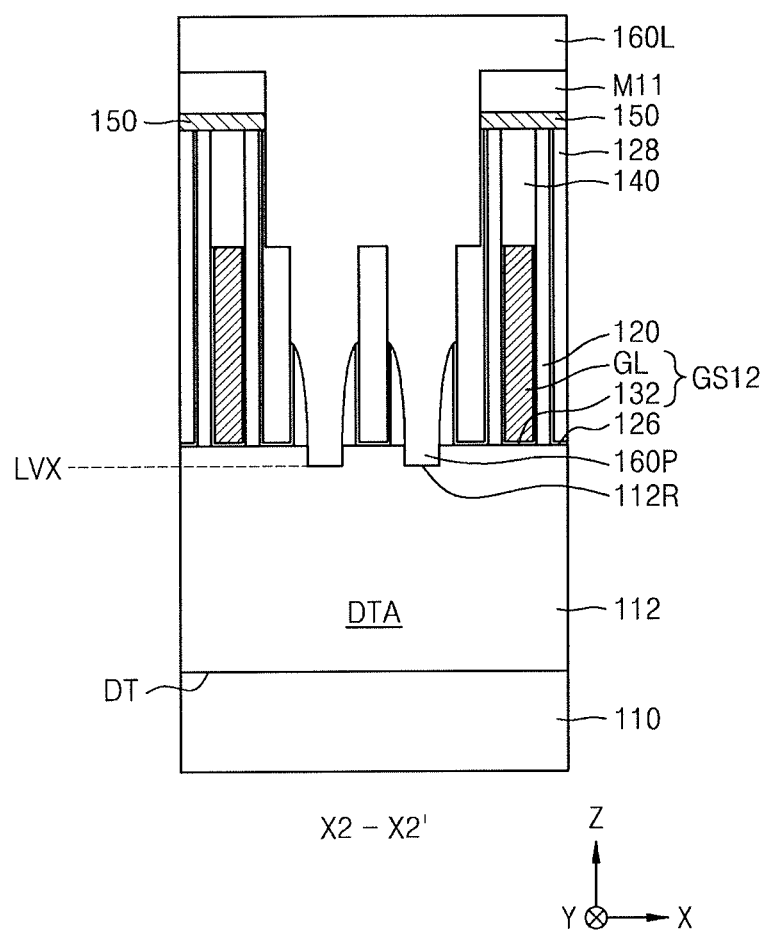
Figure 15B:
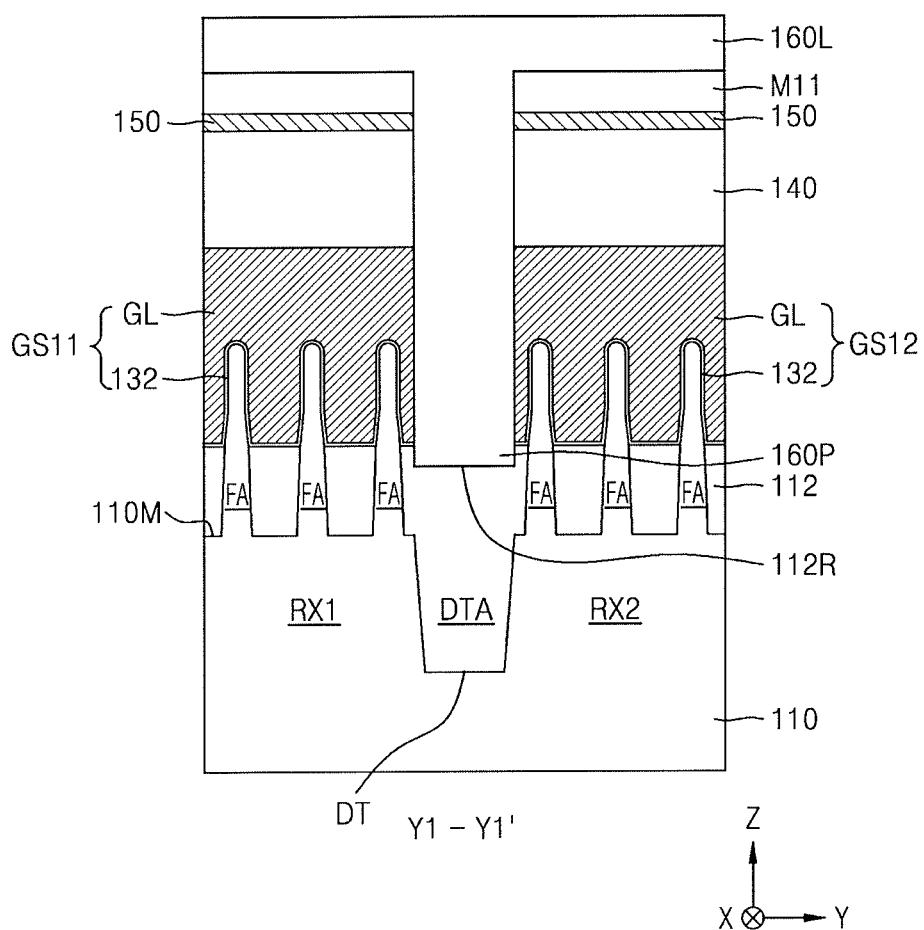
Figure 15C:
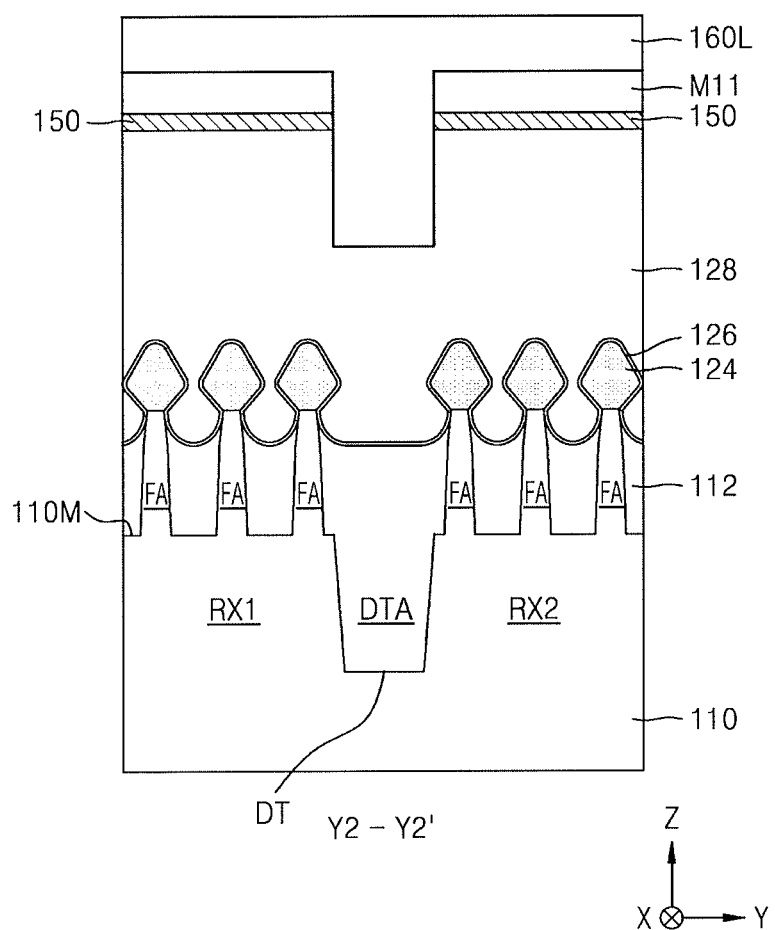

Referring to FIGS. 15A, 15B, and 15C, an isolation insulating film 160L may be formed on the resultant structure of FIGS. 14A, 14B, and 14C to fill the separation space SE1 and cover the first mask pattern M11. In some embodiments, the isolation insulating film 160L may include a silicon nitride film, but embodiments are not limited thereto. The isolation insulating film 160L may include the plurality of protrusions 160P. For example, as illustrated in FIG. 15B, the isolation insulating film 160L may directly contact the etched gate line GL, as the isolation insulating film 160L is formed after the etched gate line GL.

Figure 16A:
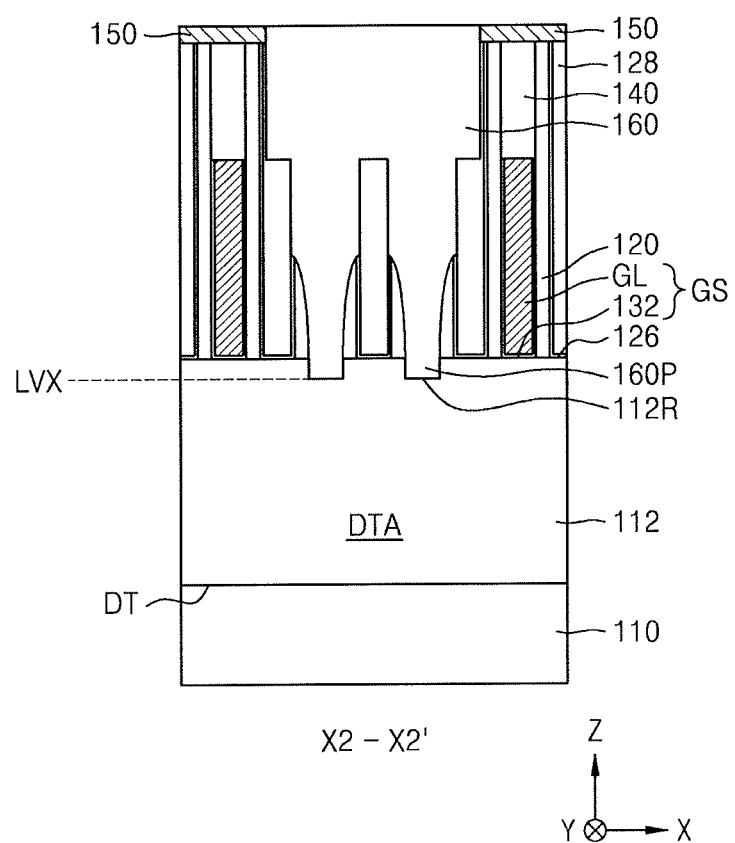
Figure 16B:
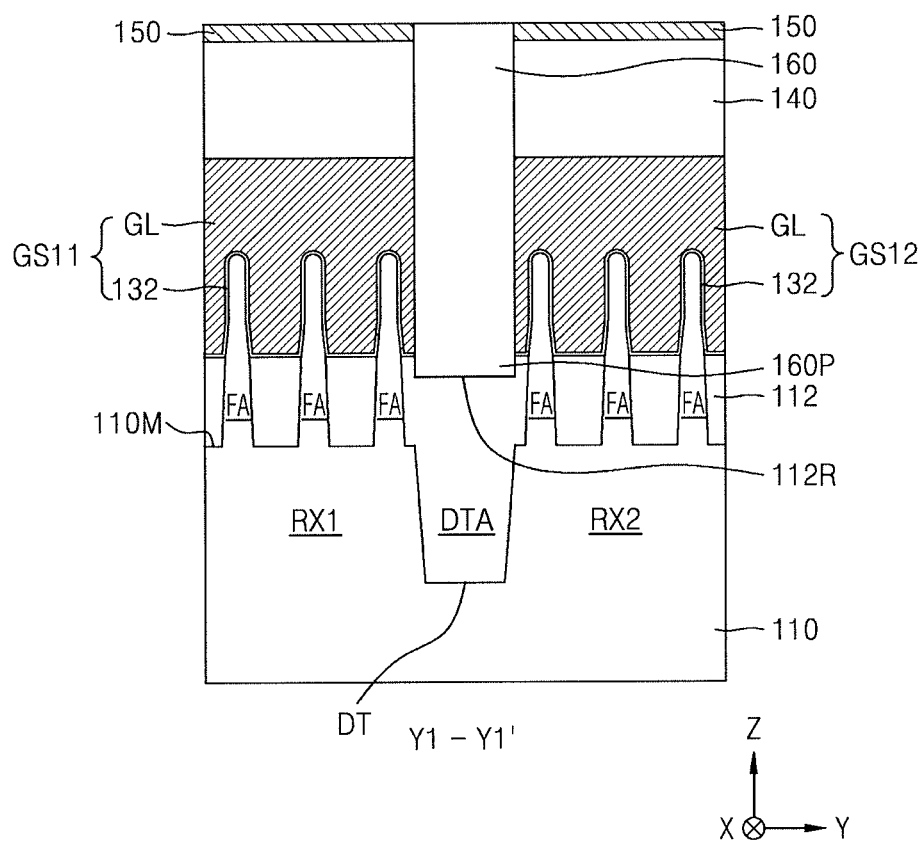
Figure 16C:
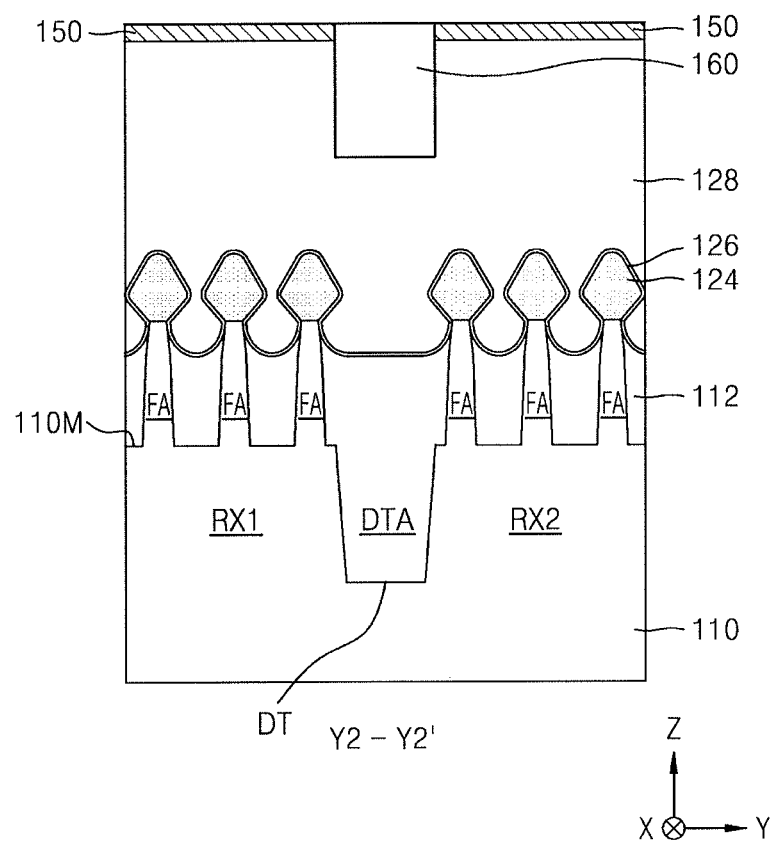

Referring to FIGS. 16A, 16B, and 16C, the isolation insulating film 160L (refer to FIGS. 15A, 15B, and 15C) may be planarized and the first mask pattern M11 may be removed so that the isolation insulating pattern 160 having a planarized top surface may be formed to expose a top surface of the insulating thin film 150. Afterward, the interlayer insulating film 170 may be formed to cover the insulating thin film 150 and the isolation insulating pattern 160, thereby forming the IC device 100 shown in FIGS. 1 and 2A to 2E.

To manufacture the IC device 100A shown in FIGS. 3A, 3B, and 3C, the method described with reference to FIGS. 4A to 16C may be used. However, the isolation insulating pattern 162 including the lower insulating pattern 162A and the upper insulating pattern 162B including different materials may be formed instead of forming the isolation insulating pattern 160 in the processes described with reference to FIGS. 15A to 16C.

According to the methods of manufacturing the IC devices 100 and 100A described with reference to FIGS. 4A to 16C, while the gate line GL is etched to form the separation space SE1 for forming the isolation insulating patterns 160 and 162, the etching of the inter-gate dielectric film 128 exposed together with the gate structure GS may be suppressed. That is, the gate line GL may be etched at a relatively high etch rate, as compared to the exposed inter-gate dielectric film 128, so that the etched depth D1 of the inter-gate dielectric film 128 may be substantially smaller than that of through the gate structure GS, and substantially higher than the vertical level of the uppermost surfaces of the plurality of source/drain regions 124.

As a result, the plurality of source/drain regions 124 may be separated from the inter-gate dielectric film 128 by a sufficient distance, thereby being prevented from damage due to the etching atmosphere of the gate line GL during the etching of the gate line GL. In other words, since the inter-gate dielectric film 128 is etched so slowly and results in an opening having a bottom at a sufficient distance from the source/drain regions 124 by the time the etching of the gate lines GL is complete, damage to the source/drain regions 124, e.g., to the epitaxial structure of the source/drain regions 124, during etching of the gate lines GL may be prevented or substantially minimized. Accordingly, even if the density of interconnections and contact regions, e.g., through the source/drain regions 124, formed at a same level increases in the logic cell LC, of which an area is reduced with the downscaling of the IC devices, a sufficient insulation distance between adjacent conductive regions in a minimum area may be ensured using a simple, easy method.

Figure 17A:
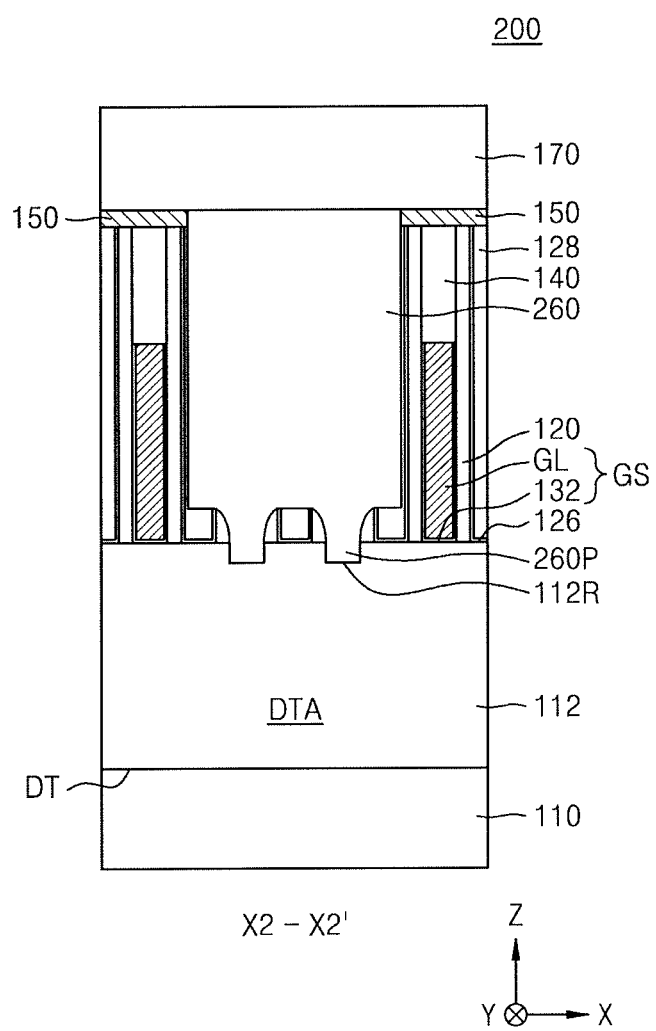
FIGS. 17A, 17B, and 17C illustrate cross-sectional views of an IC device according to embodiments.
Figure 17B:
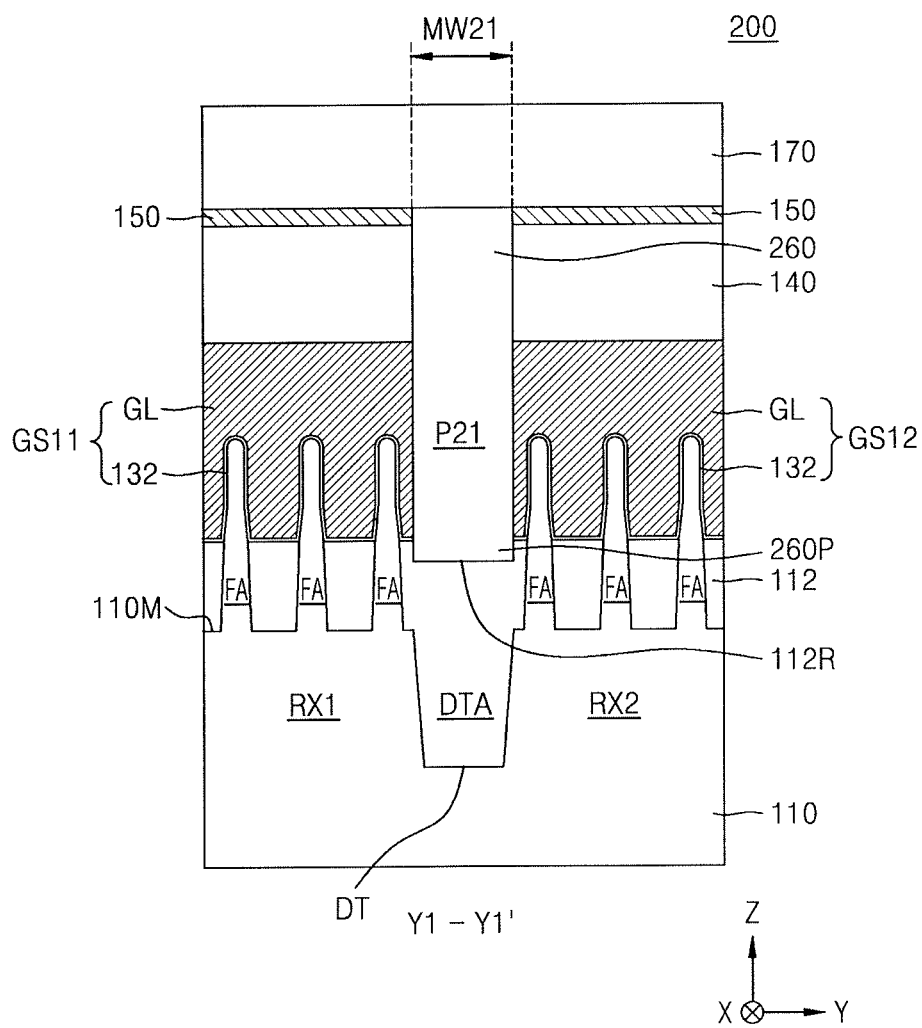
Figure 17C:
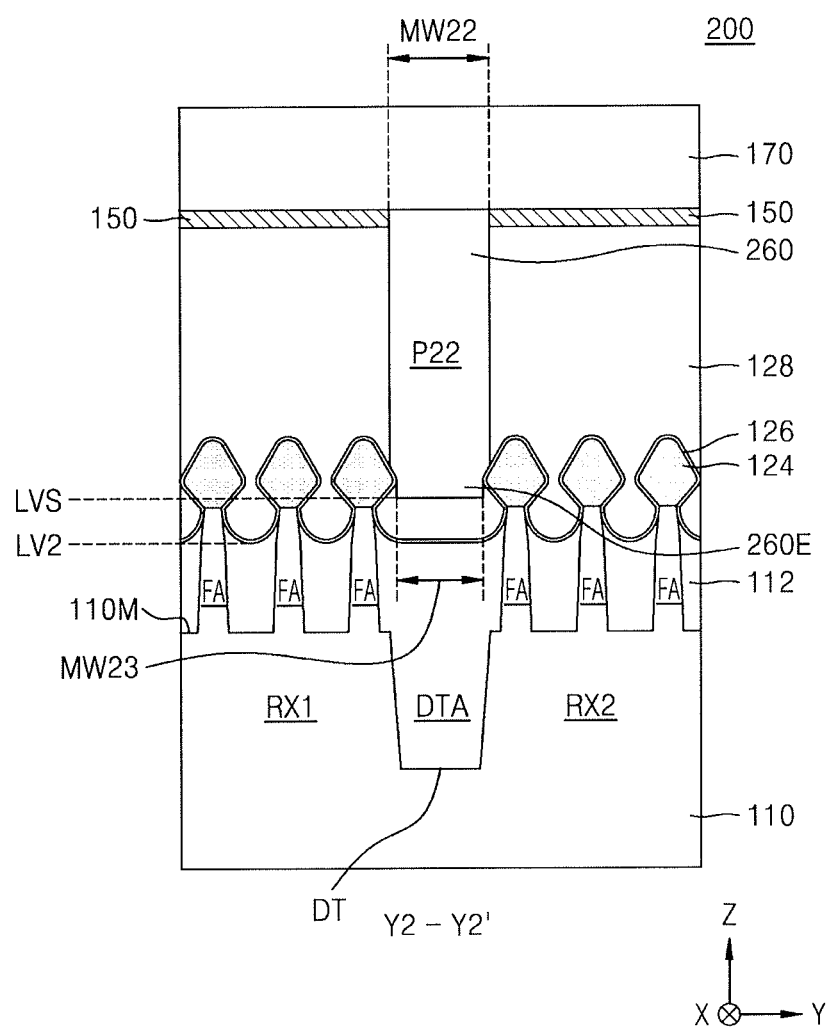

FIGS. 17A, 17B, and 17C are cross-sectional views of an IC device 200 according to some embodiments. FIG. 17A is a cross-sectional view of a portion corresponding to the cross-section taken along line X2-X2' of FIG. 1. FIG. 17B is a cross-sectional view of a portion corresponding to the cross-section taken along line Y1-Y1' of FIG. 1. FIG. 17C is a cross-sectional view of a portion corresponding to the cross-section taken along line Y2-Y2' of FIG. 1. In FIGS. 17A to 17C, same reference numerals are used to denote the same elements as with reference to FIGS. 1 and 2A to 2E, and detailed descriptions thereof will be omitted.

Referring to FIGS. 17A, 17B, and 17C, the IC device 200 may have substantially the same configuration as the IC device 100 shown in FIGS. 1 and 2A to 2E. However, the IC device 200 may include an isolation insulating pattern 260. The isolation insulating pattern 260 may include a first portion P21 and a second portion P22. The first portion P21 may have opposite sidewalls facing a pair of gate structures GS that extend in a straight line. The second portion P22 may have opposite sidewalls facing the inter-gate dielectric film 128.

The isolation insulating pattern 260 may include a plurality of protrusions 260P, which may protrude toward the substrate 110. The plurality of protrusions 260P may be disposed in line in a widthwise direction (X direction) of a logic cell LC. The plurality of protrusions 260P may be included in the first portion P21 of the isolation insulating pattern 260. A bottom surface of each of the plurality of protrusions 260P may be a lowermost surface of the first portion P21. A vertical level of the bottom surface of each of the plurality of protrusions 260P may be lower than the vertical level LV2 of the top surface of a device isolation film 112. The device isolation film 112 may have the plurality of isolation recesses 112R, which may surround the plurality of protrusions 260P formed in the isolation insulating pattern 260.

A vertical level LVS of a lowermost surface of the second portion P22 of the isolation insulating pattern 260 may be higher than the vertical level LV2 of the top surface of the device isolation film 112, and lower than a vertical level of uppermost surfaces of a plurality of source/drain regions 124. The second portion P22 of the isolation insulating pattern 260 may include an extension portion 260E located in a space between two adjacent ones of the plurality of source/drain regions 124.

In the lengthwise direction (Y direction) of the logic cell LC, a maximum width MW21 of the first portion P21 of the isolation insulating pattern 260 may be substantially equal to a maximum width MW22 of the second portion P22 thereof. The extension portion 260E may have a width MW23 less than the maximum width MW22 of the second portion P22. Thus, a width of the second portion P22 of the isolation insulating pattern 260 in the Y direction may vary along a vertical direction (Z direction).

The second portion P22 of the isolation insulating pattern 260 may include a portion in contact with the insulating liner 126 covering the source/drain regions 124, e.g., the insulating liner 126 may function as an etch-stop layer. Sidewalls of the second portion P22 of the isolation insulating pattern 260, which are in contact with the insulating liner 126, may have curved shapes corresponding to a shape of the insulating liner 126.

A specific configuration of the isolation insulating pattern 260 may be substantially the same as that of the isolation insulating pattern 160 described in FIGS. 1 and 2A to 2E.

Figure 18A:
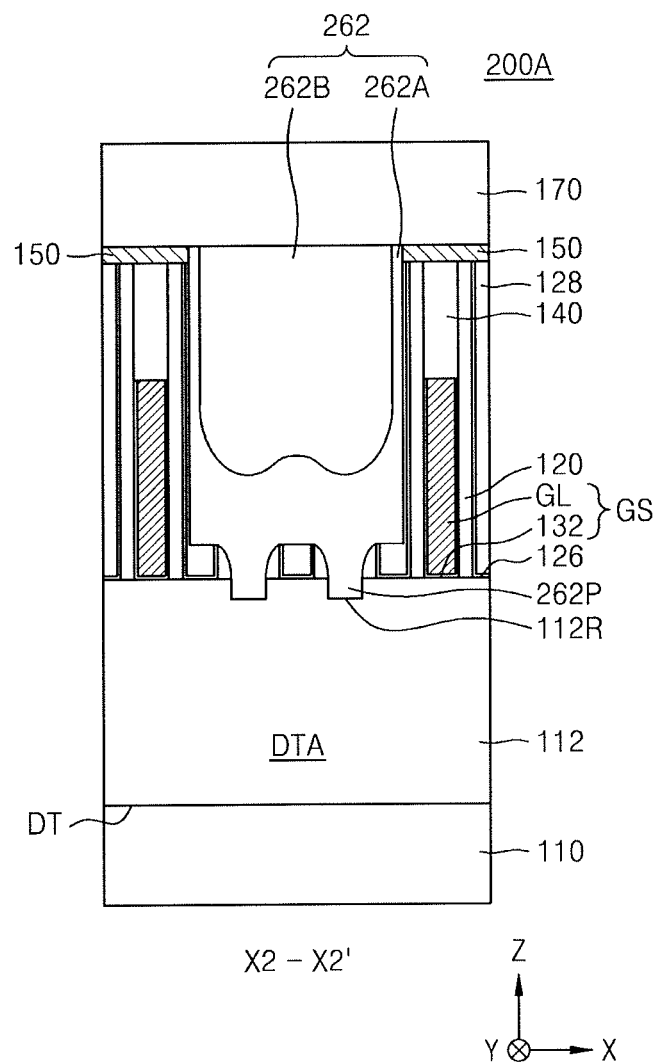
FIGS. 18A, 18B, and 18C illustrate cross-sectional views of an IC device according to embodiments.
Figure 18B:
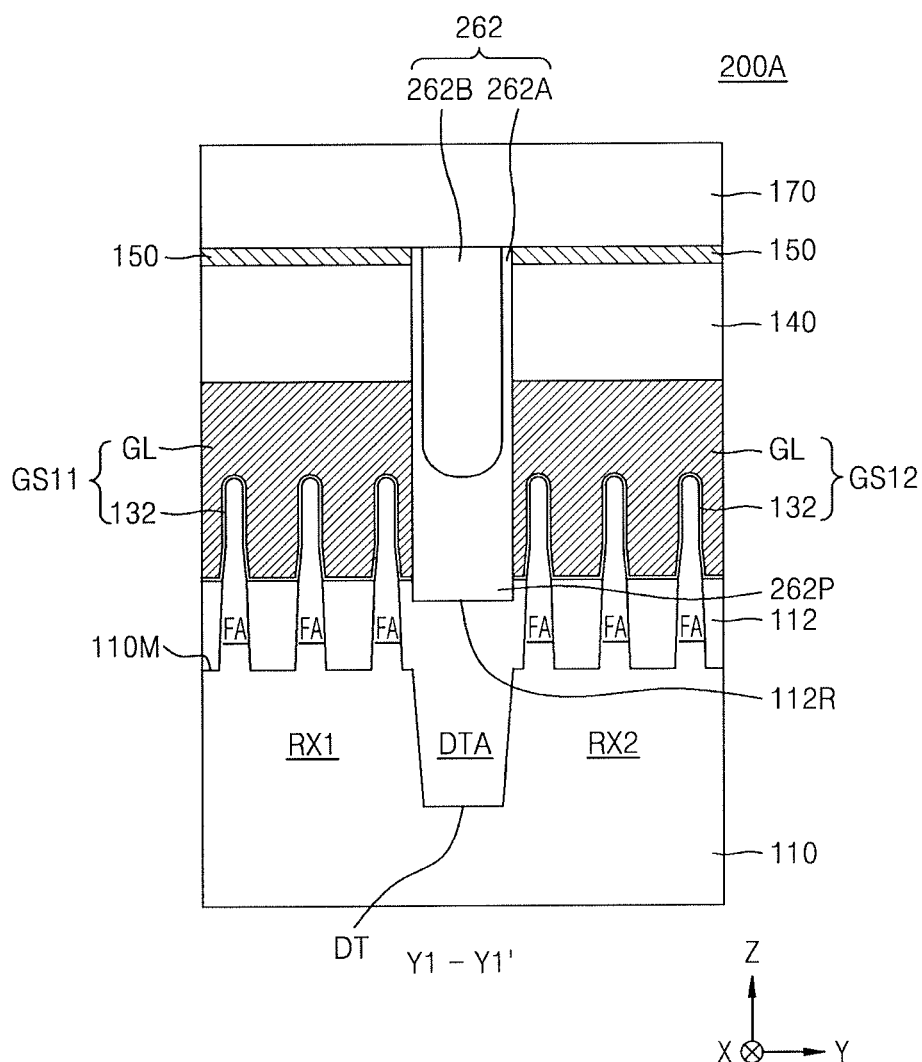
Figure 18C:
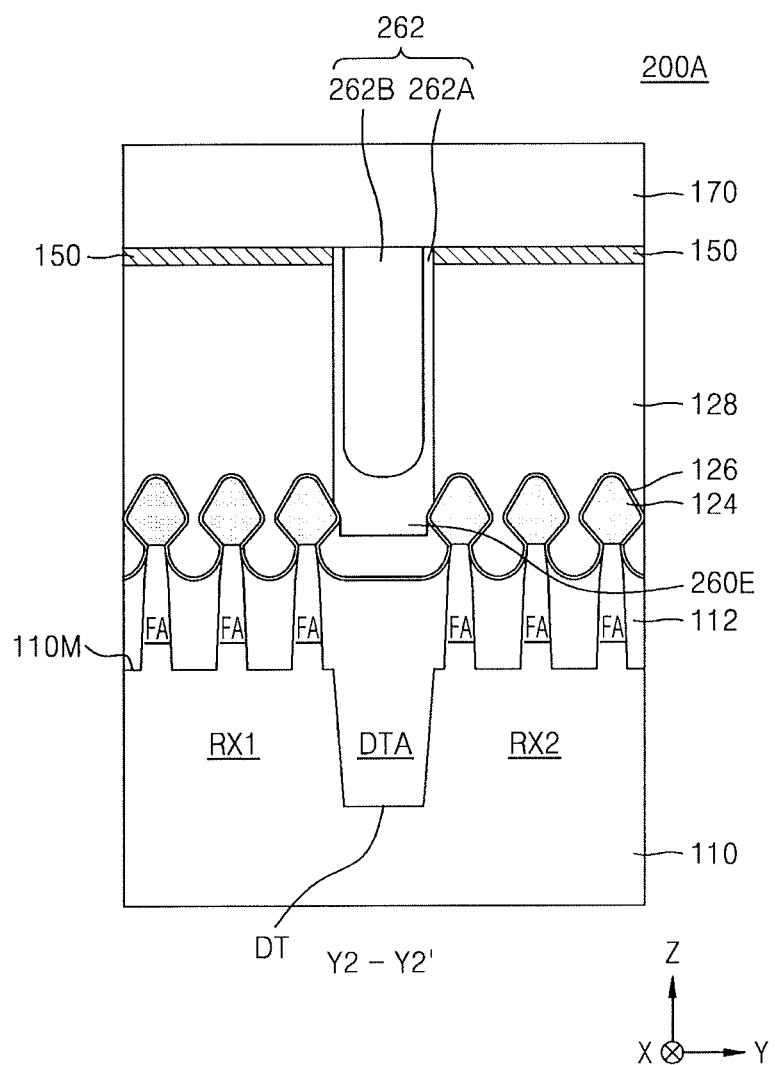

FIGS. 18A, 18B, and 18C are cross-sectional views of an IC device 200A according to some embodiments. FIG. 18A is a cross-sectional view of a portion corresponding to the cross-section taken along the line X2-X2' of FIG. 1. FIG. 18B is a cross-sectional view of a portion corresponding to the cross-section taken along line Y1-Y1' of FIG. 1. FIG. 18C is a cross-sectional view of a portion corresponding to the cross-section taken along line Y2-Y2' of FIG. 1. In FIGS. 18A, 18B, and 18C, the same reference numerals are used to denote the same elements as with reference to FIGS. 1 to 17C, and detailed descriptions thereof will be omitted.

Referring to FIGS. 18A-18C, the IC device 200A may have substantially the same configuration as the IC device 200 shown in FIGS. 17A-17C. However, in the IC device 200A, an isolation insulating pattern 262 may have a multilayered structure including a lower insulating pattern 262A and an upper insulating pattern 262B including different materials. Specific configurations of the lower insulating pattern 262A and the upper insulating pattern 262B may be substantially the same as those of the lower and upper insulating patterns 162A and 162B described with reference to FIGS. 3A-3C.

Figure 19:
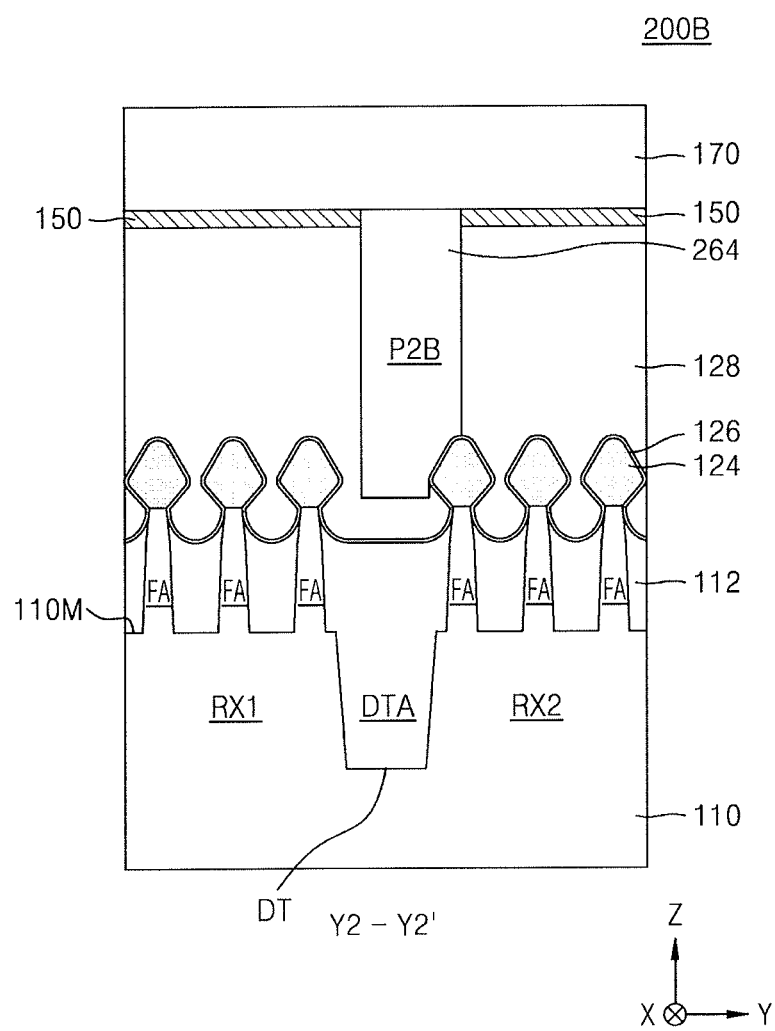
FIG. 19 illustrates a cross-sectional view of an IC device according to embodiments.

FIG. 19 is a cross-sectional view of an IC device 200B according to some embodiments. FIG. 19 is a cross-sectional view of a portion corresponding to the cross-section taken along line Y2-Y2' of FIG. 1. In FIG. 19, same reference numerals are used to denote the same elements as with reference to FIGS. 1 to 17C, and detailed descriptions thereof will be omitted.

Referring to FIG. 19, the IC device 200B may include an isolation insulating pattern 264. In the lengthwise direction (Y direction) of a logic cell LC, the isolation insulating pattern 264 may be located closer to one of two adjacent source/drain regions 124 between which the isolation insulating pattern 264 is interposed, than to the other one thereof.

The isolation insulating pattern 264 may include a second portion P2B having opposite sidewalls in contact with an inter-gate dielectric film 128. A portion of the second portion P2B may cover a top surface and sidewalls of one source/drain region 124 located closer to the isolation insulating pattern 264, from among two adjacent source/drain regions 124 between which the isolation insulating pattern 264 is interposed. The second portion P2B may be in contact with the insulating liner 126 over the source/drain region 124 located closest to the second portion P2B.

FIGS. 20A, 20B, 20C, 21A, 21B, and 21C are cross-sectional views of stages in a method of manufacturing an IC device, according to some embodiments.

Figure 20A:
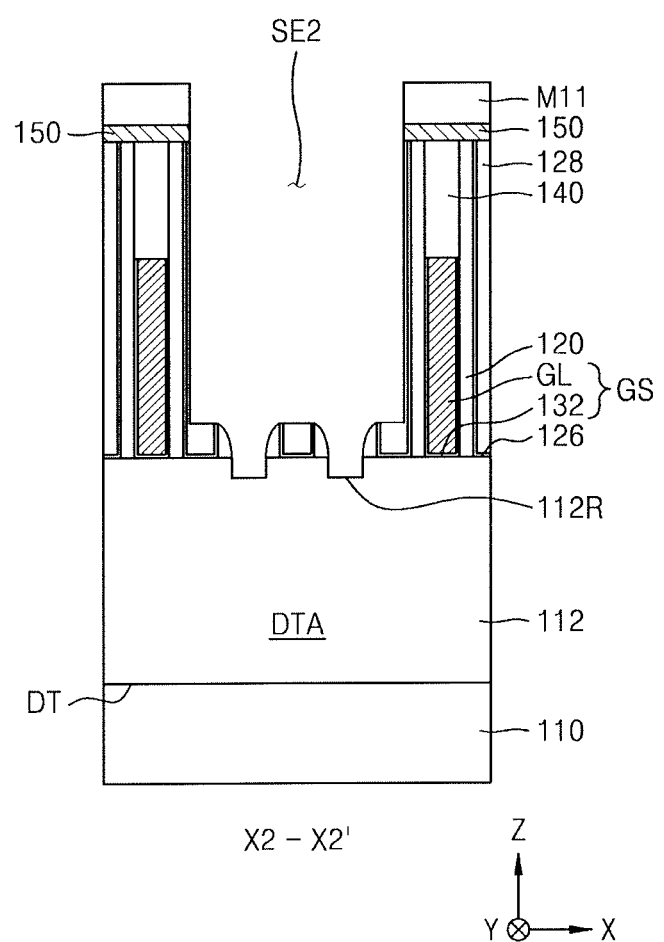
FIGS. 20A, 20B, 20C, 21A, 21B, and 21C illustrate cross-sectional views of stages in a method of manufacturing an IC device, according to embodiments.
Figure 20B:
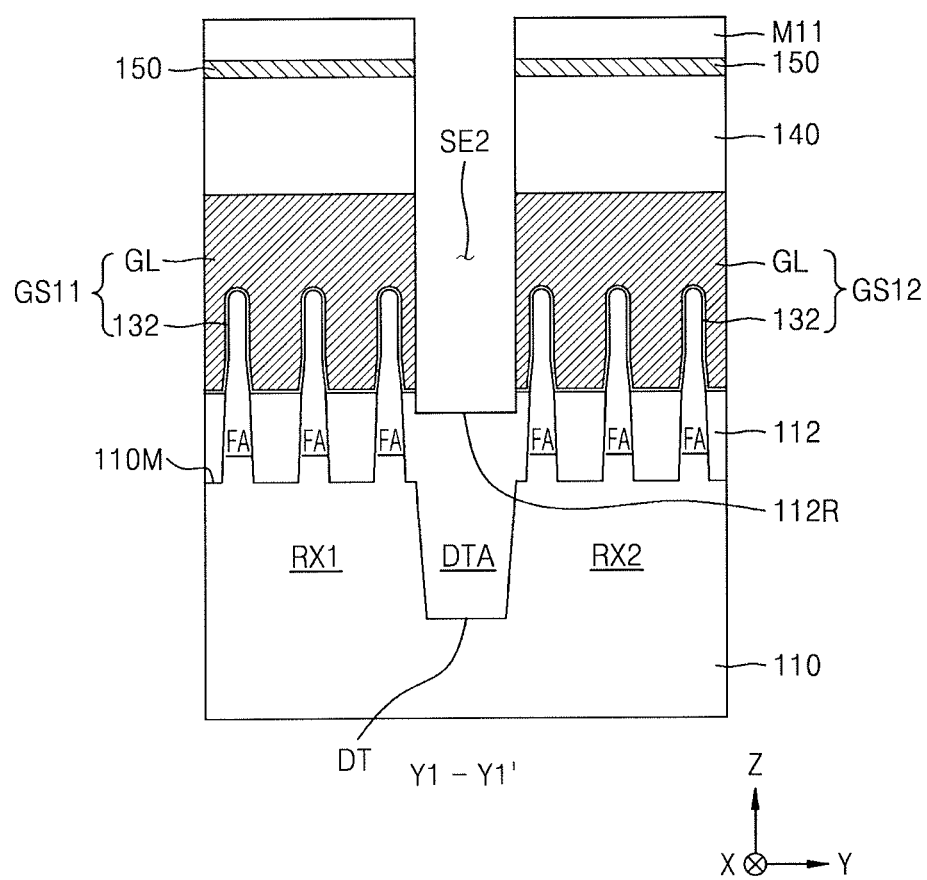
Figure 20C:
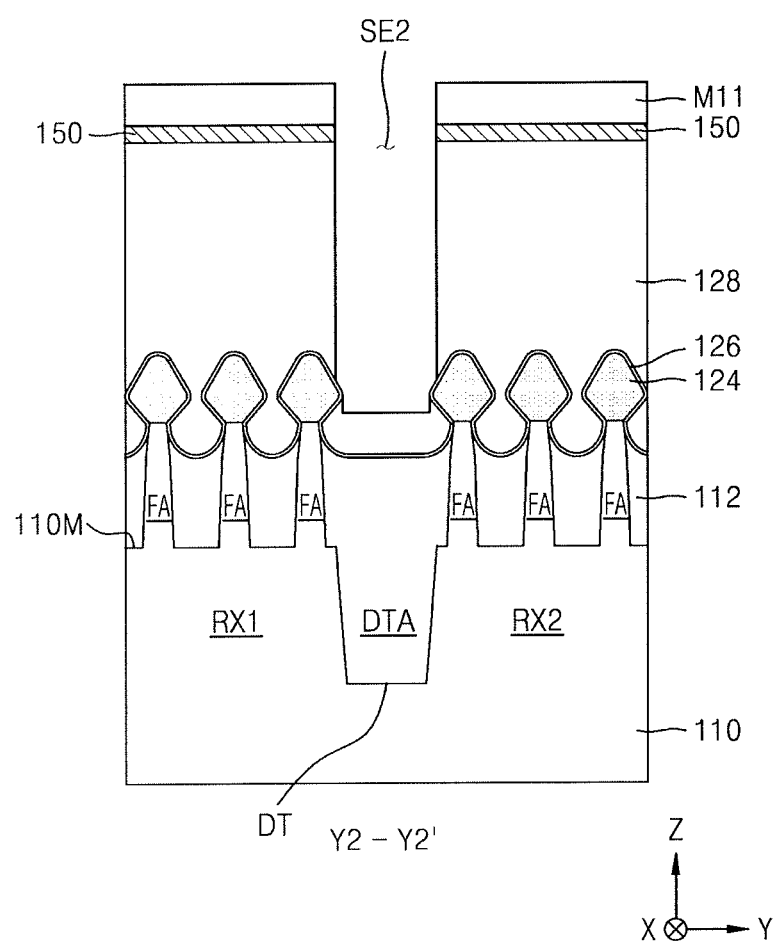
Figure 21A:
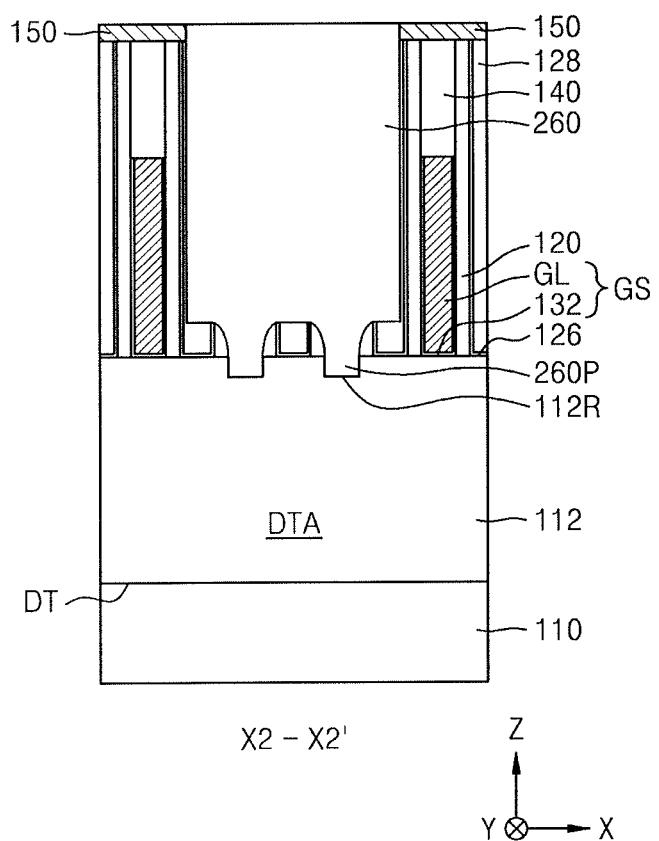
Figure 21B:
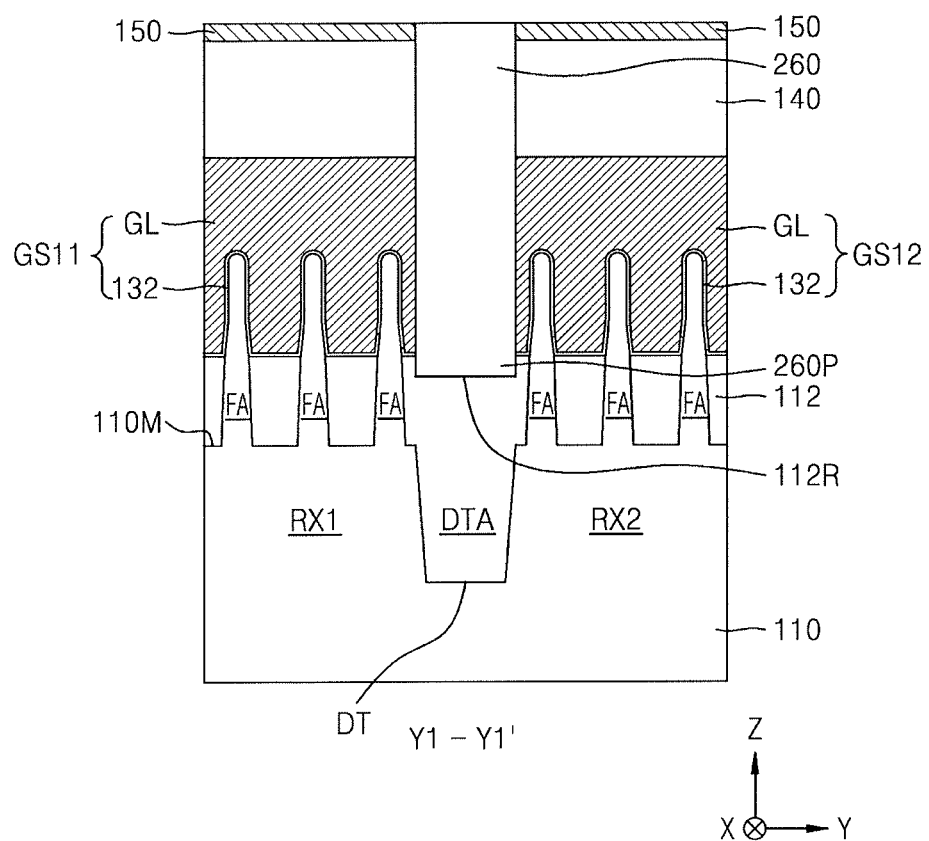
Figure 21C:
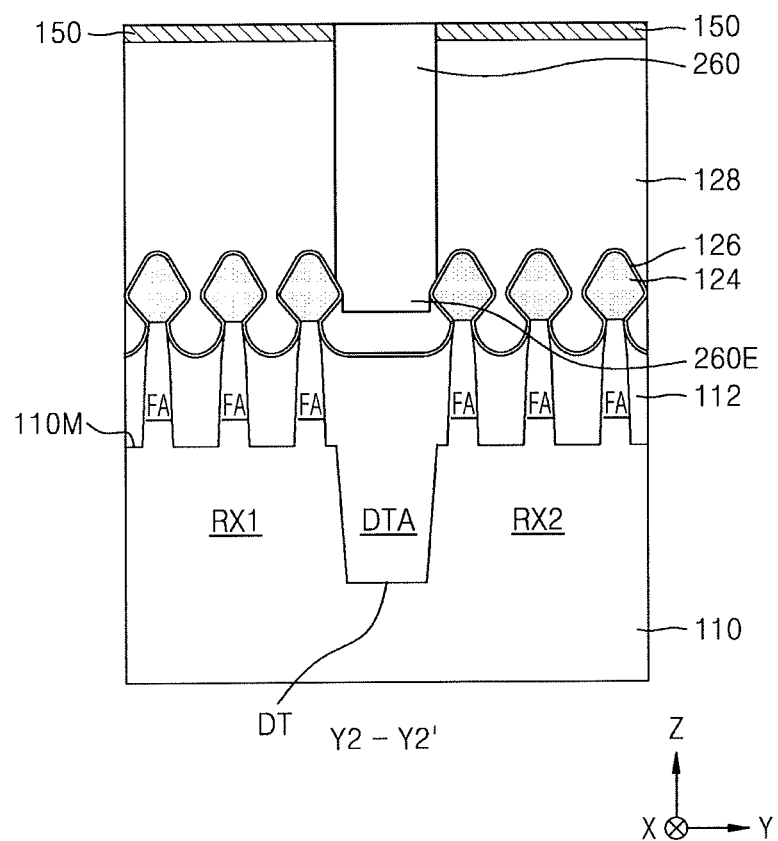

FIGS. 20A and 21A each show a sectional configuration of a portion corresponding to the cross-section taken along line X2-X2' of FIG. 1, according to embodiments. FIGS. 20B and 21B each show a sectional configuration of a portion corresponding to the cross-section taken along line Y1-Y1' of FIG. 1, according to embodiments. FIGS. 20C and 21C each show a sectional configuration of a portion corresponding to the cross-section taken along line Y2-2' of FIG. 1, according to embodiments. A method of manufacturing the IC device 200 shown in FIGS. 17A, 17B, and 17C will be described with reference to FIGS. 20A to 21C. In FIGS. 20A to 21C, same reference numerals are used to denote same elements as with reference to FIGS. 1-17C, and detailed descriptions thereof will be omitted.

Referring to FIGS. 20A, 20B, and 20C, the gate insulating capping layer 140 may be etched by performing the processes described with reference to FIGS. 4A to 13C so that the gate structure GS may be exposed through an opening OP1. Thereafter, the gate structure GS exposed through the opening OP1 may be removed by an etching process using a method similar to that described with reference to FIGS. 14A, 14B, and 14C. In this case, the plurality of isolation recesses 112R may be formed in the device isolation film 112.

However, in the present example embodiment, the gate structure GS may be etched at a higher etch rate than an inter-gate dielectric film 128 using the etch selectivity between the gate structure GS and the inter-gate dielectric film 128 under conditions in which the etching of an insulating liner 126 including a silicon nitride film is suppressed. For example, the $BCl_3$ content of a $BCl_3$-containing etch gas described above with reference to FIGS. 14A, 14B, and 14C may be controlled, e.g., adjusted to have a higher concentration, so that a metal film and/or a metal-containing film and a silicon oxide film may be etched under conditions in which the etching of the silicon nitride film is suppressed. In this case, the etch rate of the silicon oxide film may be controlled to be lower than an etch rate of the metal film and/or the metal-containing film, and an etch rate of the silicon nitride film may be controlled to be lower than the etch rate of the silicon oxide film.

As a result, the gate structure GS exposed through the opening OP1 may be removed by the etching process to expose the device isolation film 112. While the plurality of isolation recesses 112R are being formed in the device isolation film 112, the inter-gate dielectric film 128 may be also etched at a relatively low etch rate. When the insulating liner 126 covering the plurality of source/drain regions 124 is exposed as a result of the etching of the inter-gate dielectric film 128, the insulating liner 126 also may serve as an etch mask together with the first mask pattern M11 so that the etching of the insulating liner 126 may be suppressed, and the inter-gate dielectric film 128 may be further etched. Thus, a separation space SE2 having a shape self-aligned by the insulating liner 126 may remain.

The separation space SE2 may extend to a space between two adjacent ones of the plurality of source/drain regions 124. A vertical level of a bottom surface of the separation space SE2 between the two adjacent source/drain regions 124 may be lower than a vertical level of uppermost surfaces of the plurality of source/drain regions 124 and higher than a vertical level of a top surface of the device isolation film 112.

As shown in FIG. 20A, during the formation of the separation space SE2, heights of insulating spacers 120 and the insulating liner 126 located in the vicinity of the gate structure GS may become lower than in the case shown in FIG. 14A.

Referring to FIGS. 21A, 21B, and 21C, the processes described with reference to FIGS. 15A to 16C may be performed so that the isolation insulating pattern 260 having a planarized top surface may be formed in the separation space SE2 (refer to FIGS. 20A, 20B, and 20C). The method described with reference to FIGS. 20A to 21C may be used to manufacture the IC device 200A shown in FIGS. 18A, 18B, and 18C. However, in the processes described with reference to FIGS. 21A to 21C, the isolation insulating pattern 262 including the lower insulating pattern 262A and the upper insulating pattern 262B including different materials may be formed instead of forming the isolation insulating pattern 260.

The method described in FIGS. 20A-21C may be used to manufacture the IC device 200B shown in FIG. 19. However, in the process of forming the separation space SE2 described with reference to FIGS. 20A-20C, the separation space SE2 may be formed to be at a position closer to any one of two adjacent source/drain regions 124 between which the separation space SE2 is interposed, than the other source/drain region 124.

According to the methods of manufacturing the IC devices 200, 200A, and 200B described with reference to FIGS. 20A to 21C, when the gate line GL is etched to form the separation space SE2 for forming the isolation insulating patterns 260 or 262, the gate line GL may be etched at a relatively high etch rate under conditions in which an etch rate of the inter-gate dielectric film 128 exposed together with the gate structure GS is controlled to be relatively low and the etching of the insulating liner 126 is suppressed. Accordingly, even if the insulating liner 126 covering the plurality of source/drain regions 124 is exposed during the formation of the separation space SE2, the separation space SE2 having a shape self-aligned by the insulating liner 126 may be formed. Therefore, even when the separation space SE2 extends to a space between two adjacent source/drain regions 124, the plurality of source/drain regions 124 may be prevented from being damaged due to an etching atmosphere of the gate line GL during the etching of the gate line GL. Accordingly, even if the density of interconnections and contact regions formed at the same level increases in a logic cell LC of which an area is reduced with the downscaling of IC devices, a sufficient insulation distance between adjacent conductive regions in a minimum area may be ensured using a simple, easy method, and a process margin may increase.

Figure 22:
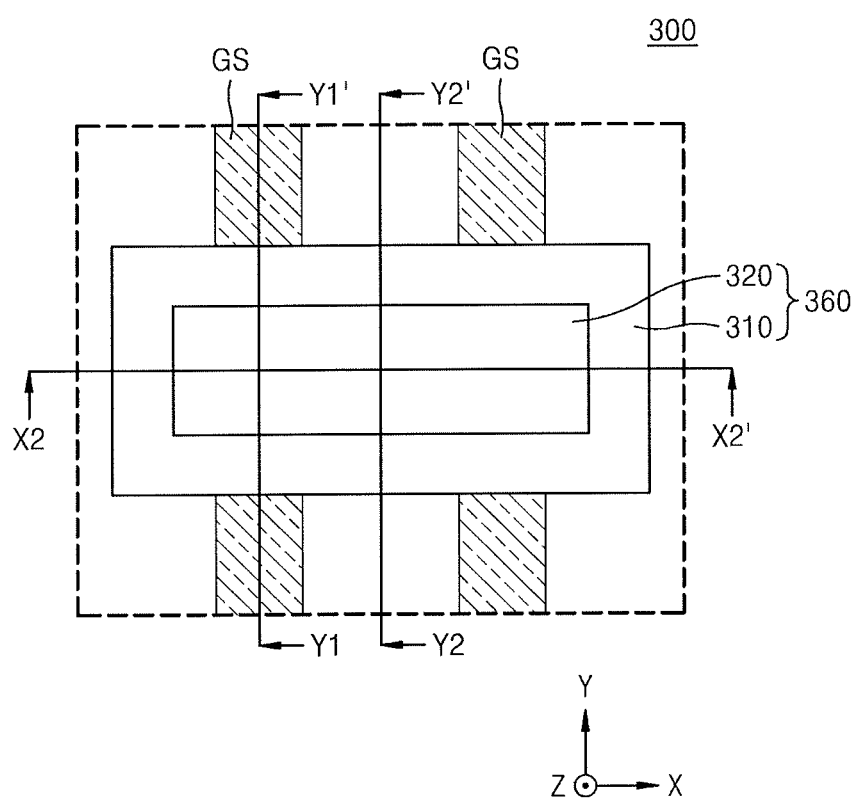
FIG. 22 illustrates a plan view of an IC device according to embodiments.
Figure 23A:
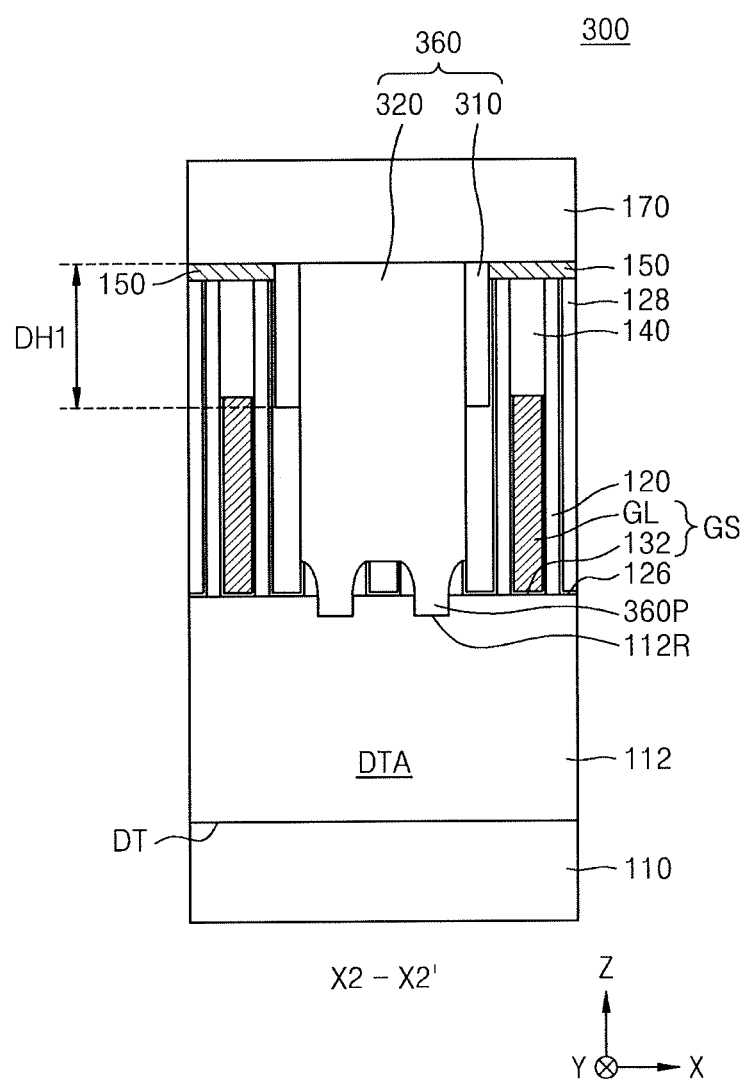
FIGS. 23A, 23B, and 23C illustrate cross-sectional views of main components of the IC device shown in FIG. 22.
Figure 23B:
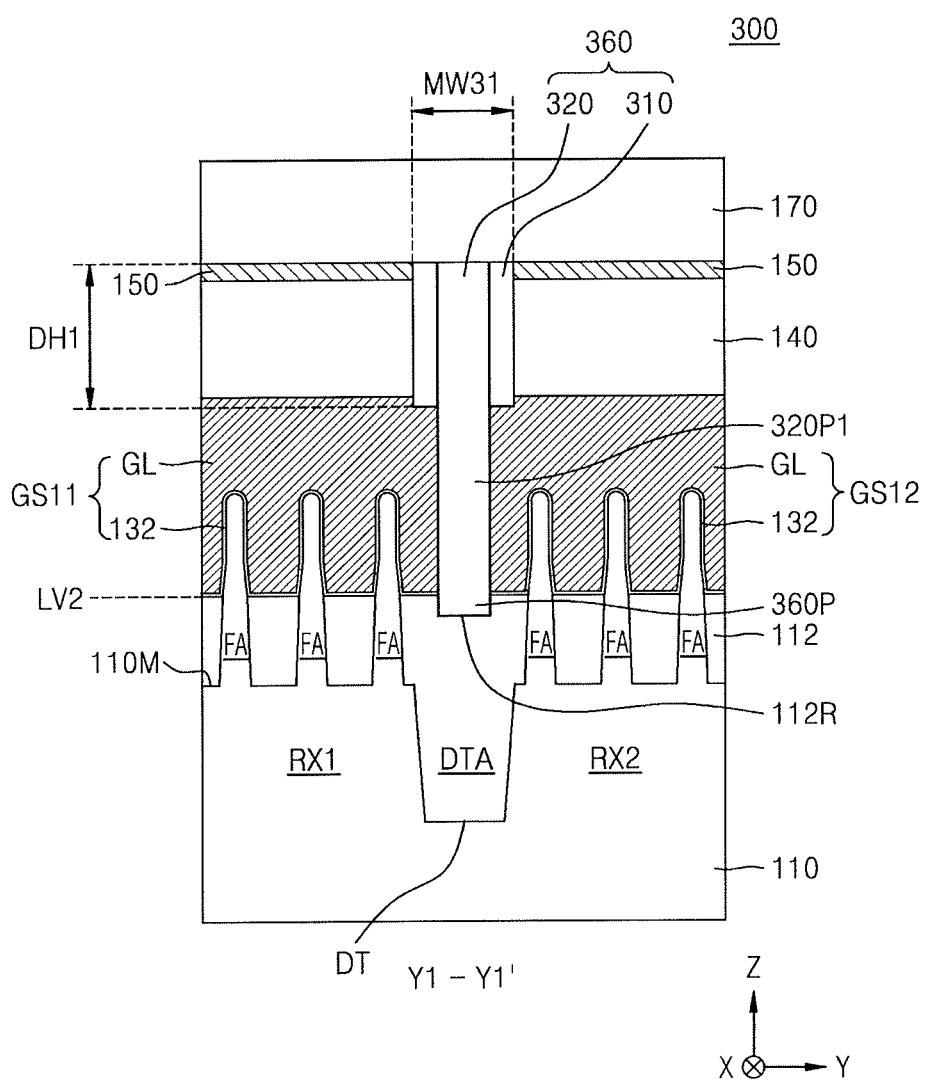
Figure 23C:
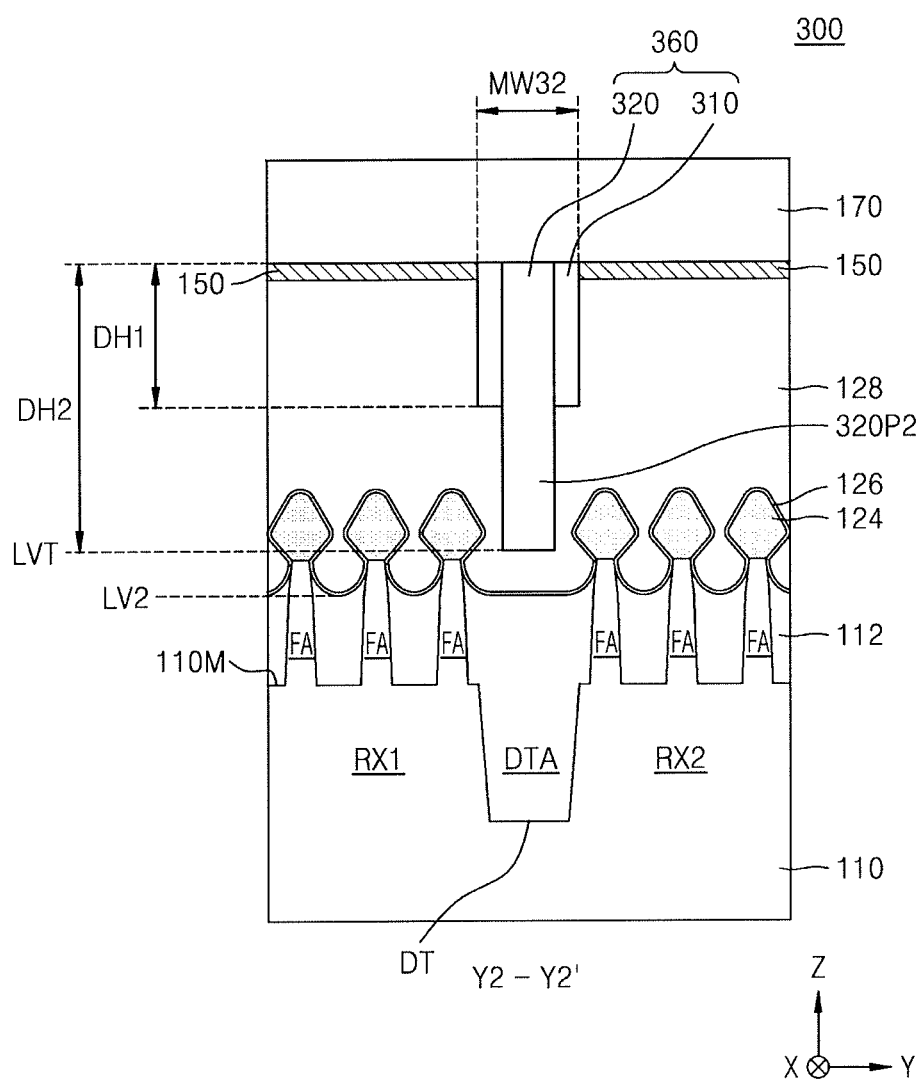

FIGS. 22, 23A, 23B, and 23C are diagrams of an IC device 300 according to some embodiments. FIG. 22 is an enlarged plan view of some components in region "AX" illustrated with the dashed line in FIG. 1. FIG. 23A is a cross-sectional view along line X2-X2' of FIG. 22. FIG. 23B is a cross-sectional view along line Y1-Y1' of FIG. 22. FIG. 23C is a cross-sectional along line Y2-Y2' of FIG. 22. In FIGS. 22, 23A, 23B, and 23C, same reference numerals are used to denote the same elements as with reference to FIGS. 1 to 17C, and detailed descriptions thereof will be omitted.

Referring to FIGS. 22, 23A, 23B, and 23C, the IC device 300 may have substantially the same configuration as the IC device 200 shown in FIGS. 17A to 17C. However, the IC device 300 may include an isolation insulating pattern 360.

The isolation insulating pattern 360 may include isolation insulating spacers 310 and an inner isolation insulating film 320.

The isolation insulating spacers 310 may include portions interposed between the inner isolation insulating film 320 and the gate insulating capping layer 140. The isolation insulating spacers 310 may extend by a first depth DH1 from a top surface of the isolation insulating pattern 360 toward the substrate 110. A vertical level of bottom surfaces of the isolation insulating spacers 310 may be higher than a vertical level of uppermost surfaces of a plurality of source/drain regions 124.

The inner isolation insulating film 320 may have sidewalls surrounded by the isolation insulating spacers 310. The inner isolation insulating film 320 may include a first portion 320P1 and a second portion 320P2. The first portion 320P1 may have opposite sidewalls facing a pair of gate structures GS that extend in a straight line. The second portion 320P2 may have opposite sidewalls facing the inter-gate dielectric film 128.

The second portion 320P2 of the inner isolation insulating film 320 may include a plurality of protrusions 360P that protrude toward the substrate 110. The plurality of protrusions 360P may be arranged in line in the widthwise direction (X direction) of a logic cell LC. A vertical level of a bottom surface of each of the plurality of protrusions 360P may be lower than the vertical level LV2 of a top surface of a device isolation film 112. The device isolation film 112 may have the plurality of isolation recesses 112R surrounding the plurality of protrusions 360P.

The second portion 320P2 of the inner isolation insulating film 320 may extend from the top surface of the isolation insulating pattern 360 toward the substrate 110 by a second depth DH2 greater than the first depth DH1. A vertical level LVT of a lowermost surface of the second portion 320P2 of the inner isolation insulating film 320 may be higher than the vertical level LV2 of the top surface of the device isolation film 112 and lower than the vertical level of the uppermost surfaces of the plurality of source/drain regions 124. The second portion 320P2 of the inner isolation insulating film 320 may be located in a space between two adjacent ones of the plurality of source/drain regions 124.

In the lengthwise direction (Y direction) of the logic cell LC, a maximum width MW31 of the isolation insulating pattern 360 located on the first portion 320P1 of the inner isolation insulating film 320 may be substantially equal to a maximum width MW32 of the isolation insulating pattern 360 located on the second portion 320P2 of the inner isolation insulating film 320. In the Y direction, a width of each of the first portion 320P1 and the second portion 320P2 of the inner isolation insulating film 320 may be less than the maximum widths MW31 and MW32 of the isolation insulating pattern 360.

The second portion 320P2 of the inner isolation insulating film 320, which is located in the space between two adjacent source/drain regions 124, may be spaced apart from the insulating liner 126 covering the two adjacent source/drain regions 124.

In some embodiments, the isolation insulating spacers 310 may include substantially the same material as the inner isolation insulating film 320. For example, each of the isolation insulating spacers 310 and the inner isolation insulating film 320 may include a silicon nitride film. In some embodiments, the isolation insulating spacers 310 may include a different material from the inner isolation insulating film 320. For example, the isolation insulating spacer 310 and the inner isolation insulating film 320 may include respectively different materials, e.g., silicon oxide film and a silicon nitride film. A specific configuration of the inner isolation insulating film 320 of the isolation insulating pattern 360 may be substantially the same as that of the isolation insulating pattern 160 described with reference to FIGS. 1 and 2A to 2E.

FIGS. 24A to 26A, 24B to 26B, and 24C to 26C are cross-sectional views of stages in a method of manufacturing an IC device, according to some embodiments.

Figure 24A:
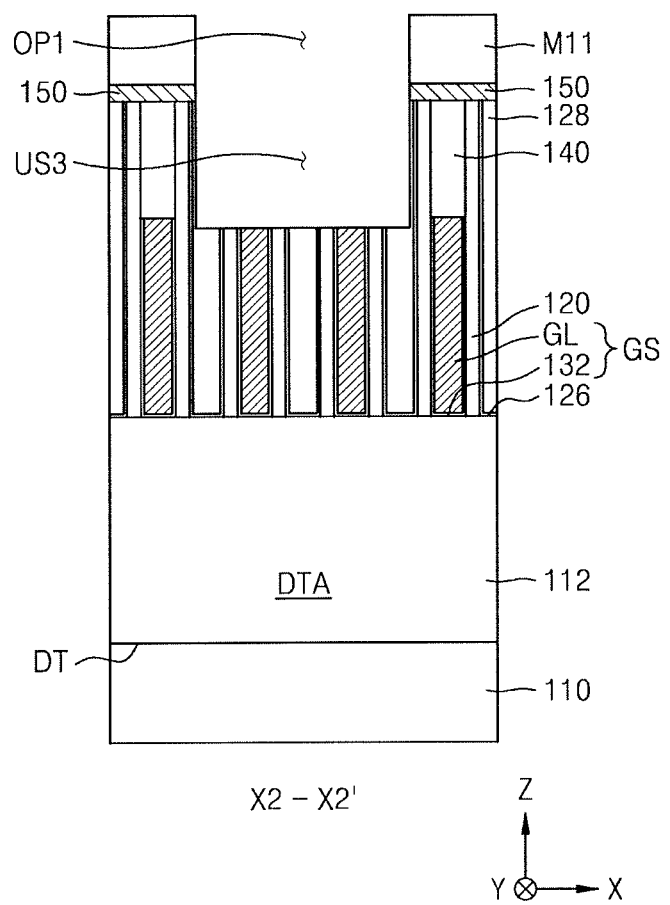
Figure 24B:
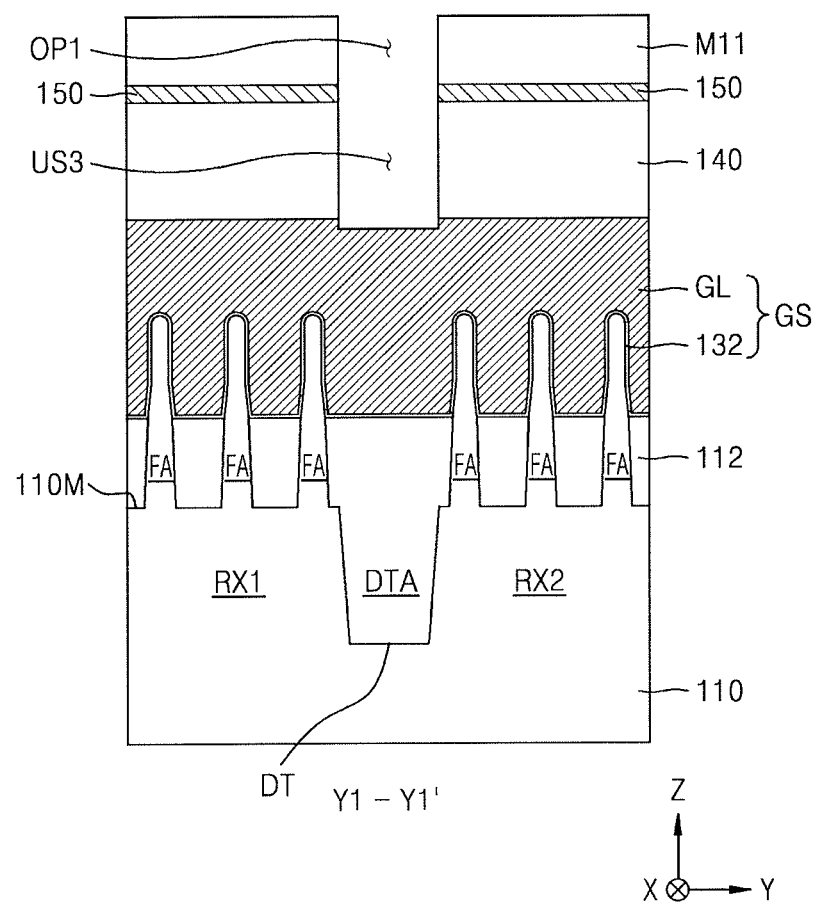
Figure 24C:
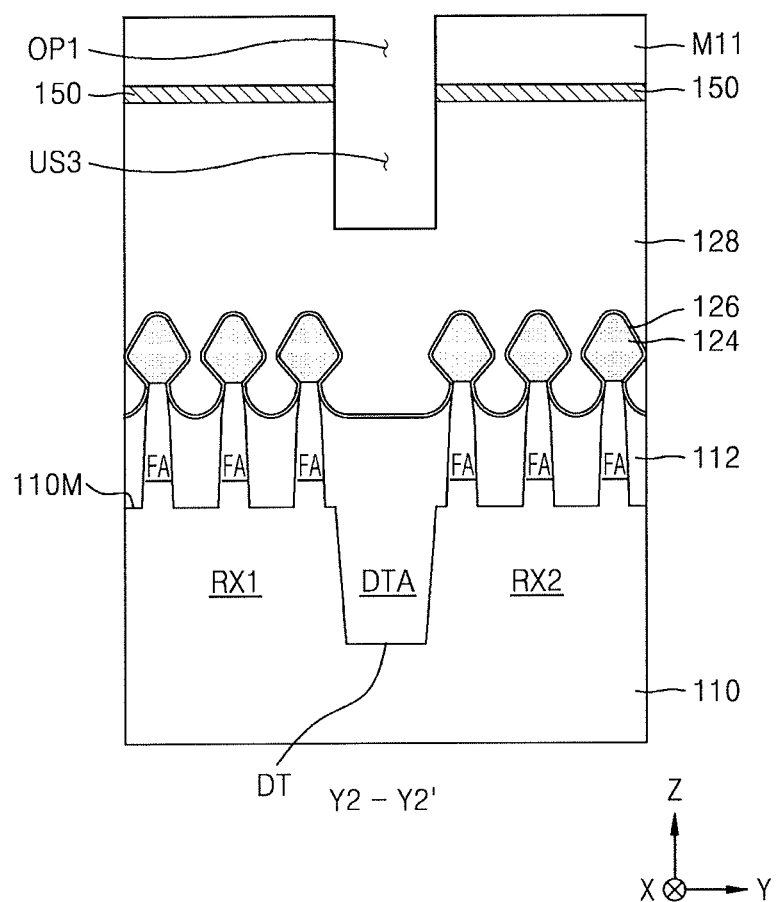
Figure 25A:
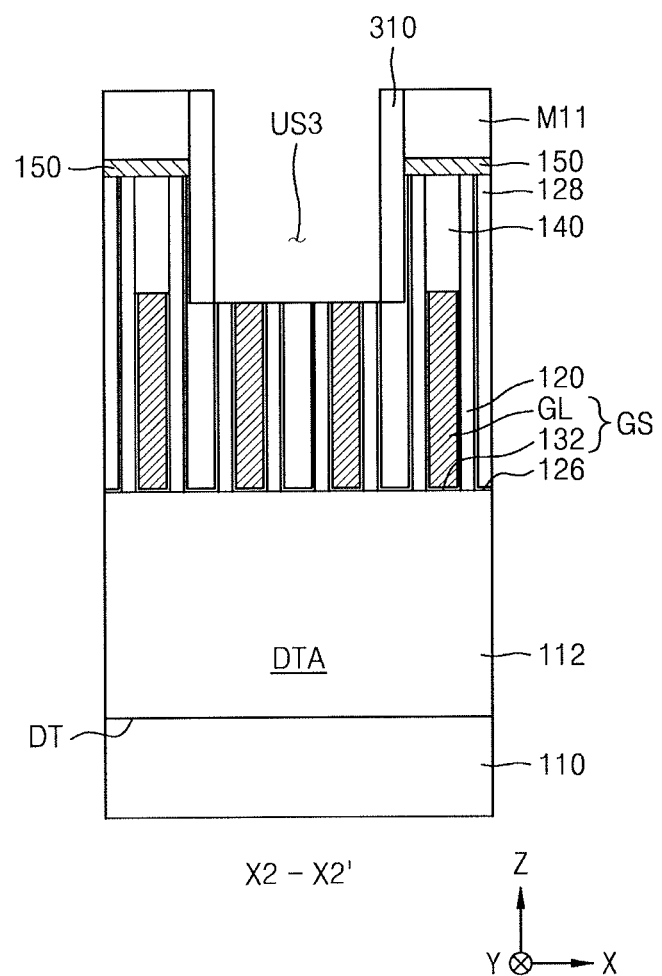
Figure 25B:
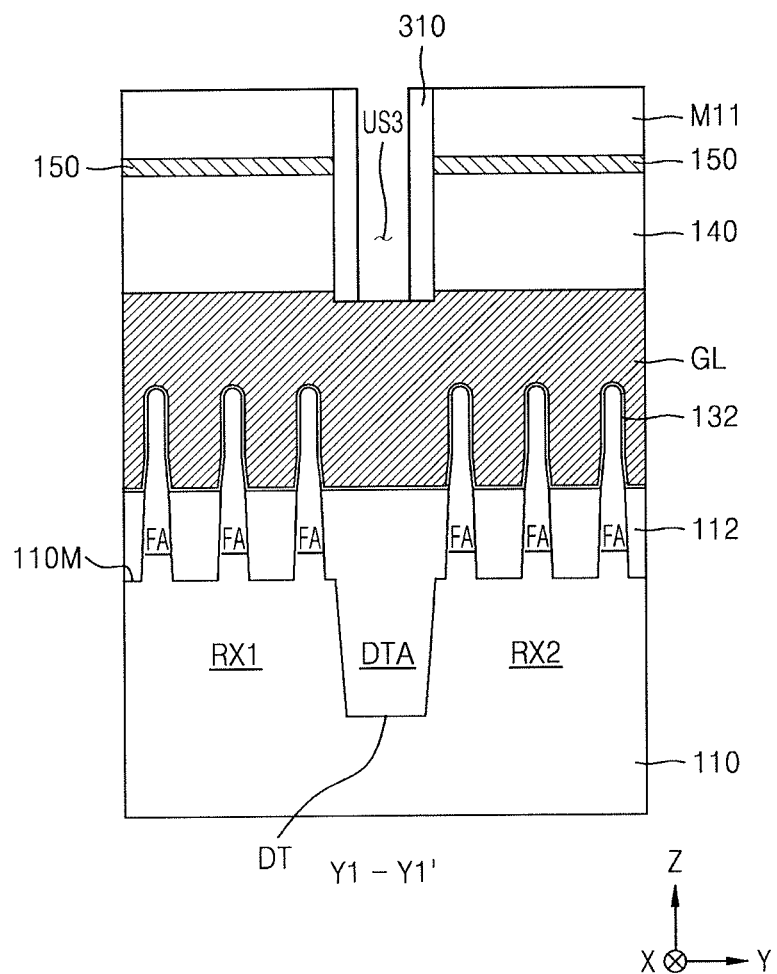
Figure 25C:
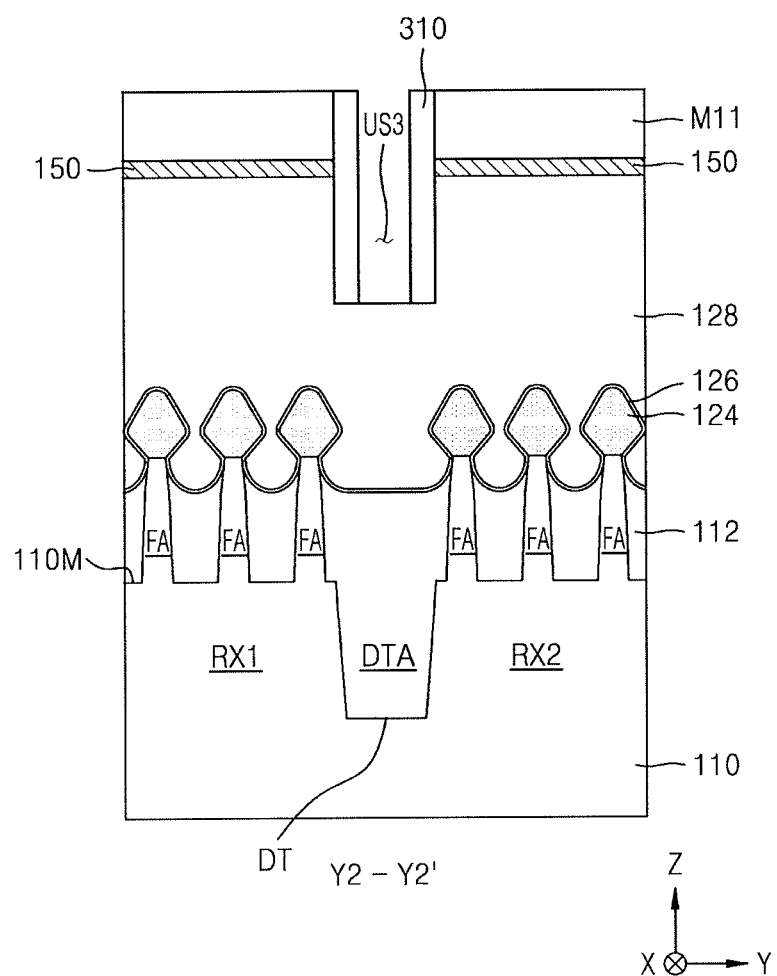
Figure 26A:
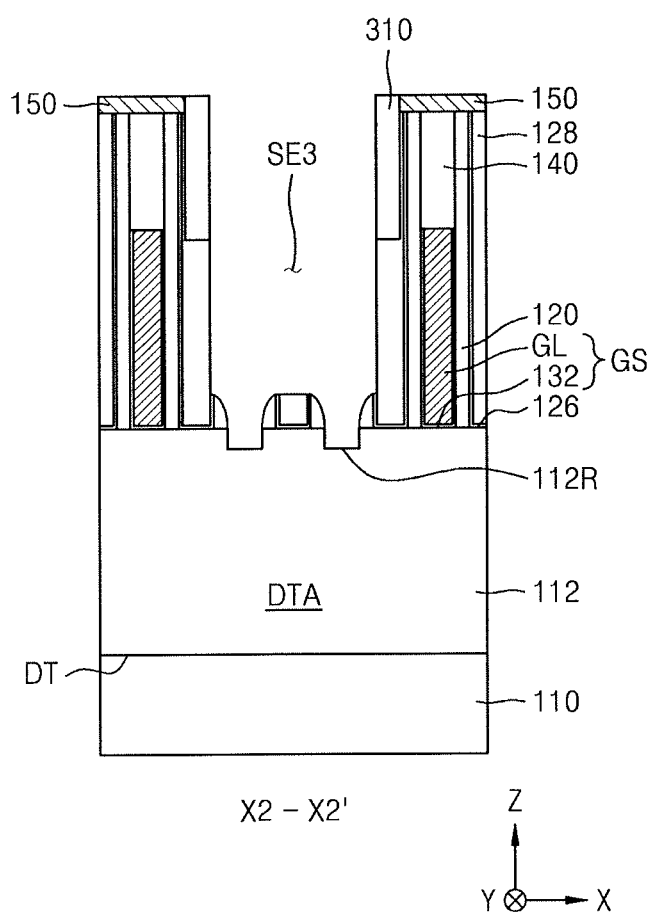
Figure 26B:
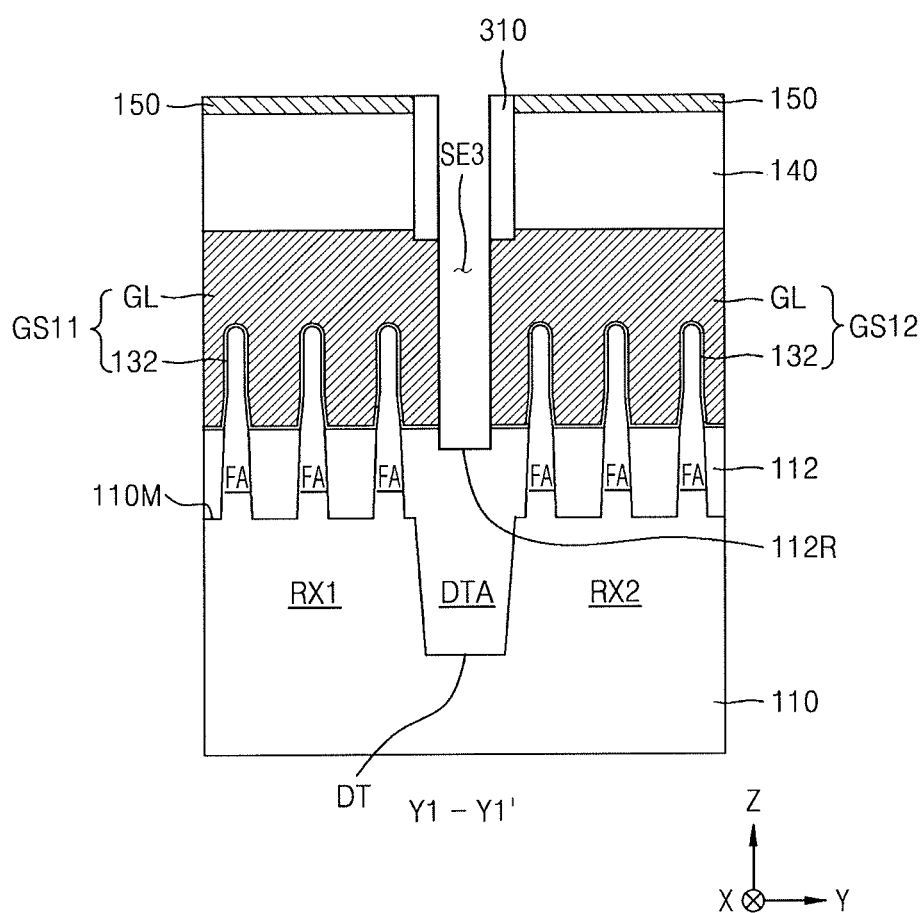
Figure 26C:
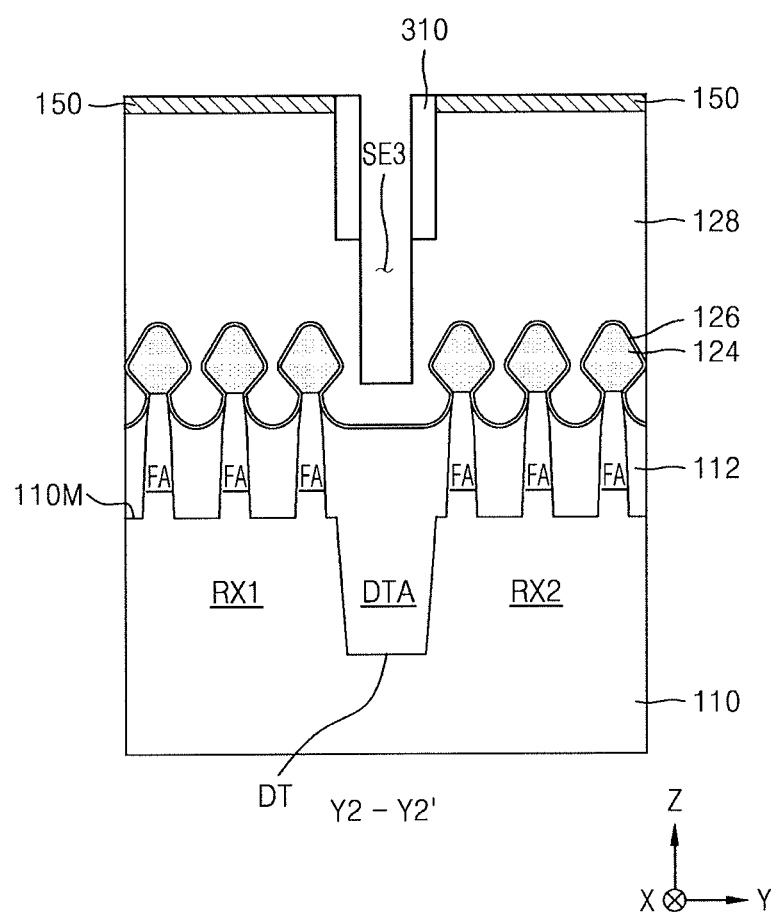

FIGS. 24A, 25A, and 26A each show a sectional configuration along line X2-X2' of FIG. 1. FIGS. 24B, 25B, and 26B each show a sectional configuration along the line Y1-Y1' of FIG. 1. FIGS. 24C, 25C, and 26C each show a sectional configuration along the line Y2-Y2' of FIG. 1. A method of manufacturing the IC device 300 shown in FIGS. 22, 23A, 23B, and 23C will be described with reference to FIGS. 24A to 26C. In FIGS. 24A to 26C, same reference numerals are used to denote the same elements as with reference to FIGS. 1 to 23C, and detailed descriptions thereof will be omitted.

Referring to FIGS. 24A, 24B, and 24C, the gate insulating capping layer 140 may be etched by performing the processes described with reference to FIGS. 4A to 13C, so that the gate structure GS may be exposed through the opening OP1. However, in the present example embodiment, the gate insulating capping layer 140 may be etched at an etch rate substantially equal or similar to the etch rate of the inter-gate dielectric film 128. In this case, portions of the insulating spacers 120, which cover sidewalls of the gate insulating capping layer 140, may be removed during the removal of the gate insulating capping layer 140. An upper portion of the gate structure GS may also be etched due to an over etching process. As a result, an upper space US3 may be formed in an upper portion of the gate structure GS and inside the inter-gate dielectric film 128. After the upper space US3 is formed, a first mask pattern M11 of a mask pattern M1 may remain on a substrate 110.

Referring to FIGS. 25A, 25B, and 25C, a spacer insulating film may be formed to conformally cover exposed surfaces of the resultant structure including the upper space US3 to a substantially uniform thickness. The spacer insulating film may be etched back so that isolation insulating spacers 310 may be formed on inner sidewalls of the upper space US3. In some embodiments, the spacer insulating film may include a silicon nitride film.

Referring to FIGS. 26A, 26B, and 26C, by using a method similar to that described with reference to FIGS. 14A, 14B, and 14C, the gate structure GS exposed through the upper space US3 defined by the isolation insulating spacers 310 may be etched using an insulating thin film 150 and the isolation insulating spacers 310 as etch masks. Thus, a separation space SE3 including a plurality of isolation recesses 112R may be formed on the substrate 110.

When the gate structure GS exposed through the upper space US3 (refer to FIGS. 25A, 25B, and 25C) is etched, an etch rate of the inter-gate dielectric film 128 may be lower than the etch rate of the gate structure GS. The first mask pattern M11 and the isolation insulating spacers 310 covering sidewalls of the first mask pattern M11 may be partially consumed during the etching of the gate structure GS.

Afterward, by using the same method as the method of forming the isolation insulating pattern 160 described with reference to FIGS. 15A to 16C, an inner isolation insulating film 320 may be formed in the separation space SE3 to form the isolation insulating pattern 360, and the interlayer insulating layer 170 may be formed to cover the insulating thin film 150 and the isolation insulating pattern 360. Thus, the IC device 300 shown in FIGS. 23A to 23C may be formed.

Figure 27:
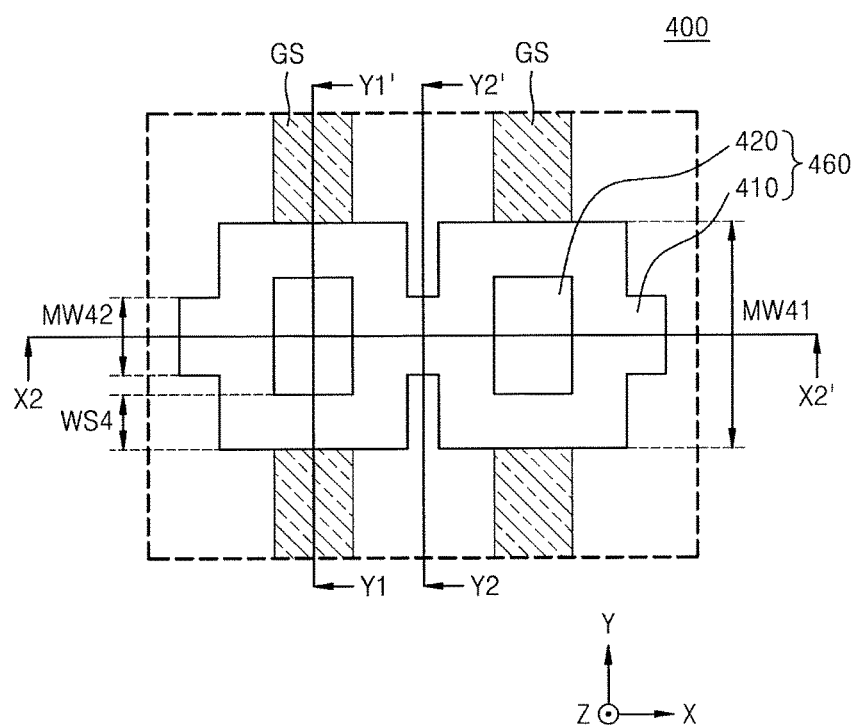
FIG. 27 illustrates a plan view of an IC device according to embodiments.
Figure 28A:
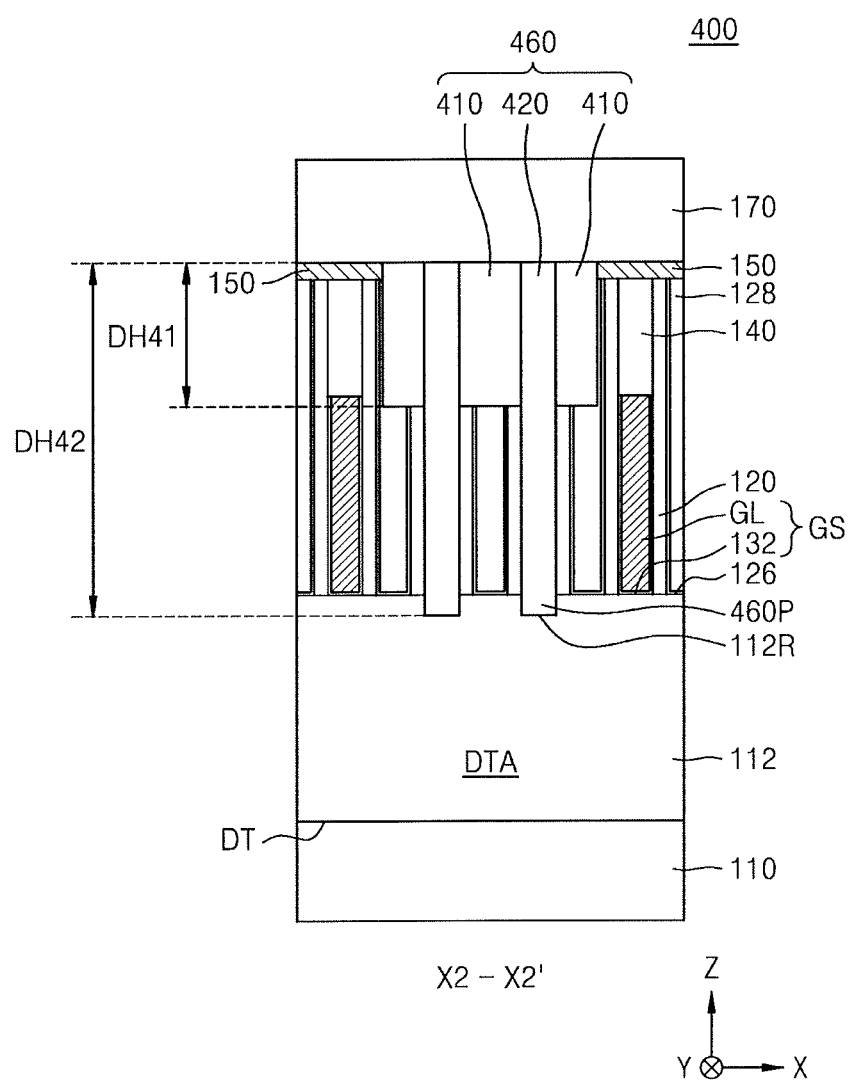
FIGS. 28A, 28B, and 28C illustrate cross-sectional views of main components of the IC device shown in FIG. 27.
Figure 28B:
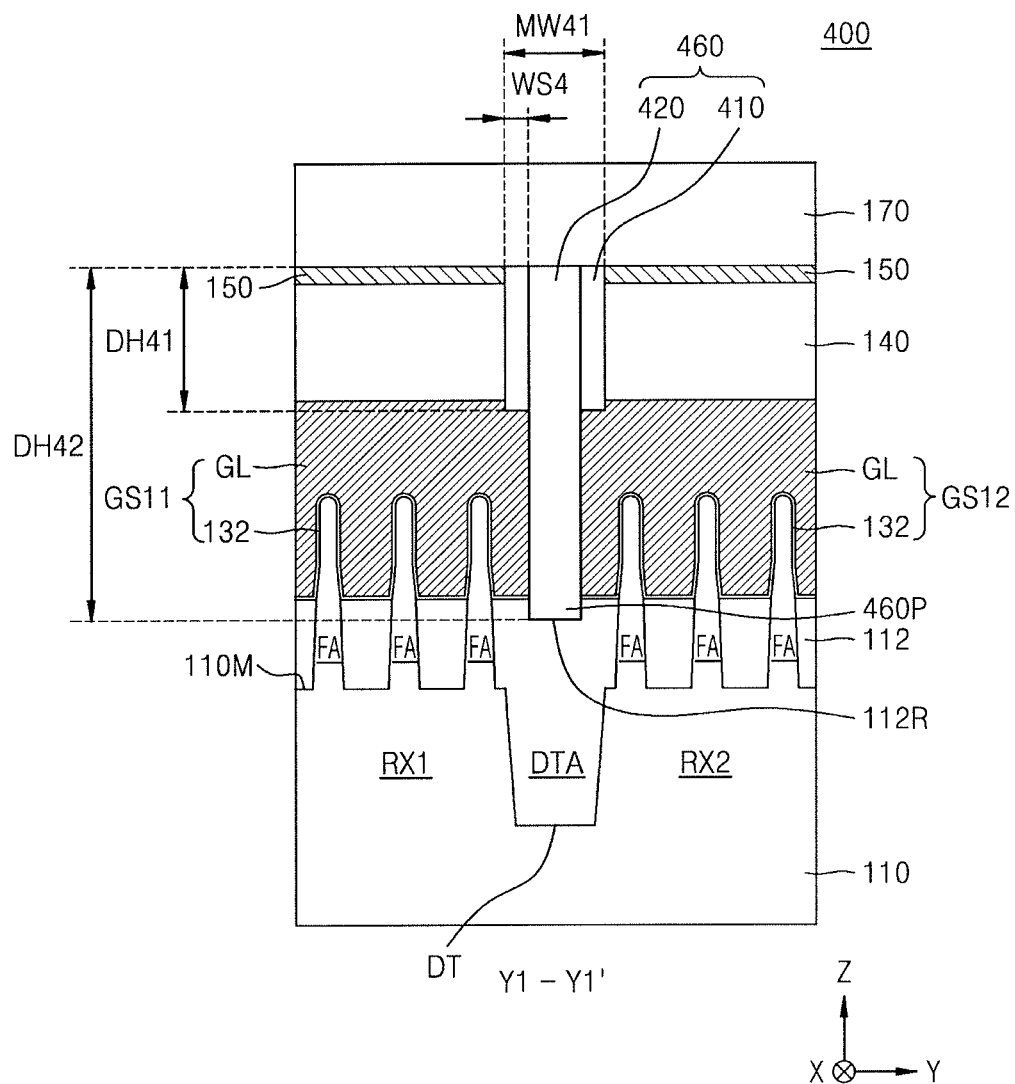
Figure 28C:
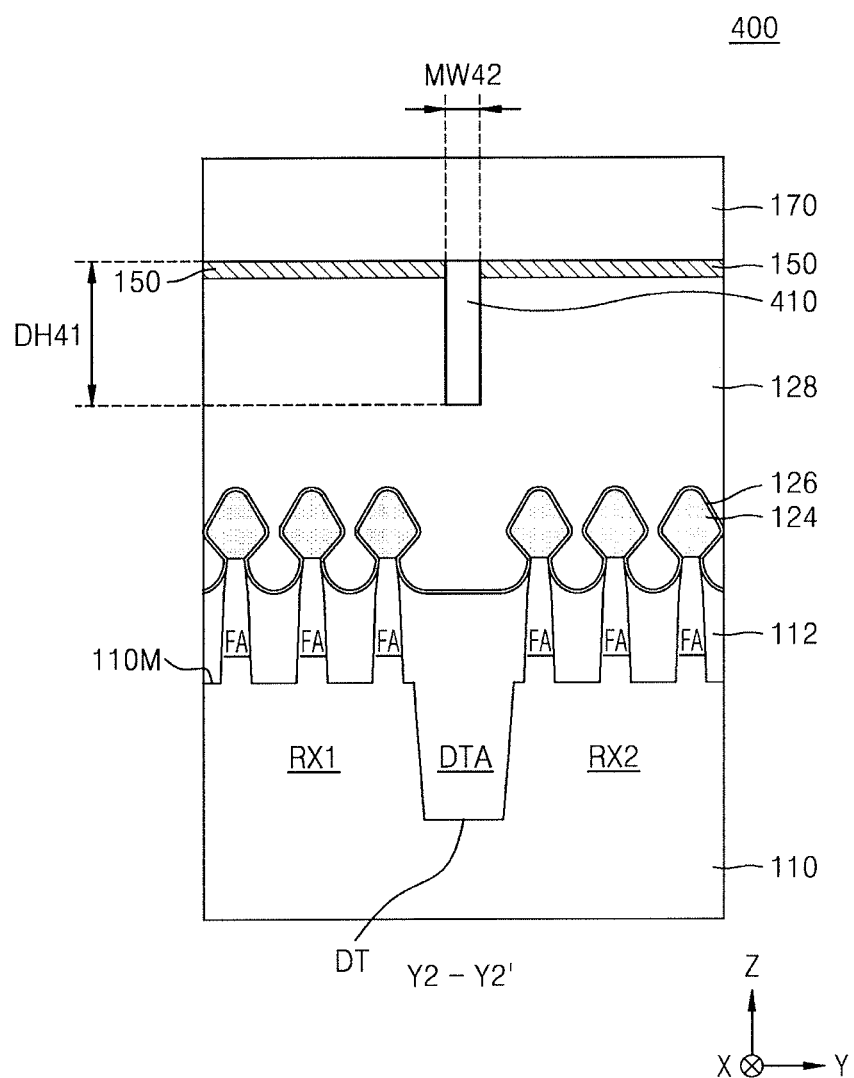

FIGS. 27, 28A, 28B, and 28C are diagrams of an IC device 400 according to some embodiments. FIG. 27 is an enlarged plan view of region "AX" in FIG. 1. FIG. 28A is a cross-sectional view along line X2-X2' of FIG. 27. FIG. 28B is a cross-sectional view along line Y1-Y1' of FIG. 27. FIG. 28C is a cross-sectional view along line Y2-Y2' of FIG. 27. In FIGS. 27, 28A, 28B, and 28C, same reference numerals are used to denote the same elements as in FIGS. 1 to 23C, and detailed descriptions thereof will be omitted.

Referring to FIGS. 27, 28A, 28B, and 28C, the IC device 400 may have substantially the same configuration as the IC device 300 shown in FIGS. 22 and 23A to 23C. However, the IC device 400 may include an isolation insulating pattern 460. A width of the isolation insulating pattern 460 in the Y direction may vary along the X direction. For example, a Y-direction minimum width MW42 of at least a portion of the isolation insulating pattern 460 formed in the inter-gate dielectric film 128 may be less than a Y-direction maximum width MW41 of the isolation insulating pattern 460 between the first gate structure GS11 and the second gate structure GS12, which extend in a straight line in the Y direction, from among a plurality of gate structures GS.

The isolation insulating pattern 460 may include isolation insulating spacers 410 and an inner isolation insulating film 420. The isolation insulating spacers 410 may include portions interposed between the inner isolation insulating film 420 and a gate insulating capping layer 140. The isolation insulating spacers 410 may cover sidewalls of the gate insulating capping layer 140 to a substantially constant width WS4. The Y direction minimum width MW42 of the isolation insulating pattern 460 may be less than twice the width WS4 of the isolation insulating spacers 410.

A portion of the isolation insulating pattern 460, which is between the first gate structure GS11 and the second gate structure GS12 that extend in the straight line, may include the isolation insulating spacers 410 and the inner isolation insulating film 420 having sidewalls surrounded by the isolation insulating spacers 410. The portion of the isolation insulating pattern 460, which is formed in the inter-gate dielectric film 128, may include only the isolation insulating spacers 410.

The isolation insulating spacers 410 may extend by a first depth DH41 from a top surface of the isolation insulating pattern 460 toward a substrate 110. A vertical level of bottom surfaces of the isolation insulating spacers 410 may be higher than a vertical level of uppermost surfaces of a plurality of source/drain regions 124.

The inner isolation insulating film 420 may extend by a second depth DH42 from the top surface of the isolation insulating pattern 460 toward the substrate 110 between the first gate structure GS11 and the second gate structure GS12, which extend in the straight line in the Y direction from among the plurality of gate structures GS. The second depth DH42 may be greater than the first depth DH41. Accordingly, the inner isolation insulating film 420 may be located closer to the substrate 110 than the isolation insulating spacers 410. The inner isolation insulating film 320 may include a protrusion 460P, which may protrude toward the substrate 110. A vertical level of a bottom surface of the protrusion 460P may be lower than a vertical level of a top surface of the device isolation film 112. The device isolation film 112 may have an isolation recess 112R that surrounds the protrusion 460P.

Specific configurations of materials included in the isolation insulating spacers 410 and the inner isolation insulating film 420 will be understood with reference to the isolation insulating spacers 310 and the inner isolation insulating film 320 shown in FIGS. 22, 23A, 23B, and 23C.

Figure 29A:
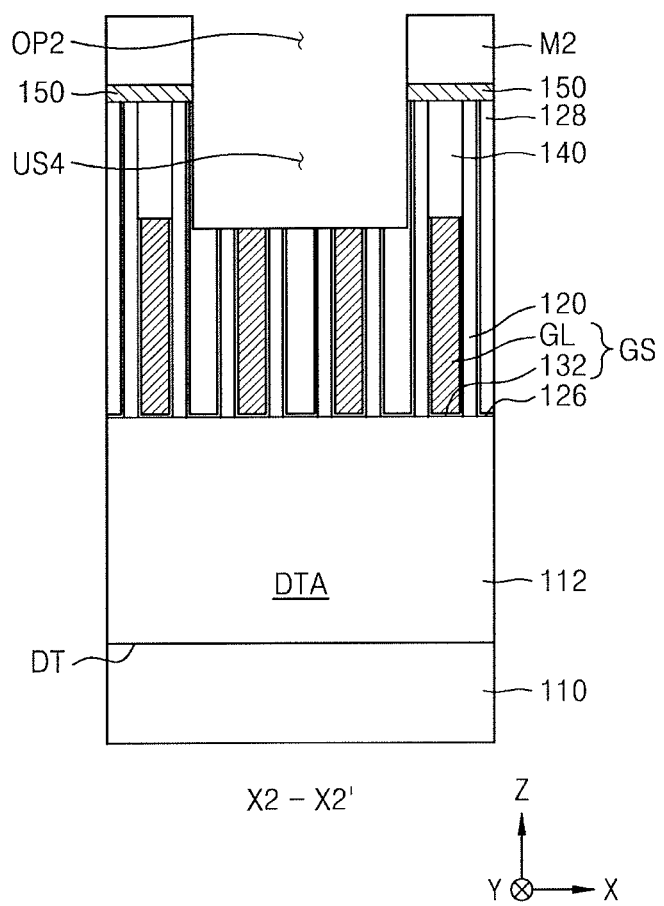
Figure 29B:
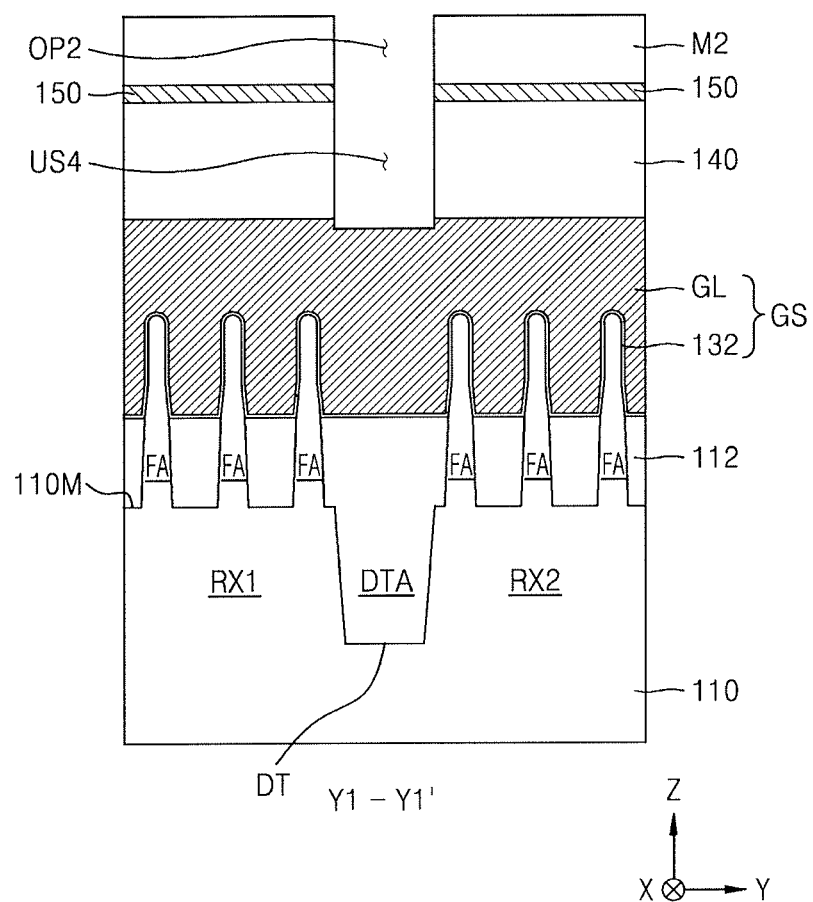
Figure 29C:
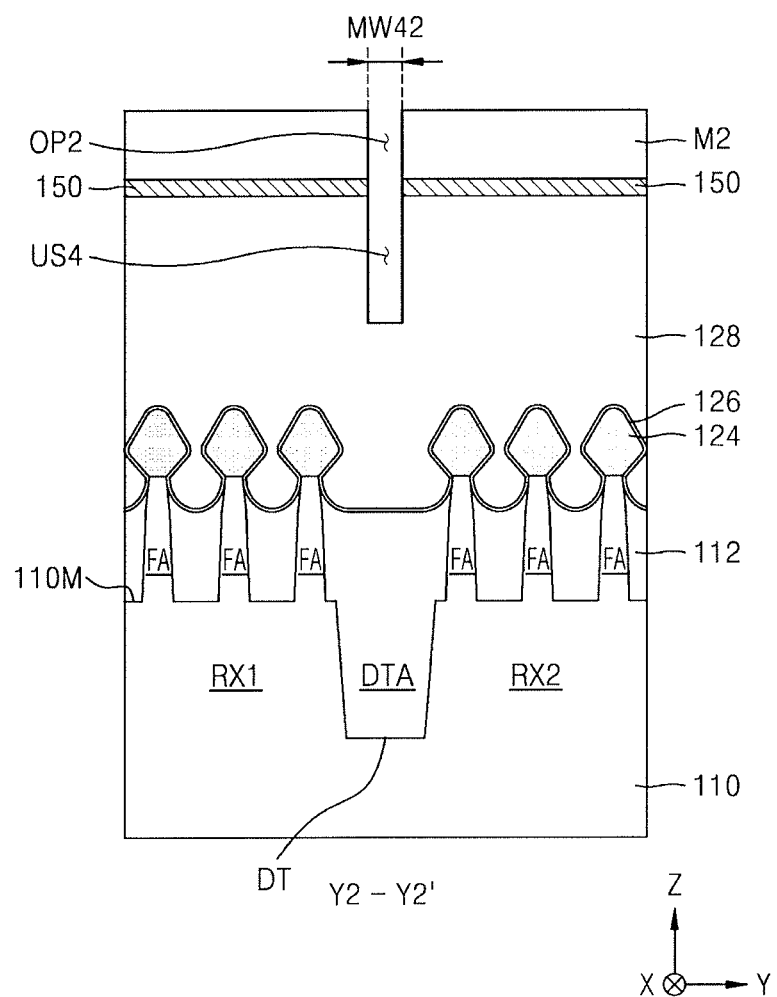
Figure 30A:
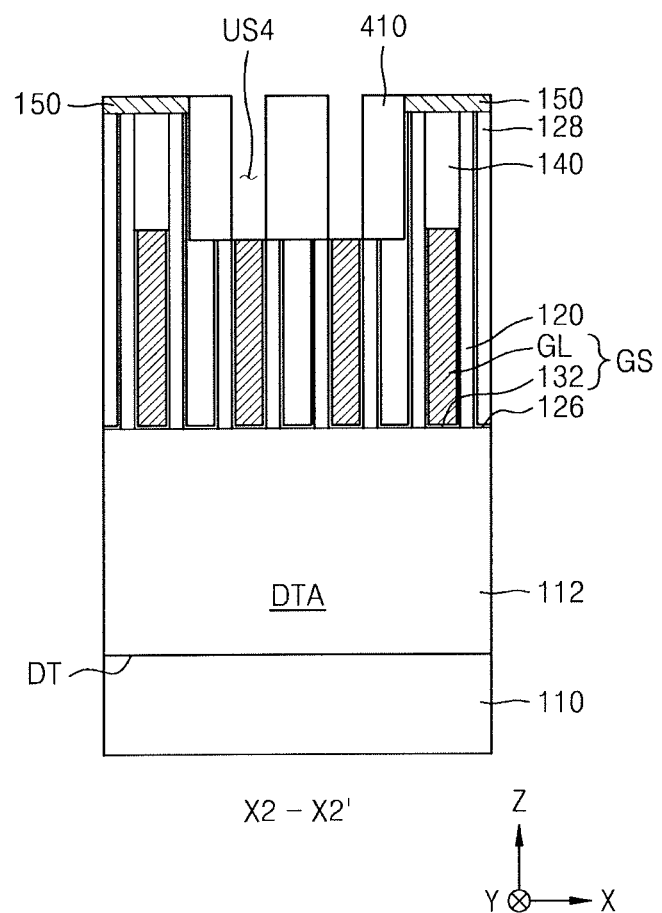
Figure 30B:
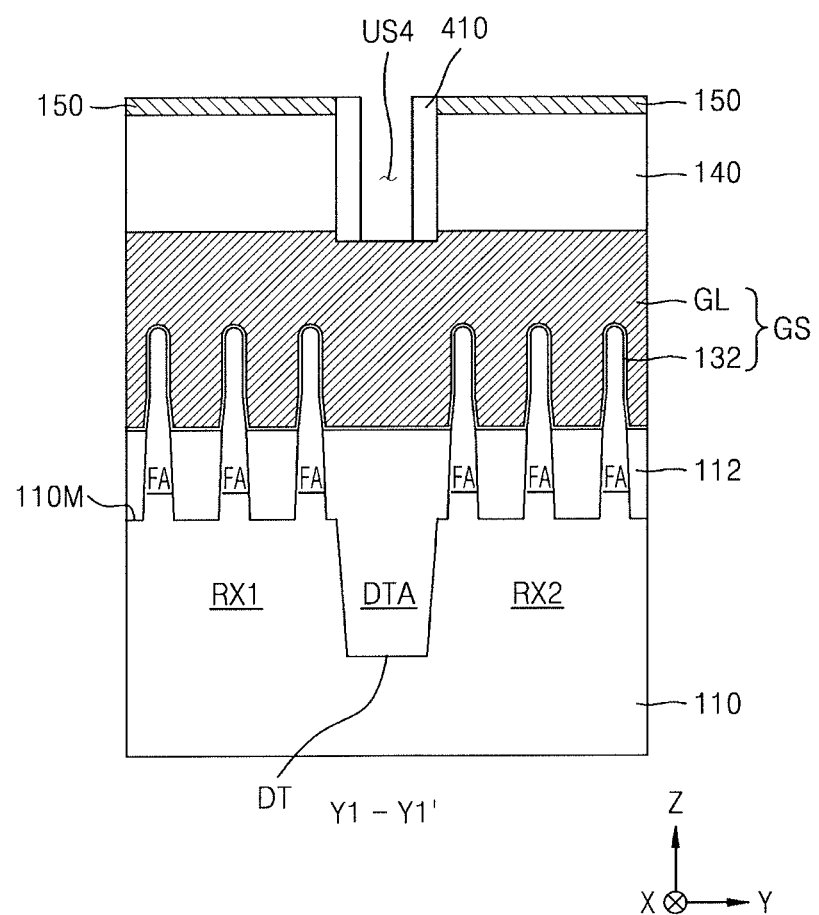
Figure 30C:
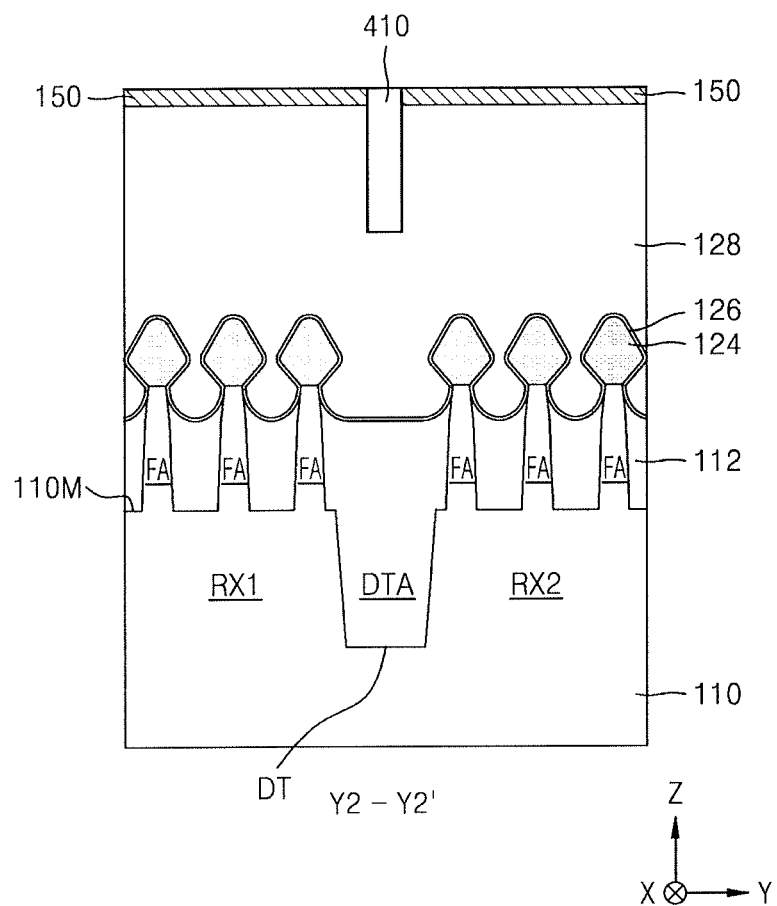
Figure 31A:
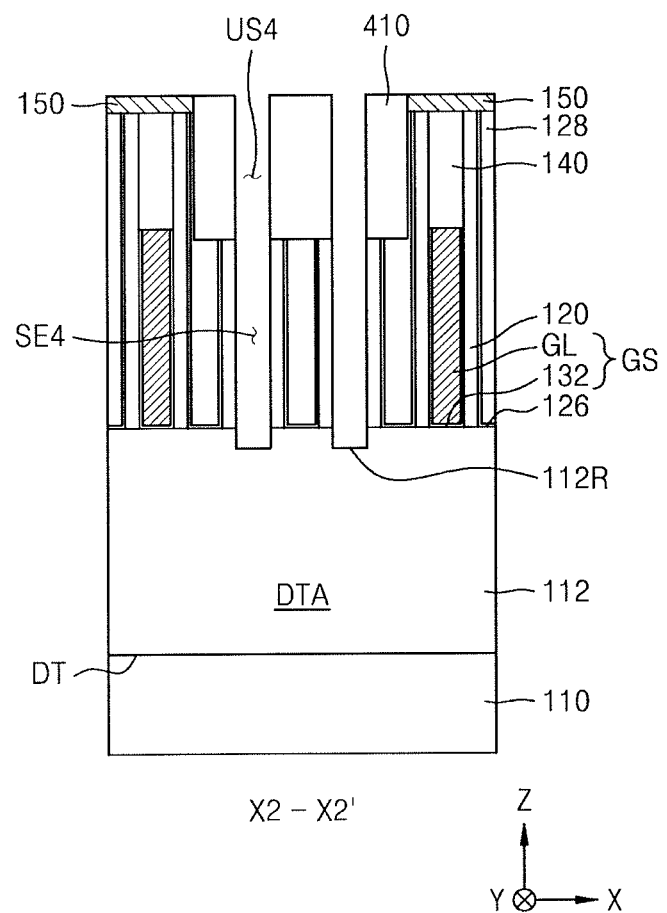
Figure 31B:
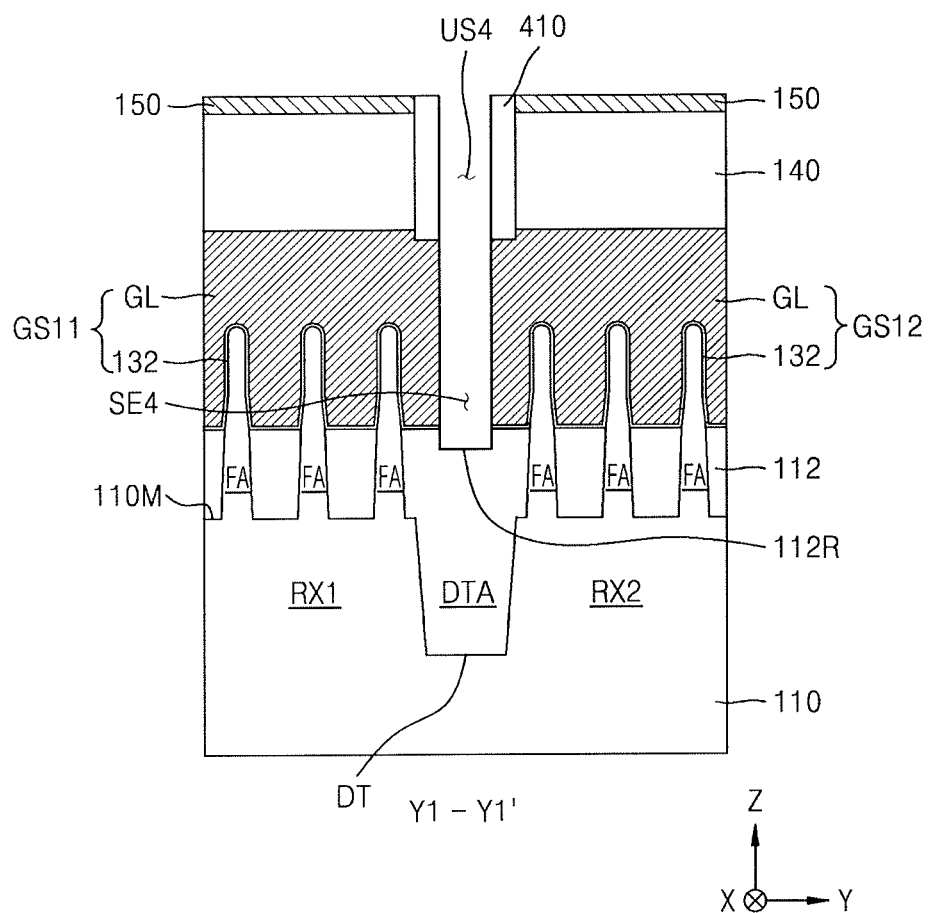
Figure 31C:
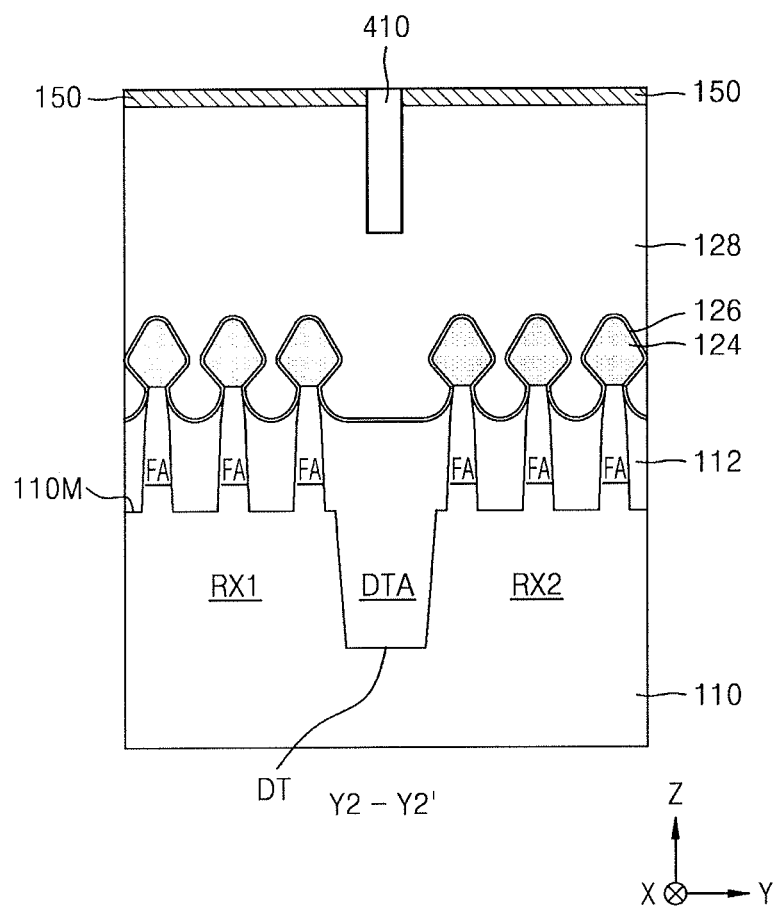

FIGS. 29A to 31A, 29B to 31B, and 29C to 31C are cross-sectional views of stages in a method of manufacturing an IC device, according to some embodiments. FIGS. 29A, 30A, and 31A each show a sectional configuration along line X2-X2' of FIG. 27. FIGS. 29B, 30B, and 31B each show a sectional configuration along line Y1-Y1' of FIG. 27. FIGS. 29C, 30C, and 31C each show a sectional configuration along line Y2-Y2' of FIG. 27. A method of manufacturing the IC device 400 shown in FIGS. 27, 28A, 28B, and 28C will be described with reference to FIGS. 29A to 31C. In FIGS. 29A to 31C, same reference numerals are used to denote the same elements as in FIGS. 1 to 28C, and detailed descriptions thereof will be omitted.

Referring to FIGS. 29A, 29B, and 29C, the insulating thin film 150, the gate insulating capping layer 140, and the inter-gate dielectric film 128 may be etched using a method similar to that described with reference to FIGS. 24A, 24B, and 24C. However, in the present example embodiment, a mask pattern M2 having a different planar shape from the mask pattern M1 may be used.

The mask pattern M2 may have an opening OP2. A planar shape of the opening OP2 may correspond to a planar shape of the isolation insulating pattern 460 shown in FIG. 27. The mask pattern M2 may include a single layer or a multilayered structure including a plurality of hard mask layers that are stacked. In some embodiments, the mask pattern M2 may include a silicon nitride film. In some embodiments, the mask pattern M2 may include a combination of a silicon nitride film and a silicon oxide film. While the gate insulating capping layer 140 is being removed using the mask pattern M2 as an etch mask, portions of insulating spacers 120, which cover sidewalls of the gate insulating capping layer 140, may also be removed. An upper portion of a gate structure GS may be etched due to an over etching process. As a result, an upper space US4 may be formed in an upper portion of the gate structure GS and inside the inter-gate dielectric film 128.

Referring to FIGS. 30A, 30B, and 30C, a spacer insulating film may be formed to cover exposed surfaces of the resultant structure including the upper space US4. The spacer insulating film may be then etched back so that isolation insulating spacers 410 may be formed on inner sidewalls of the upper space US4. In some embodiments, the spacer insulating film may include a silicon nitride film.

After the isolation insulating spacers 410 are formed, as shown in FIG. 30C, a portion of the upper space US4, which has a minimum width in a Y direction, for example, a partial space of the upper space US4, which is formed in the inter-gate dielectric film 128, may be completely filled with the isolation insulating spacers 410. Although not shown in FIGS. 30A, 30B, and 30C, after the isolation insulating spacers 410 are formed, at least a portion of the mask pattern M2 may remain on the insulating thin film 150.

Referring to FIGS. 31A, 31B, and 31C, by using a method similar to the method described with reference to FIGS. 26A, 26B, and 26C, the gate structure GS exposed through the upper space US4 defined by the isolation insulating spacers 410 may be etched so that the exposed gate structure GS may be self-aligned by the isolation insulating spacers 410. Thus, a separation space SE4 including the plurality of isolation recesses 112R may be formed on the substrate 110.

Thereafter, by using the same method as the method of forming the isolation insulating pattern 160 in FIGS. 15A-16C, an inner isolation insulating film 420 may be formed in the separation space SE4 to form the isolation insulating pattern 460, and the interlayer insulating film 170 may be formed to cover the insulating thin film 150 and the isolation insulating pattern 460. Thus, the IC device 400 in FIGS. 27-28C may be formed.

Figure 32:
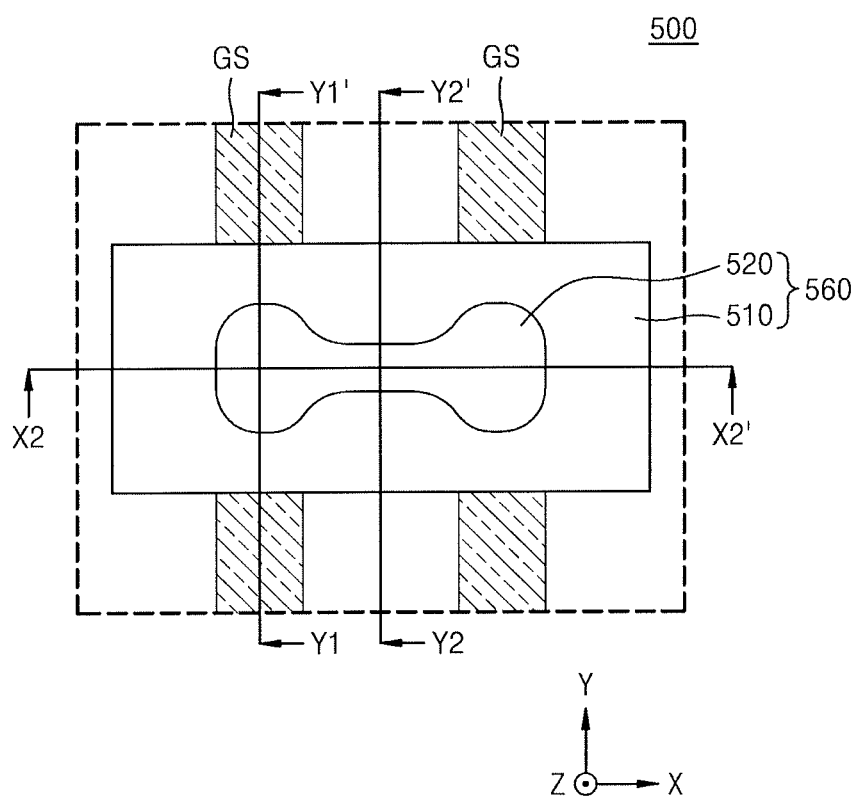
FIG. 32 illustrates a plan view of an IC device according to embodiments.
Figure 33A:
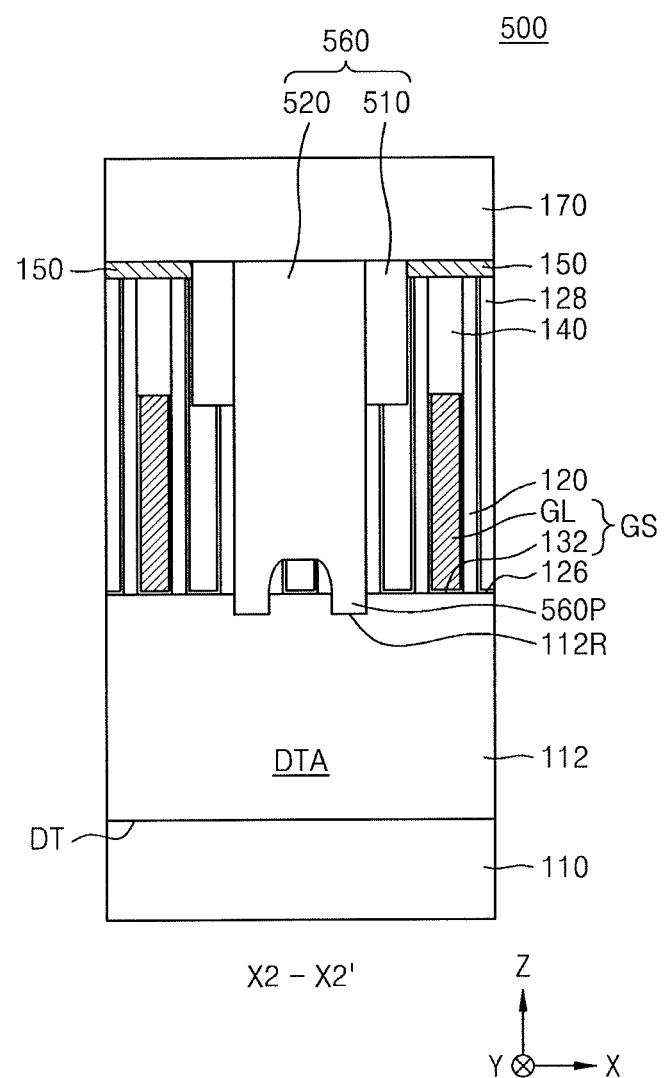
FIGS. 33A, 33B, and 33C illustrate cross-sectional views of main components of the IC device shown in FIG. 32.
Figure 33B:
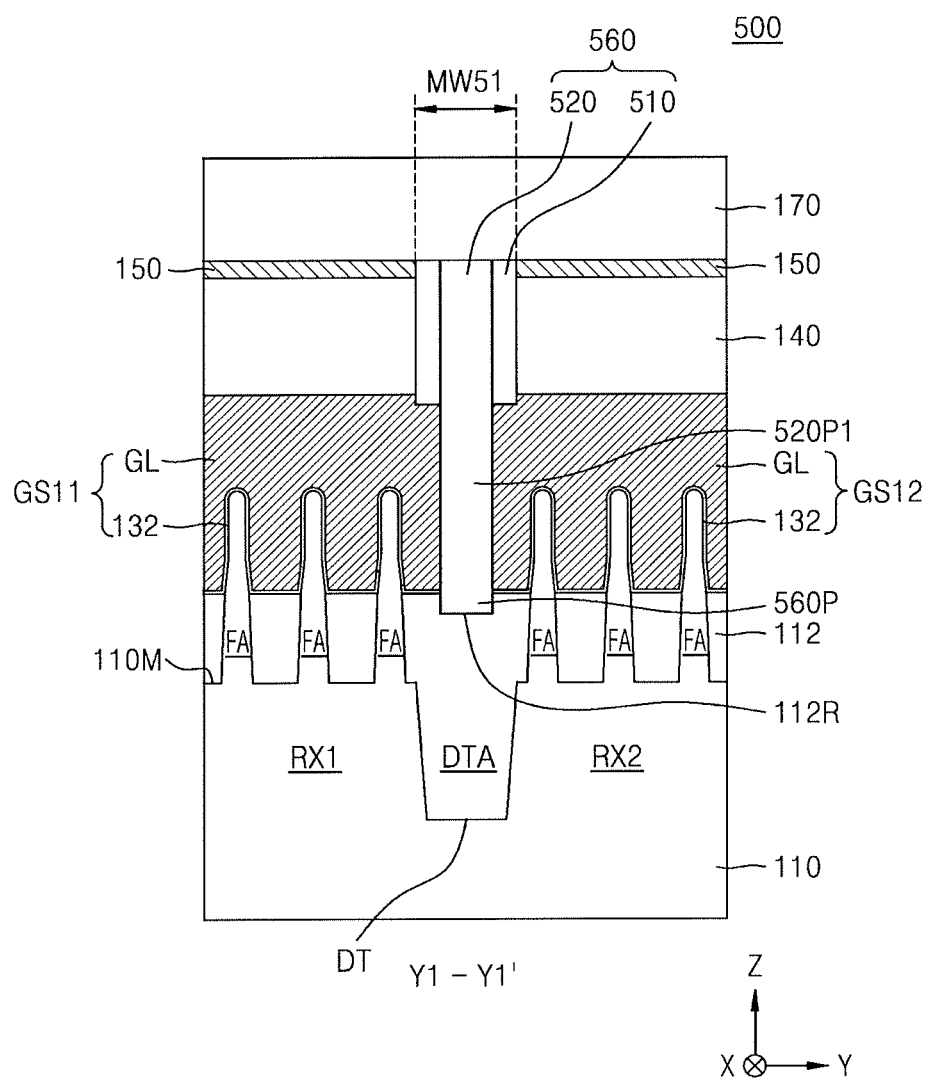
Figure 33C:
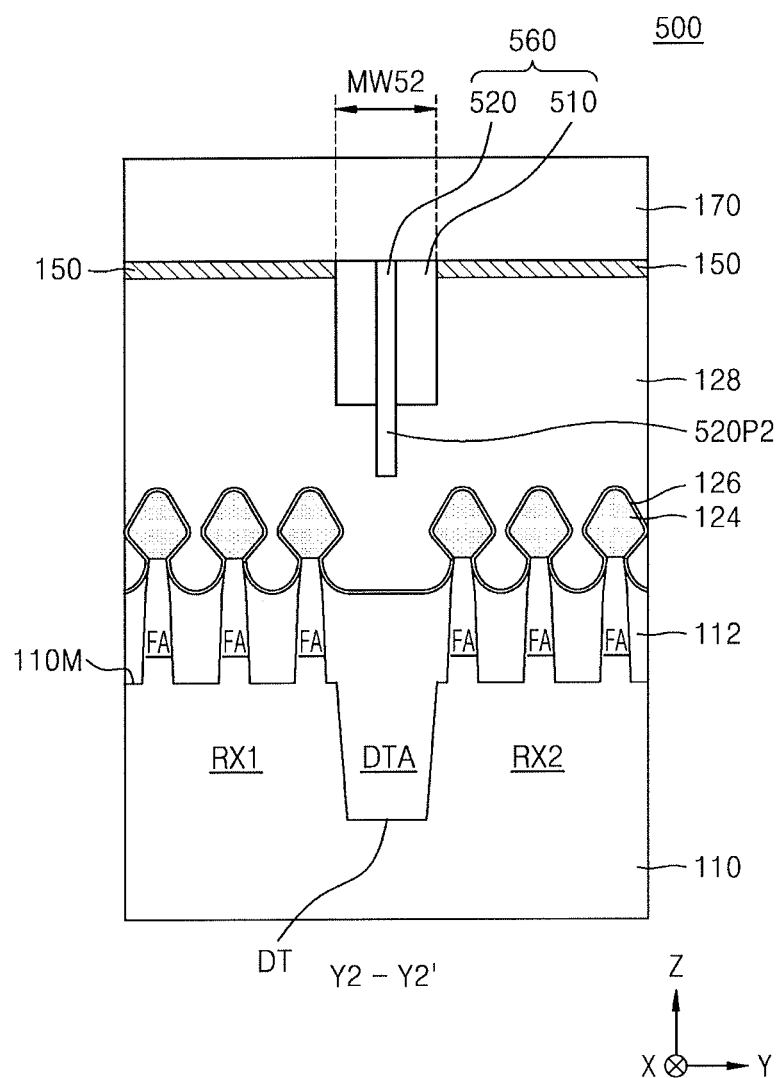

FIGS. 32, 33A, 33B, and 33C are diagrams of an IC device 500 according to some embodiments. FIG. 32 is an enlarged plan view of region "AX" in FIG. 1. FIG. 33A is a cross-sectional view along line X2-X2' of FIG. 32. FIG. 33B is a cross-sectional view along line Y1-Y1' of FIG. 32. FIG. 33C is a cross-sectional view along line Y2-Y2' of FIGS. 1 and 32. In FIGS. 32 and 33A-33C, same reference numerals are used to denote the same elements as with reference to FIGS. 1-31C, and detailed descriptions thereof will be omitted.

Referring to FIGS. 32, 33A, 33B, and 33C, the IC device 500 may have substantially the same configuration as the IC device 300 shown in FIGS. 22 and 23A-23C. However, the IC device 500 may include an isolation insulating pattern 560. The isolation insulating pattern 560 may include isolation insulating spacers 510 and an inner isolation insulating film 520.

The isolation insulating spacers 510 may include portions interposed between the inner isolation insulating film 520 and the gate insulating capping layer 140. A width of the isolation insulating spacers 510 in a lateral direction may vary according to position. For example, a lateral width of portions of the isolation insulating spacers 510, which cover sidewalls of the inter-gate dielectric film 128, may be greater than a lateral width of portions of the isolation insulating spacers 510, which cover the gate insulating capping layer 140 on the plurality of gate structures GS. To form the above-described structure, when a spacer insulating film for forming the isolation insulating spacers 510 is formed, deposition conditions may be controlled such that a growth rate of the spacer insulating film is higher on a silicon oxide film included in the inter-gate dielectric film 128 than on a silicon nitride film included in the gate insulating capping layer 140. A vertical level of lowermost surfaces of the isolation insulating spacers 510 may be higher than a vertical level of uppermost surfaces of a plurality of source/drain regions 124.

The inner isolation insulating film 520 may have sidewalls surrounded by the isolation insulating spacers 510. The inner isolation insulating film 520 may extend from a top surface of the isolation insulating pattern 560 toward the substrate 110 by a greater depth than that of the isolation insulating spacers 510. The inner isolation insulating film 520 may include a first portion 520P1 and a second portion 520P2. The first portion 520P1 may have opposite sidewalls facing a pair of gate structures GS that extend in a straight line. The second portion 520P2 may have opposite sidewalls facing the inter-gate dielectric film 128. The inner isolation insulating film 520 may include a protrusion 560P that protrudes toward the substrate 110. A vertical level of a bottom surface of the protrusion 560P may be lower than a vertical level of a top surface of a device isolation film 112. The device isolation film 112 may have an isolation recess 112R that surrounds the protrusion 560P.

A vertical level of a lowermost surface of the second portion 520P2 of the inner isolation insulating film 520 may be higher than the vertical level of the top surface of the device isolation film 112 and higher than the vertical level of the uppermost surfaces of the plurality of source/drain regions 124.

In a Y direction, a maximum width MW51 of the isolation insulating pattern 560 on the first portion 520P1 of the inner isolation insulating film 520 may be substantially equal to a maximum width MW52 of the isolation insulating pattern 560 on the second portion 520P2 of the inner isolation insulating film 520. In the Y direction, a width of each of the first portion 520P1 and the second portion 520P2 of the inner isolation insulating film 520 may be less than each of the maximum widths MW51 and MW52 of the isolation insulating pattern 560.

Specific configurations of materials included in the isolation insulating spacers 510 and the inner isolation insulating film 520 may be understood with reference to the isolation insulating spacers 310 and the inner isolation insulating film 320 shown in FIGS. 22-23C.

To manufacture the IC device 500 shown in FIGS. 32, 33A, 33B, and 33C, it is possible to use the method of manufacturing the IC device 300 described with reference to FIGS. 24A to 26C or a method thereof modified within the scope of the embodiments.

Figure 34A:
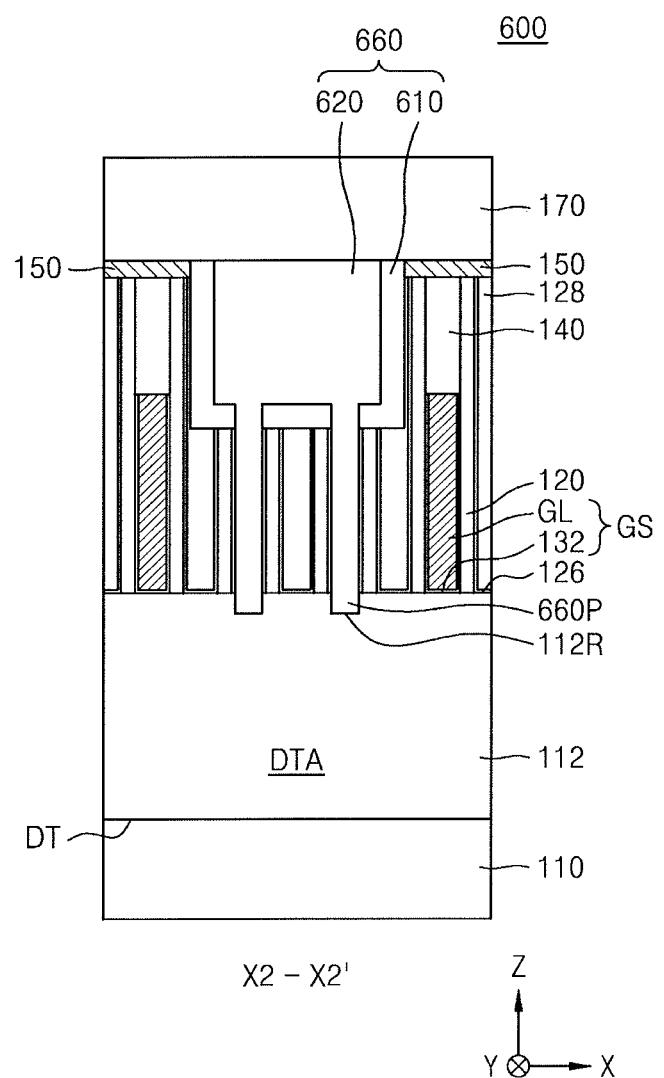
FIGS. 34A, 34B, and 34C illustrate cross-sectional views of an IC device according to embodiments.
Figure 34B:
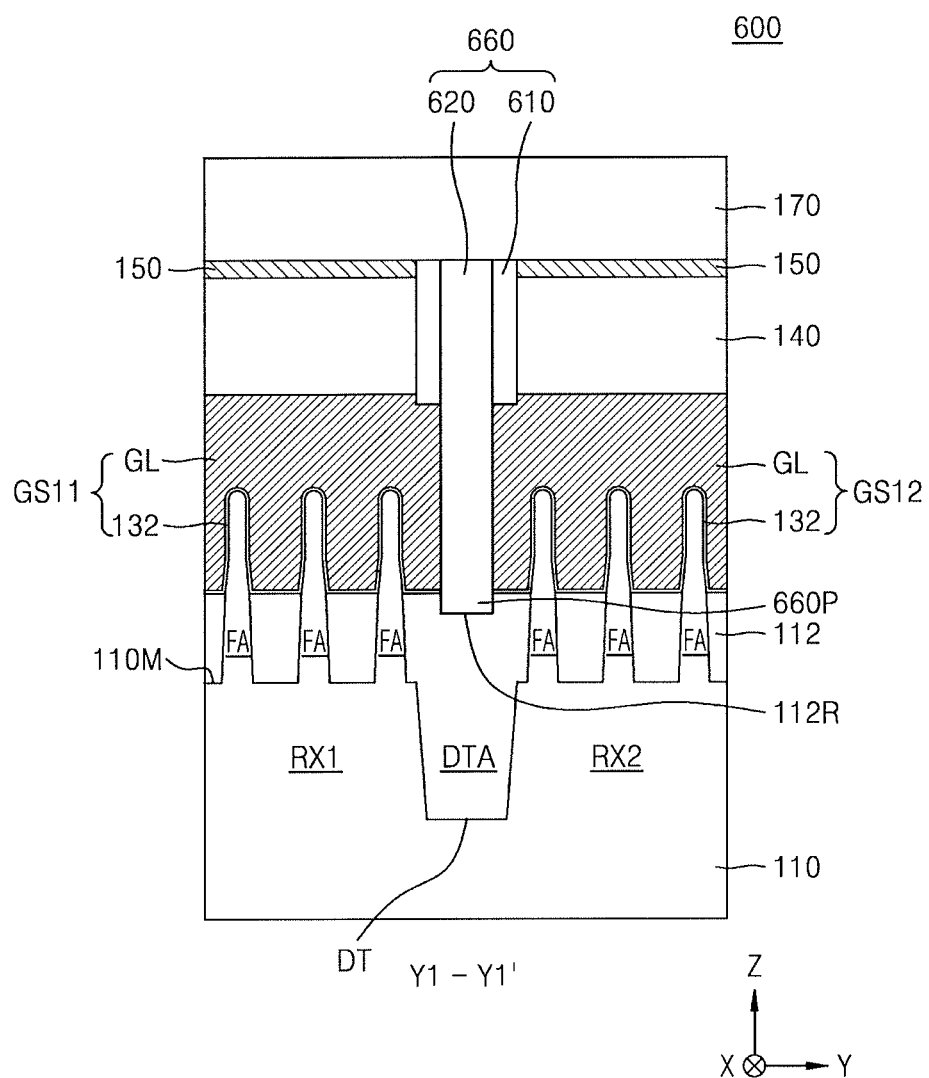
Figure 34C:
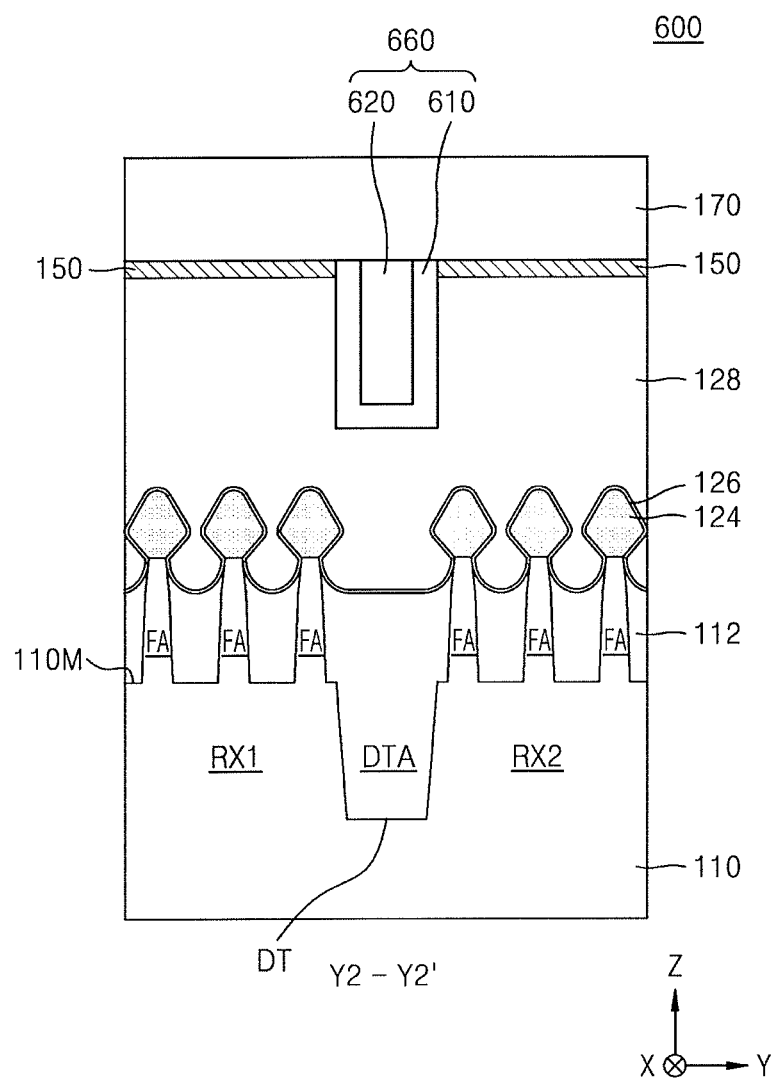

FIGS. 34A-34C are cross-sectional views of an IC device 600 according to some embodiments. FIG. 34A is a cross-sectional view along line X2-X2' of FIG. 1. FIG. 34B is a cross-sectional view along line Y1-Y1' of FIG. 1. FIG. 34C is a cross-sectional view along line Y2-Y2' of FIG. 1. In FIGS. 34A-34C, same reference numerals are used to denote the same elements as in FIGS. 1-33C, and detailed descriptions thereof will be omitted.

Referring to FIGS. 34A, 34B, and 34C, the IC device 600 may have substantially the same configuration as the IC device 300 shown in FIGS. 22 and 23A to 23C. However, the IC device 600 may include an isolation insulating pattern 660. A width of the isolation insulating pattern 660 in a Y direction may be constant in an X direction.

The isolation insulating pattern 660 may include isolation insulating spacers 610 and an inner isolation insulating film 620. The isolation insulating spacers 610 may include portions covering sidewalls of the inner isolation insulating film 620 between the inner isolation insulating film 620 and the gate insulating capping layer 140, and portions covering a bottom surface of the inner isolation insulating film 620. In some embodiments, the isolation insulating spacers 610 may cover the bottom surface and the sidewalls of the inner isolation insulating film 620 to a substantially constant thickness.

The inner isolation insulating film 620 may be surrounded by the isolation insulating spacers 610 in a portion of the isolation insulating pattern 660, which is between a first gate structure GS11 and a second gate structure GS12 that extend in a straight line. The inner isolation insulating film 620 may extend to a position closer to the substrate 110 than the isolation insulating spacers 610. The inner isolation insulating film 620 may include a protrusion 660P that protrudes toward the substrate 110. A vertical level of a bottom surface of the protrusion 660P may be lower than a vertical level of a top surface of a device isolation film 112. The device isolation film 112 may have an isolation recess 112R that surrounds the protrusion 660P.

A bottom surface and sidewalls of the inner isolation insulating film 620 may be surrounded by the isolation insulating spacers 610 in a portion of the isolation insulating pattern 660, formed in the inter-gate dielectric film 128, and the isolation insulating spacers 610 may be closer to the substrate 110 than the inner isolation insulating film 620. In the portion of the isolation insulating pattern 660, formed in the inter-gate dielectric film 128, a vertical level of lowermost surfaces of the isolation insulating spacers 610 may be higher than a vertical level of uppermost surfaces of the plurality of source/drain regions 124.

Specific configurations of materials included in the isolation insulating spacers 610 and the inner isolation insulating film 620 may be understood with reference to the isolation insulating spacers 310 and the inner isolation insulating film 320 shown in FIGS. 22-23C.

Figure 35A:
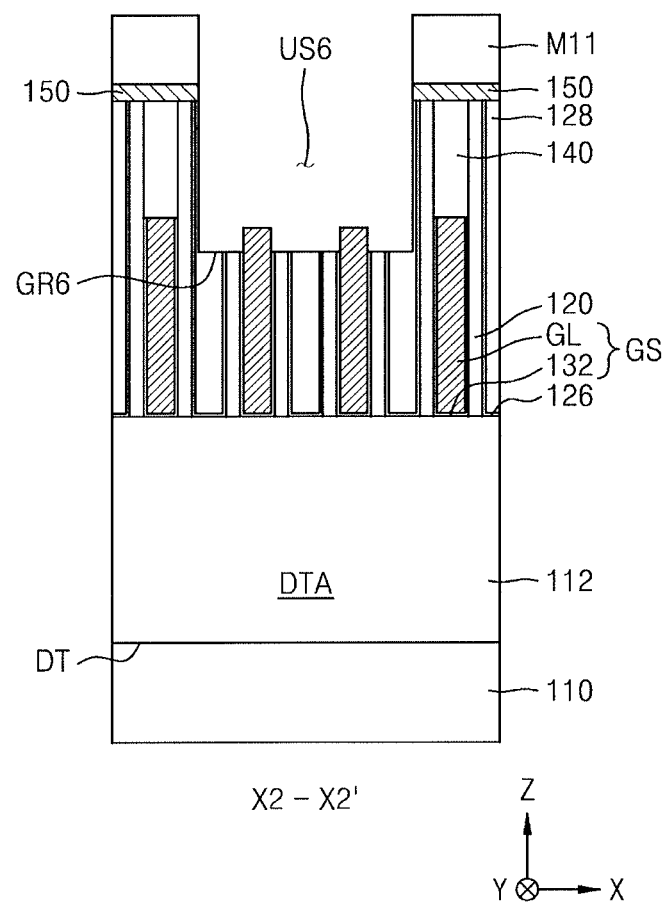
Figure 35B:
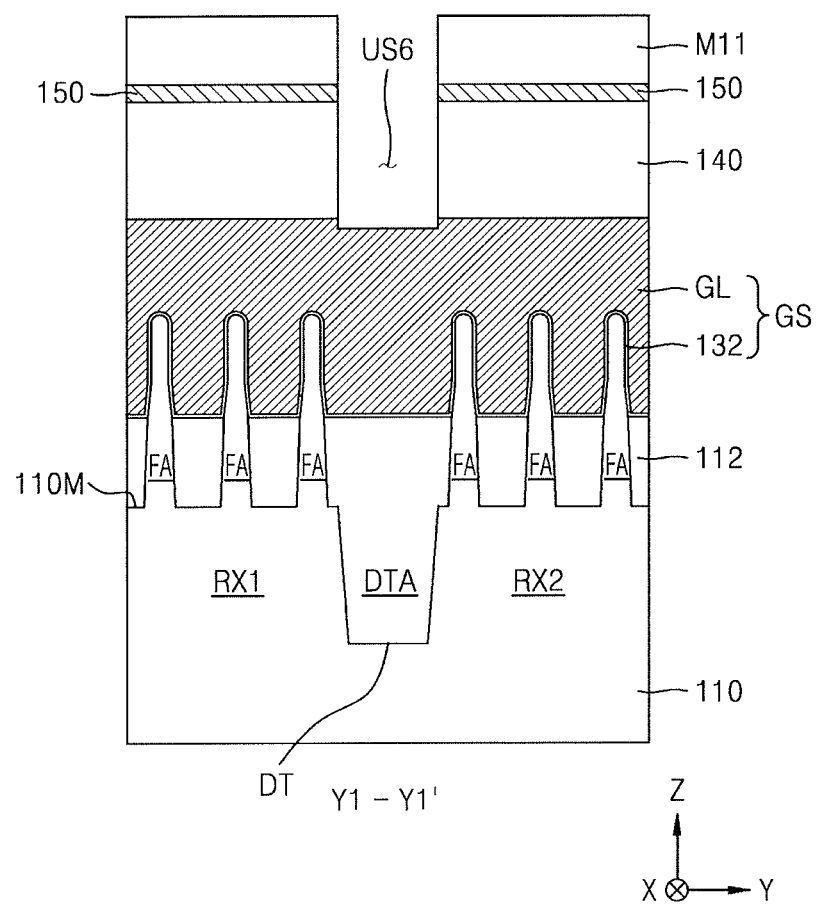
Figure 35C:
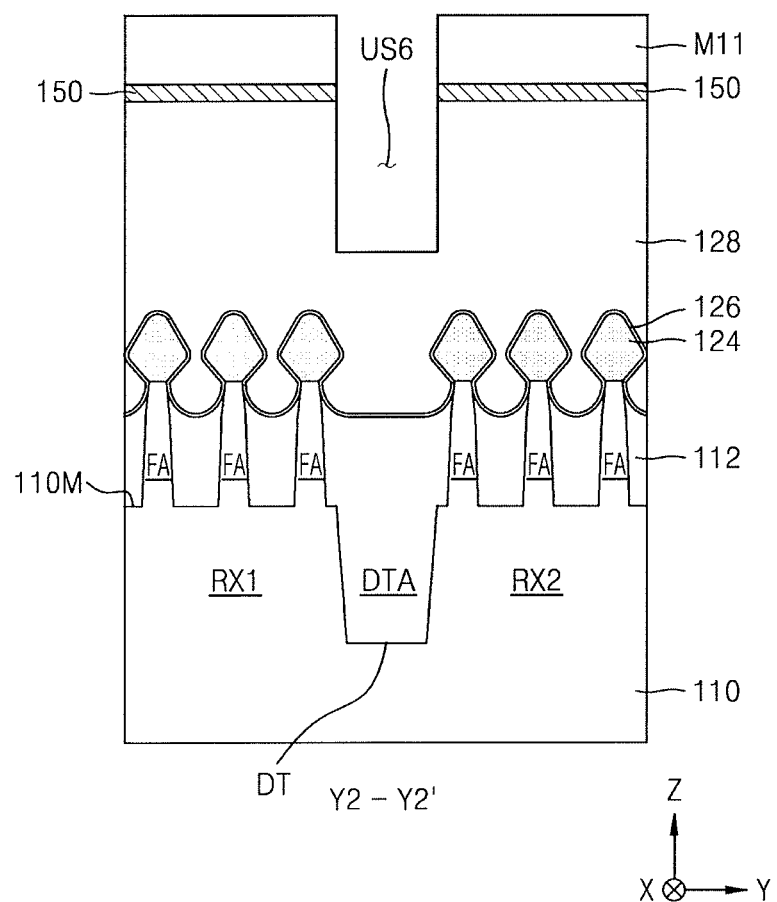
Figure 36A:
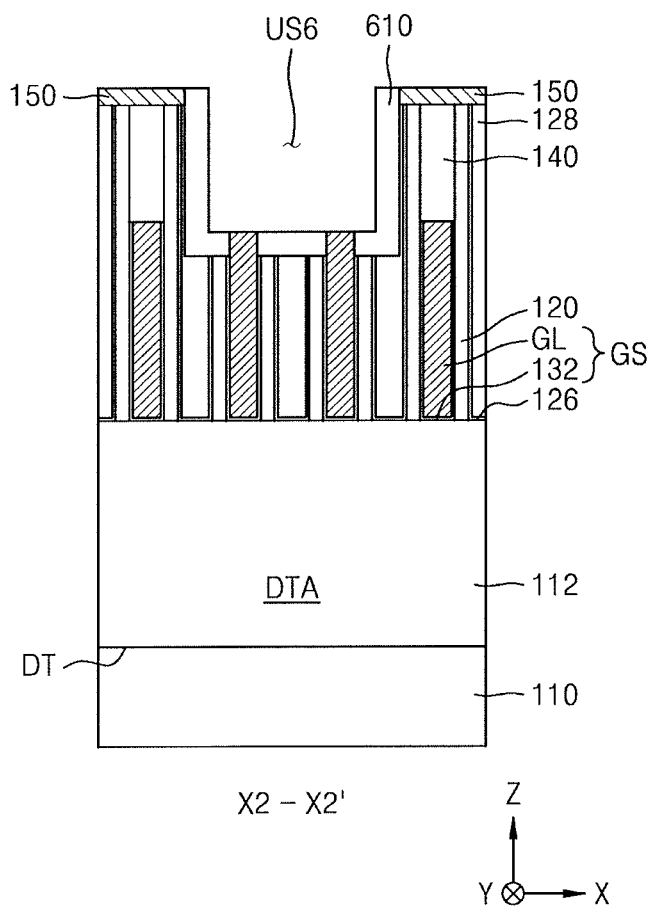
Figure 36B:
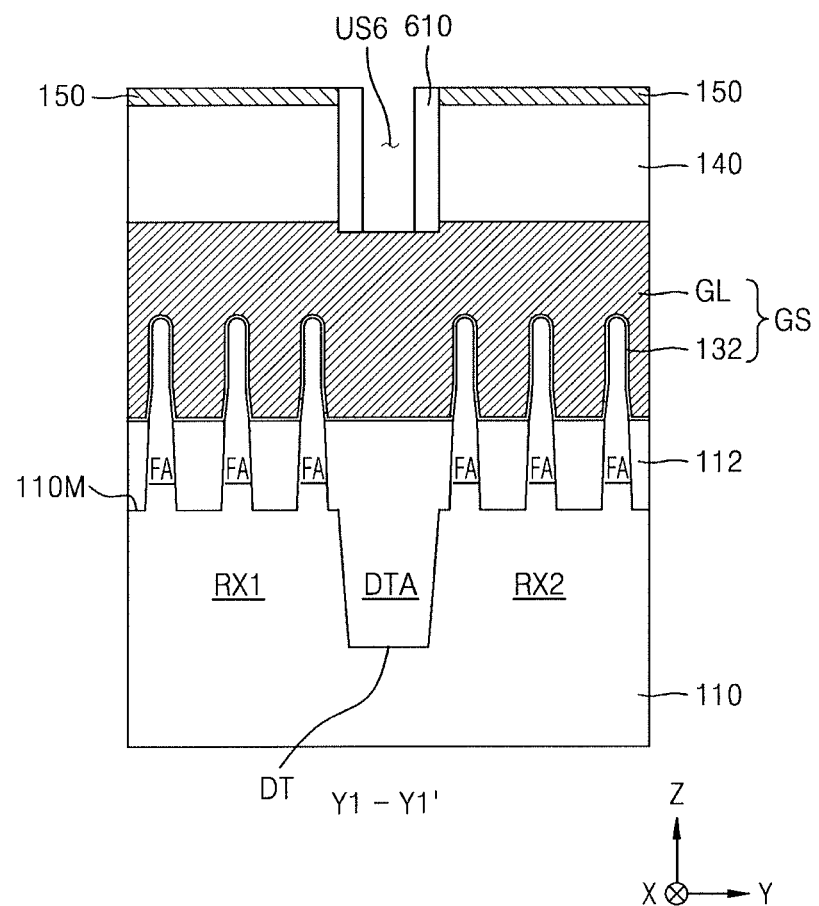
Figure 36C:
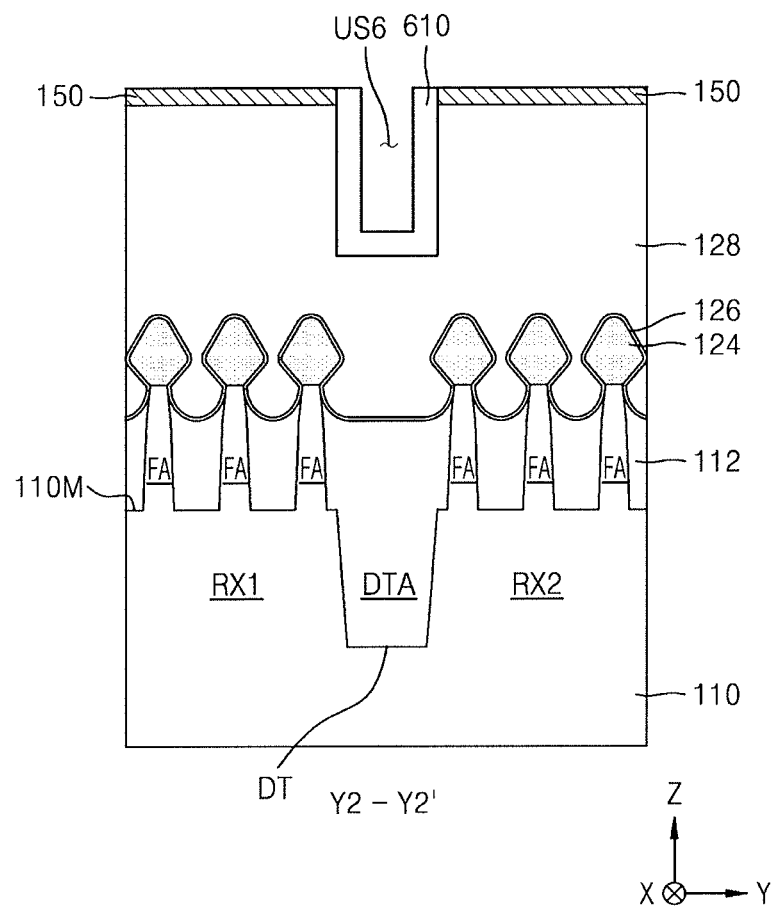
Figure 37A:
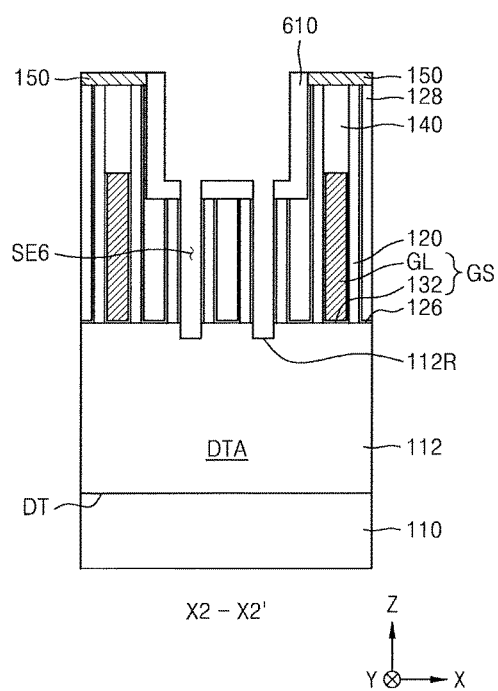
Figure 37B:
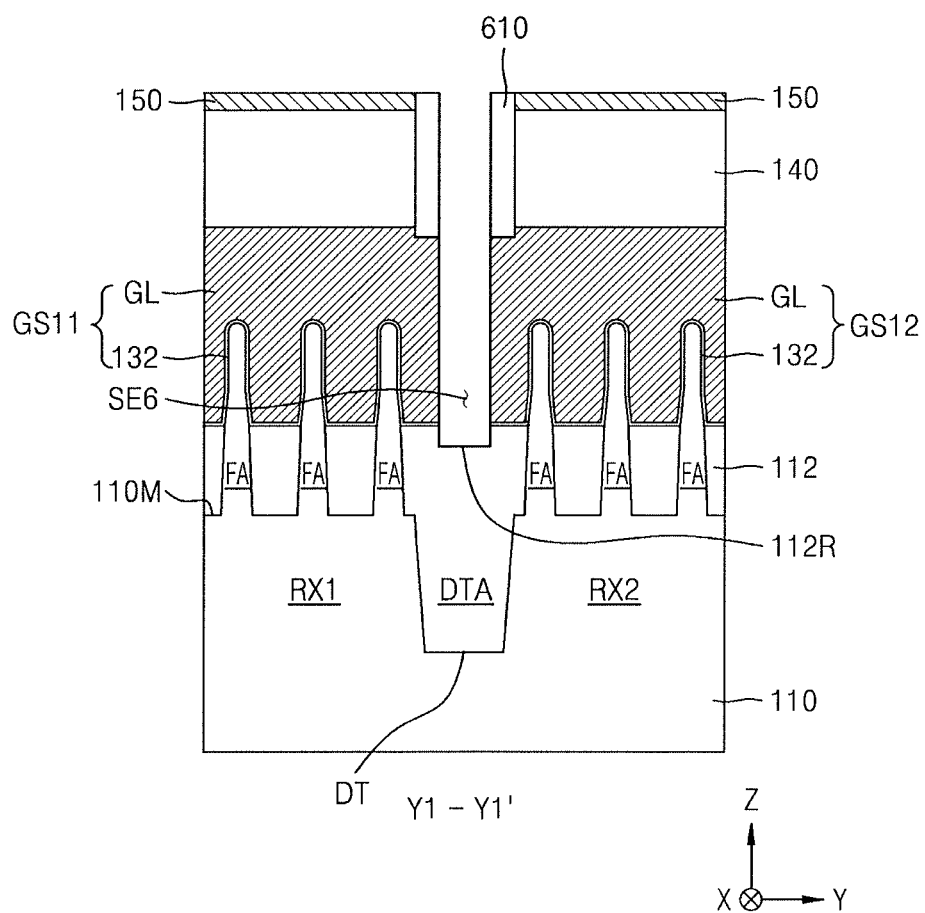
Figure 37C:
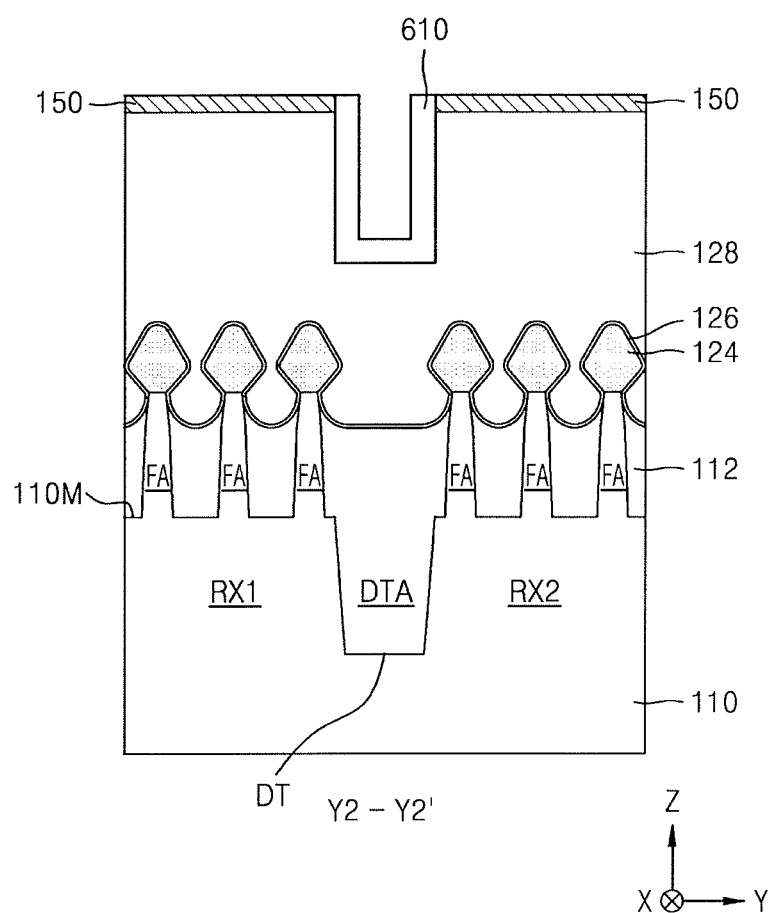

FIGS. 35A to 37A, 35B to 37B, and 35C to 37C are cross-sectional views of stages in a method of manufacturing an IC device, according to some embodiments. FIGS. 35A, 36A, and 37A each show a sectional configuration along line X2-X2' of FIG. 1. FIGS. 35B, 36B, and 37B each show a sectional configuration along line Y1-Y1' of FIG. 1. FIGS. 35C, 36C, and 37C each show a sectional configuration along line Y2-Y2' of FIG. 1. A method of manufacturing the IC device 600 shown in FIGS. 34A to 34C will be described with reference to FIGS. 35A-37C. In FIGS. 35A-37C, same reference numerals are used to denote same elements as in FIGS. 1-34C, and detailed descriptions thereof will be omitted.

Referring to FIGS. 35A, 35B, and 35C, the gate insulating capping layer 140 may be etched using the method described with reference to FIGS. 24A-24C, so that the gate structure GS may be exposed through the opening OP1. Thereafter, at least portions of insulating films located in the vicinity of a gate line GL, for example, the gate dielectric film 132, the insulating spacers 120, the insulating liner 126, and the inter-gate dielectric film 128, may be selectively further etched using an anisotropic etching process by as much as a partial thickness under conditions in which the etching of the gate line GL is suppressed. Thus, a groove GR6 may be formed in the vicinity of the gate line GL. In some embodiments, the groove GR6 may be formed using etching conditions in which etch rates of the insulating films located in the vicinity of the gate line GL are higher than etch rates of a metal film and a metal-containing film included in the gate line GL. As a result, an upper space US6 including the groove GR6 may be obtained.

Referring to FIGS. 36A-36C, by using a method similar to that described with reference to FIGS. 25A-25C, a spacer insulating film may be formed to conformally cover exposed surfaces of the resultant structure including the upper space US6 to a substantially uniform thickness. Thereafter, the spacer insulating film may be etched back so that isolation insulating spacers 610 may be formed on inner sidewalls of the upper space US6 and inside the groove GR6. In some embodiments, the spacer insulating film may include a silicon nitride film. In some embodiments, when the groove GR6 has a fine width of several nm in an X direction, a portion of the spacer insulating film, which fills the groove GR6, may not be removed but remain filling the groove GR6 even after the spacer insulating film is etched back. Although not shown, after the isolation insulating spacers 610 are formed, at least a portion of a first mask pattern M11 may remain on an insulating thin film 150.

Referring to FIGS. 37A-37C, by using a method similar to that described with reference to FIGS. 26A-26C, the gate line GL exposed through the upper space US6 (refer to FIGS. 36A-36C) may be etched using the insulating thin film 150 and the isolation insulating spacers 610 as etch masks. Thus, a separation space SE6 including a plurality of isolation recesses 112R may be formed on a substrate 110.

Afterward, by using the same method as the method of forming the isolation insulating pattern 160 with reference to FIGS. 15A-16C, an inner isolation insulating film 620 may be formed in the separation space SE6 to form an isolation insulating pattern 660, and an interlayer insulating film 170 may be formed to cover the insulating thin film 150 and the isolation insulating pattern 660. Thus, the IC device 600 shown in FIGS. 34A-34C may be formed.

Figure 38:
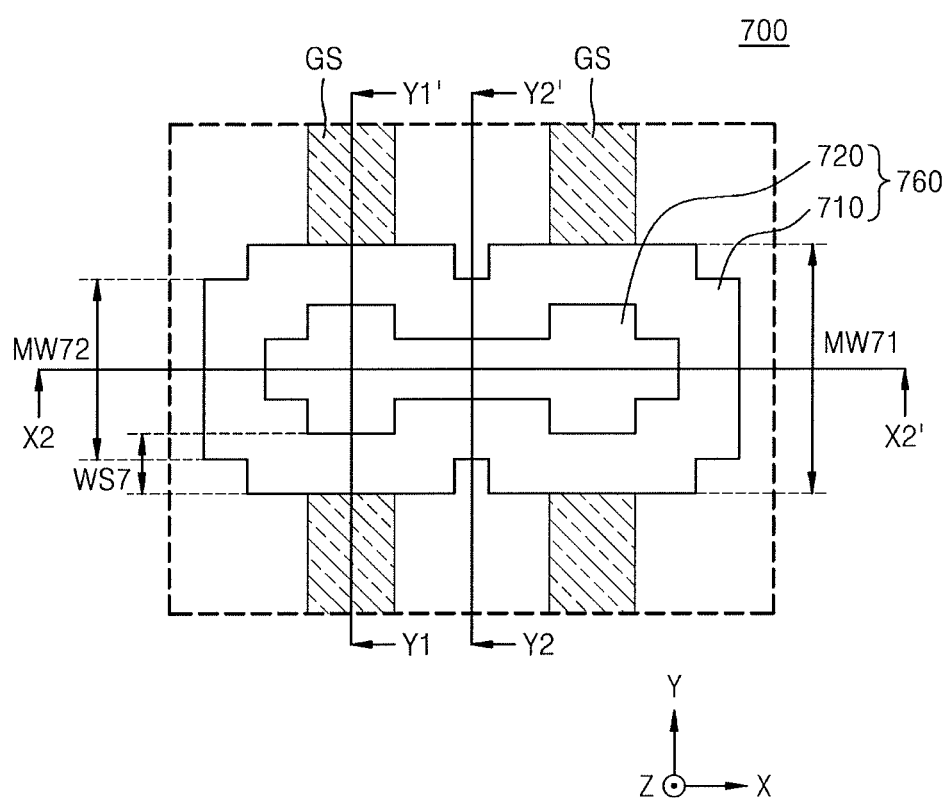
FIG. 38 illustrates a plan view of an IC device according to embodiments.
Figure 39A:
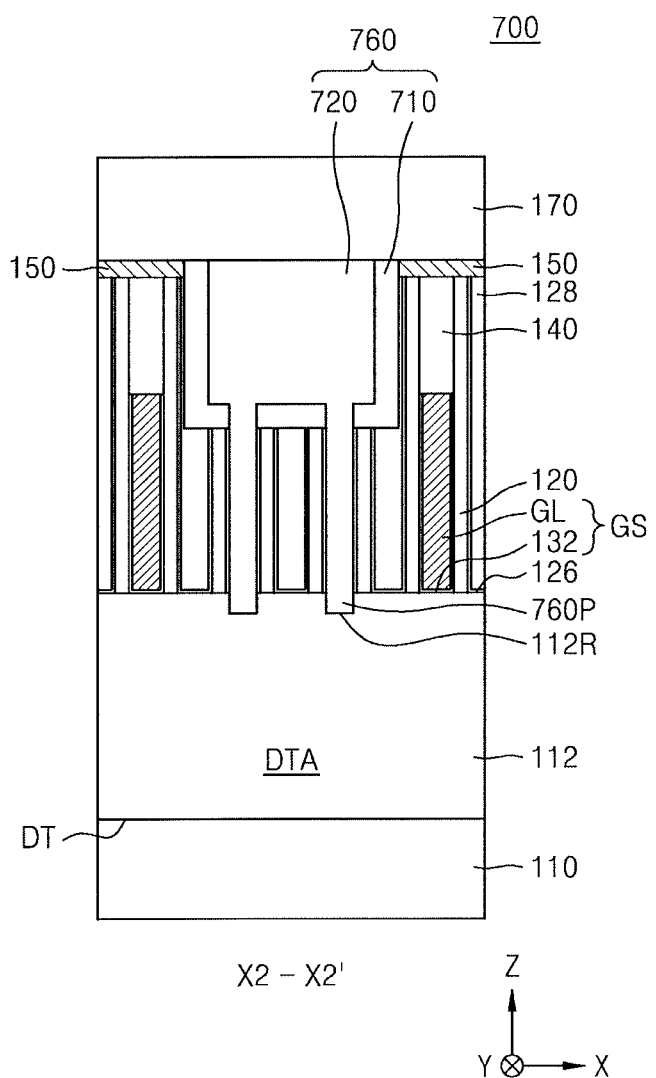
FIGS. 39A, 39B, and 39C illustrate cross-sectional views of main components of the IC device shown in FIG. 38.
Figure 39B:
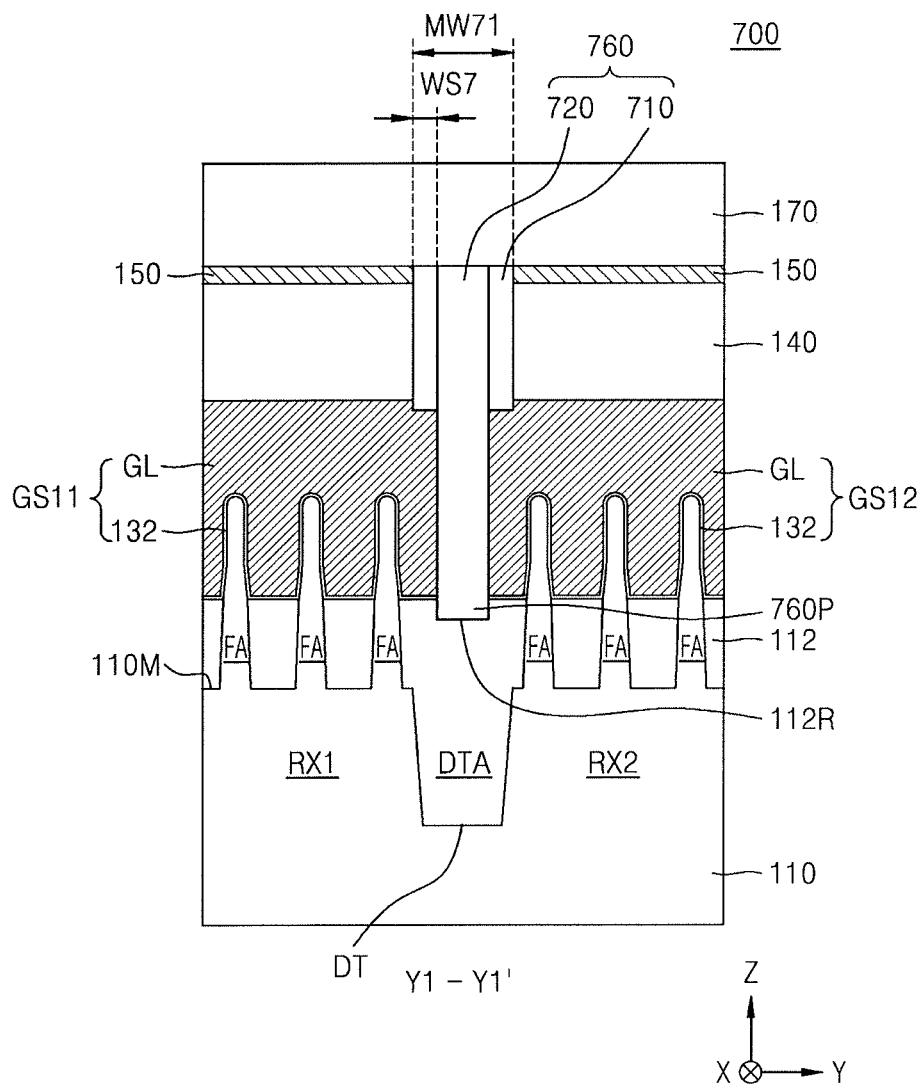
Figure 39C:
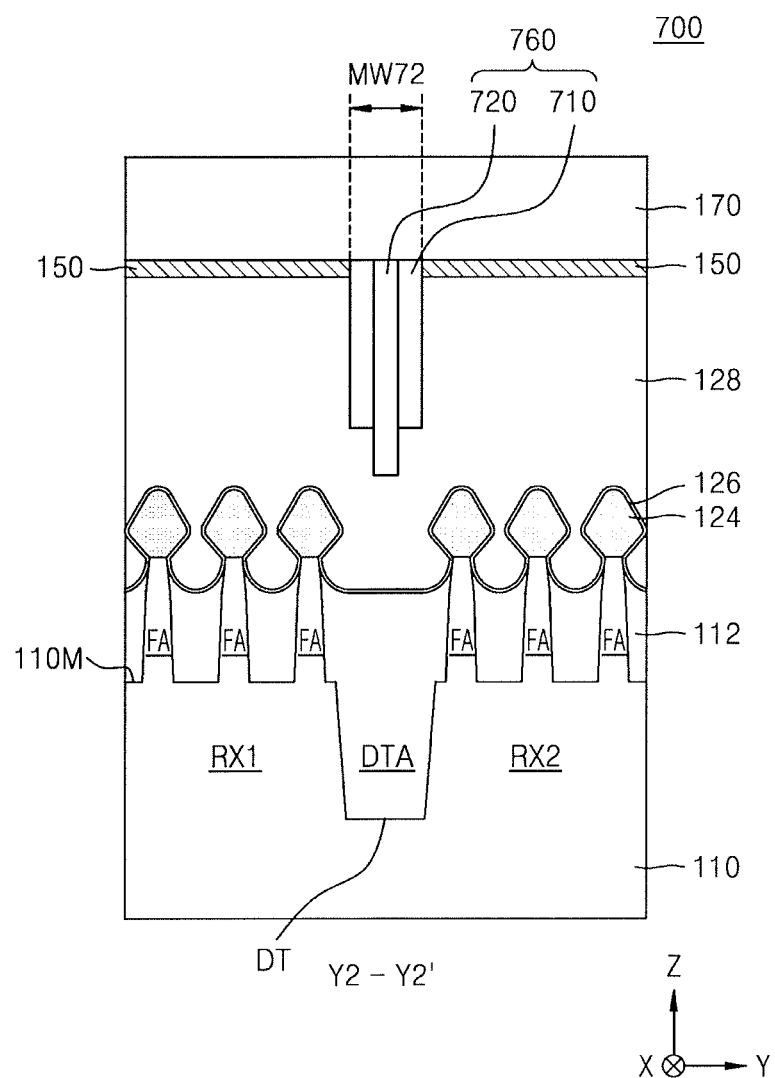

FIGS. 38, 39A, 39B, and 39C are diagrams of an IC device according to some embodiments. FIG. 38 is an enlarged plan view of region "AX" illustrated in FIG. 1. FIG. 39A is a cross-sectional view along line X2-X2' of FIG. 38. FIG. 39B is a cross-sectional view along line Y1-Y1' of FIG. 38. FIG. 39C is a cross-sectional view along line Y2-Y2' of FIG. 38. In FIGS. 38, 39A, 39B, and 39C, same reference numerals are used to denote the same elements as in FIGS. 1 to 34C, and detailed descriptions thereof will be omitted.

Referring to FIGS. 38, 39A, 39B, and 39C, the IC device 700 may have substantially the same configuration as the IC device 400 shown in FIGS. 27 and 28A-28C. However, the IC device 700 may include an isolation insulating pattern 760. A width of the isolation insulating pattern 760 in the Y direction may vary along the X direction. For example, the Y-direction minimum width MW72 of at least a part of a portion of the isolation insulating pattern 760, which has opposite sidewalls covered by the inter-gate dielectric film 128, may be less than the Y-direction maximum width MW71 of a portion of the isolation insulating pattern 760, which has opposite sidewalls covered by a first gate structure GS11 and a second gate structure GS12 that extend in a straight line in the Y direction.

The isolation insulating pattern 760 may include isolation insulating spacers 710 and an inner isolation insulating film 720. The isolation insulating spacers 710 may include portions interposed between the inner isolation insulating film 720 and the gate insulating capping layer 140. The isolation insulating spacers 710 may cover sidewalls of the gate insulating capping layer 140 by a substantially constant width WS7. The Y-direction minimum width MW72 of the isolation insulating pattern 760 may be greater than twice the width WS7 of the isolation insulating spacers 710.

The isolation insulating pattern 760 may include the inner isolation insulating film 720 having sidewalls surrounded by the isolation insulating spacers 710. The inner isolation insulating film 720 may include a protrusion 760P that protrudes toward the substrate 110. A vertical level of a bottom surface of the protrusion 760P may be lower than a vertical level of a top surface of the device isolation film 112. The device isolation film 112 may have the isolation recess 112R that surrounds the protrusion 760P.

A vertical level of bottom surfaces of the isolation insulating spacers 710 may be higher than a vertical level of uppermost surfaces of the plurality of source/drain regions 124. The inner isolation insulating film 720 may be located closer to the substrate 110 than the isolation insulating spacers 710.

Specific configurations of materials included in the isolation insulating spacers 710 and the inner isolation insulating film 720 may be understood with reference to the isolation insulating spacers 310 and the inner isolation insulating film 320 shown in FIGS. 22 and 23A-23C.

Figure 40A:
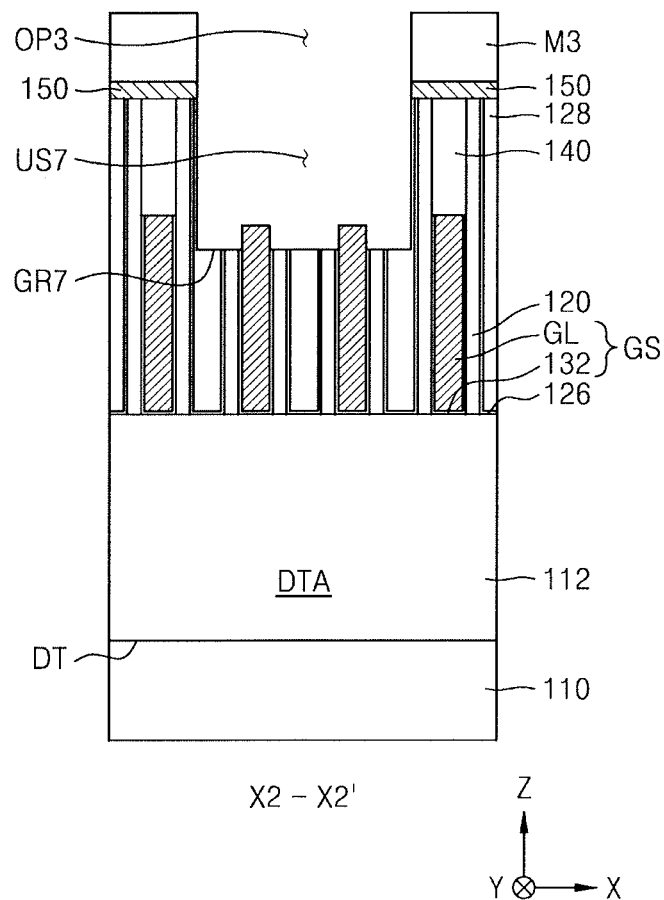
Figure 40B:
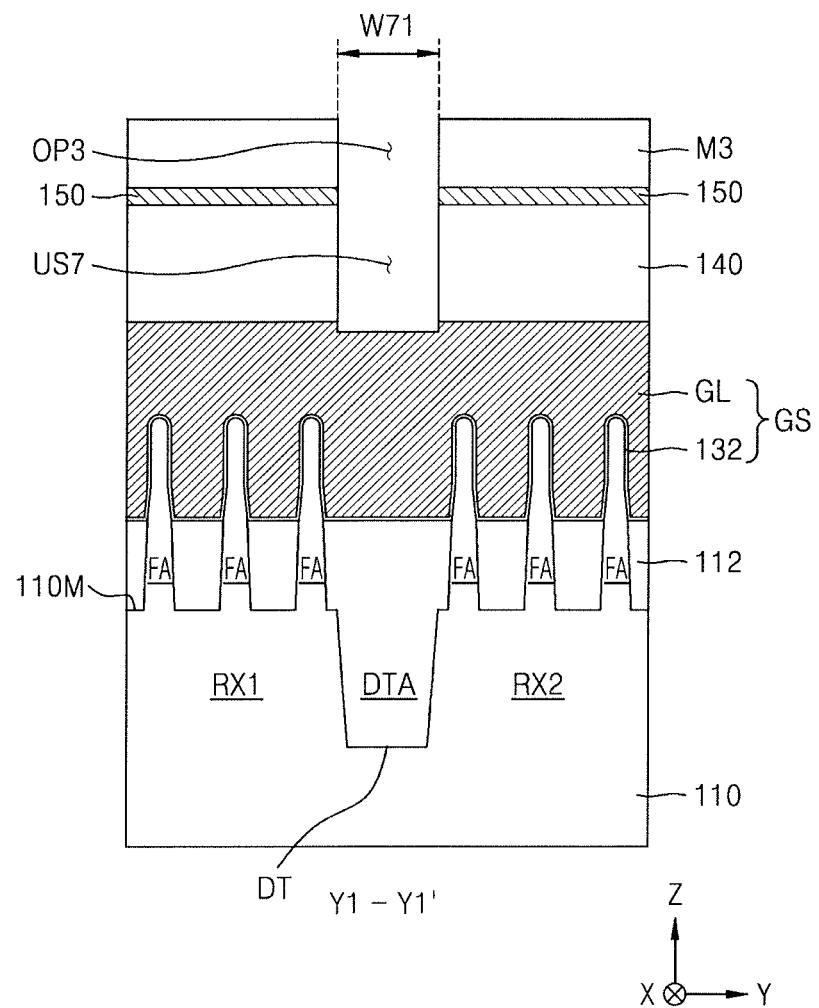
Figure 40C:
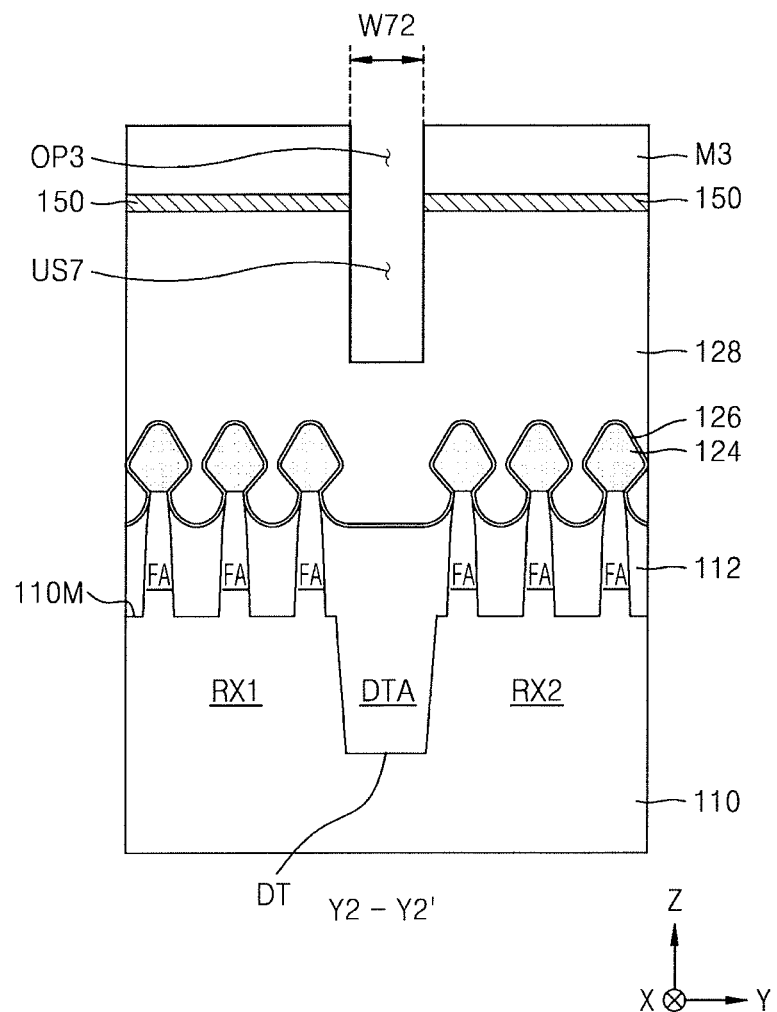
Figure 41A:
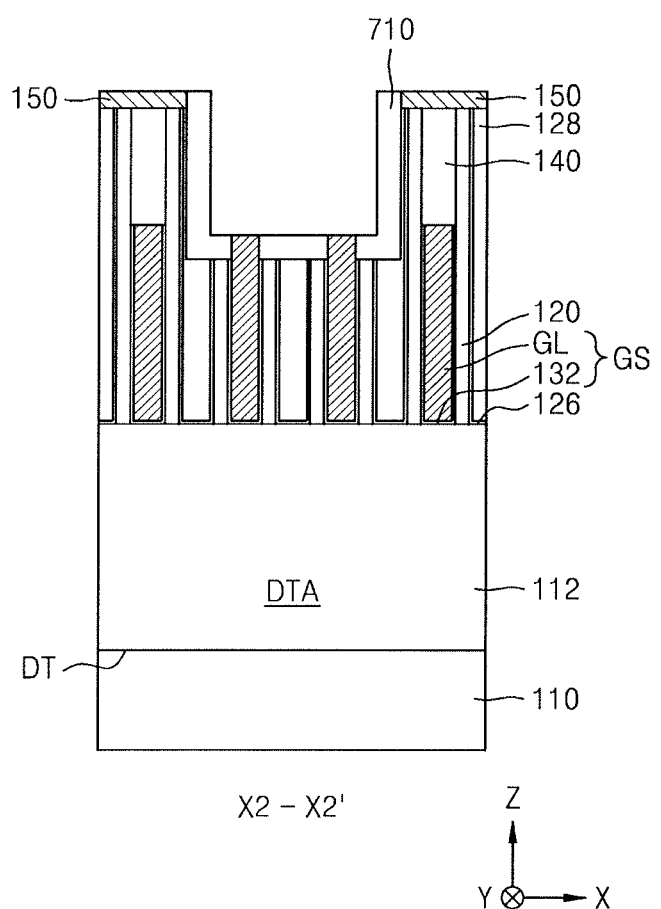
Figure 41B:
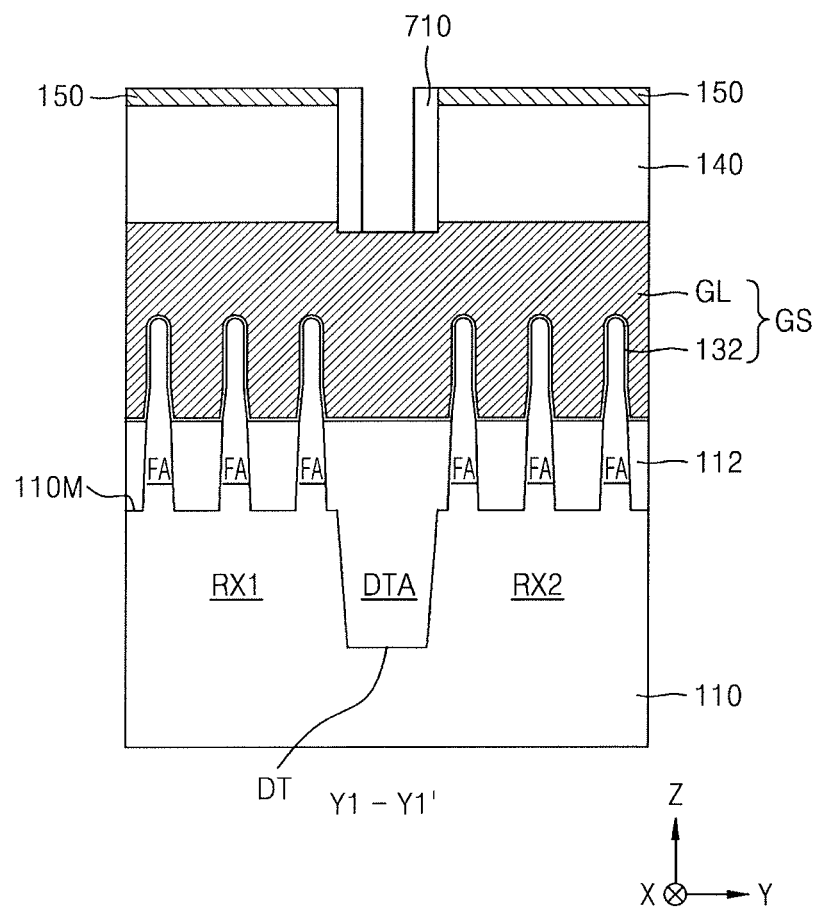
Figure 41C:
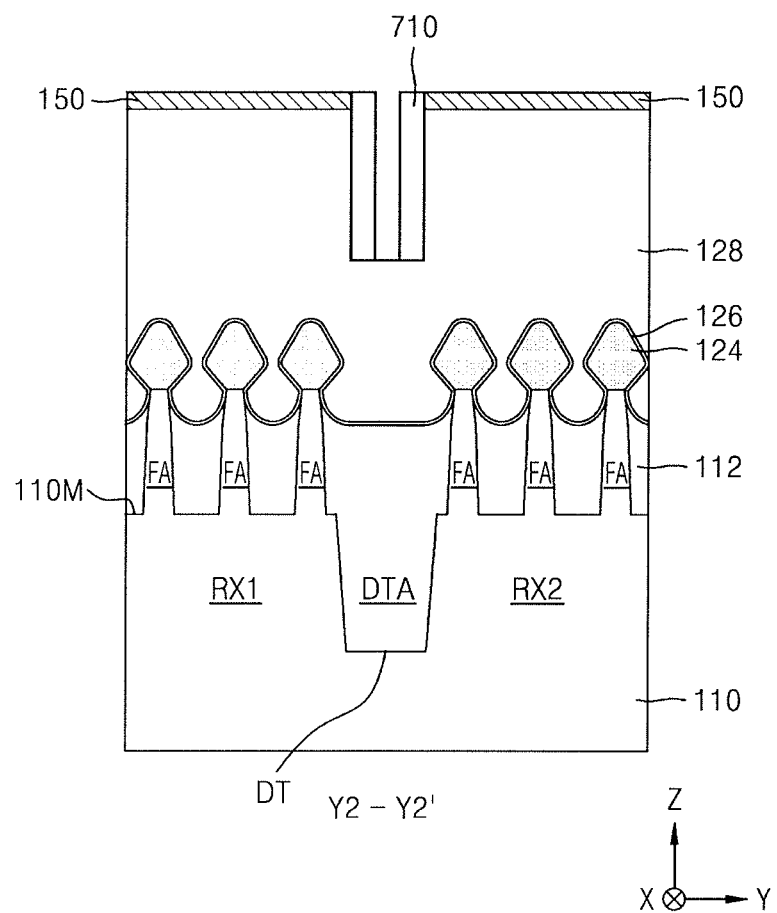
Figure 42A:
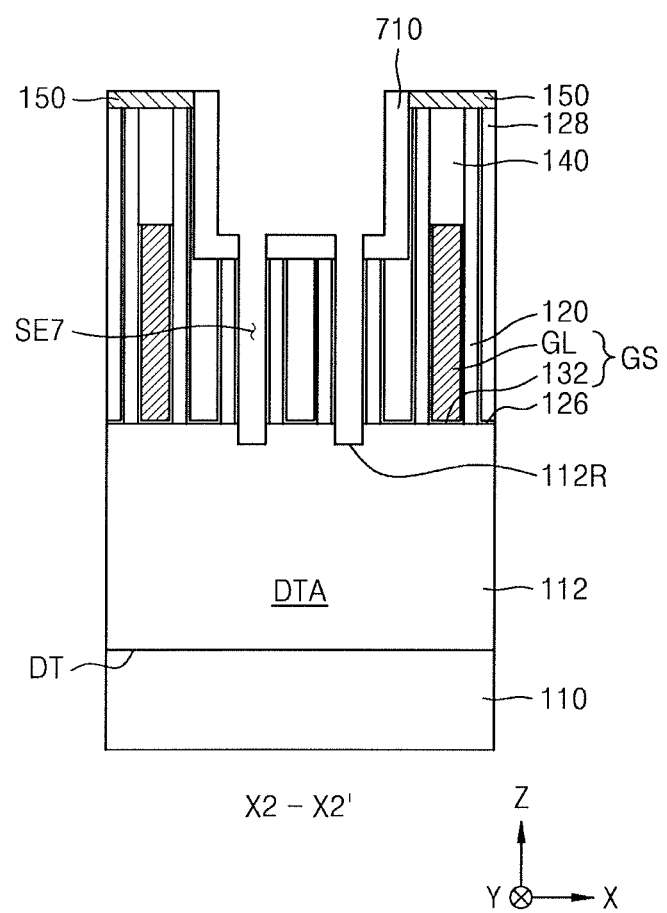
Figure 42B:
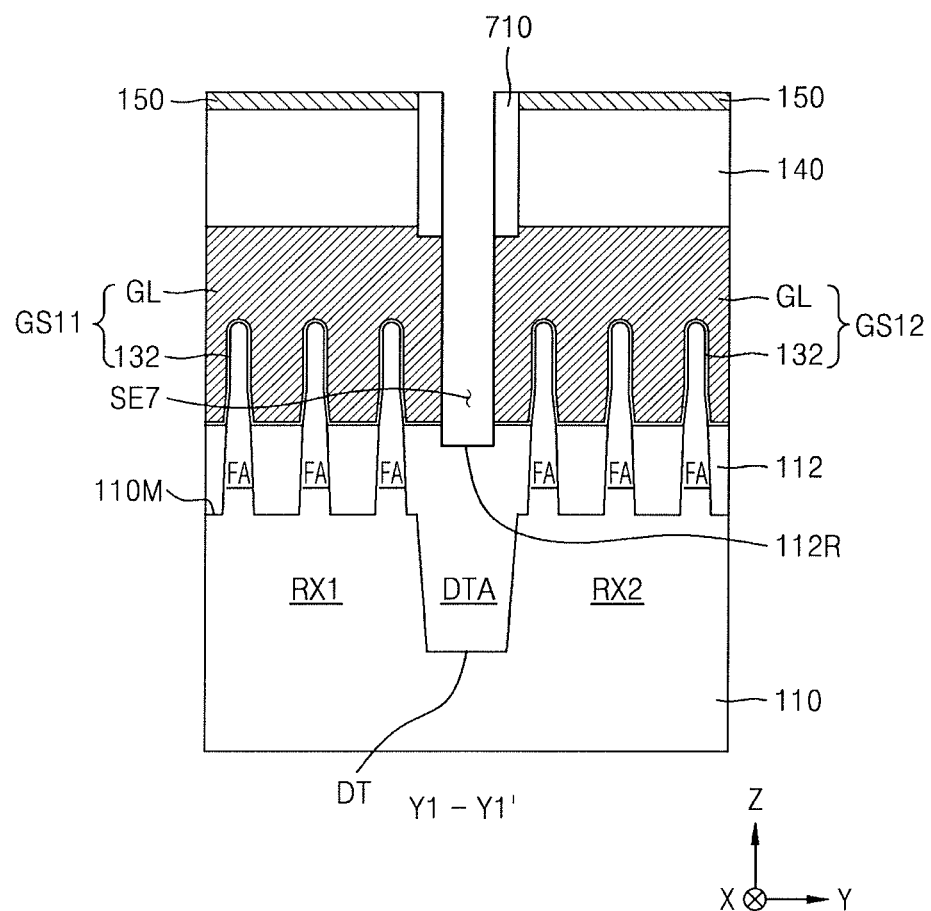
Figure 42C:
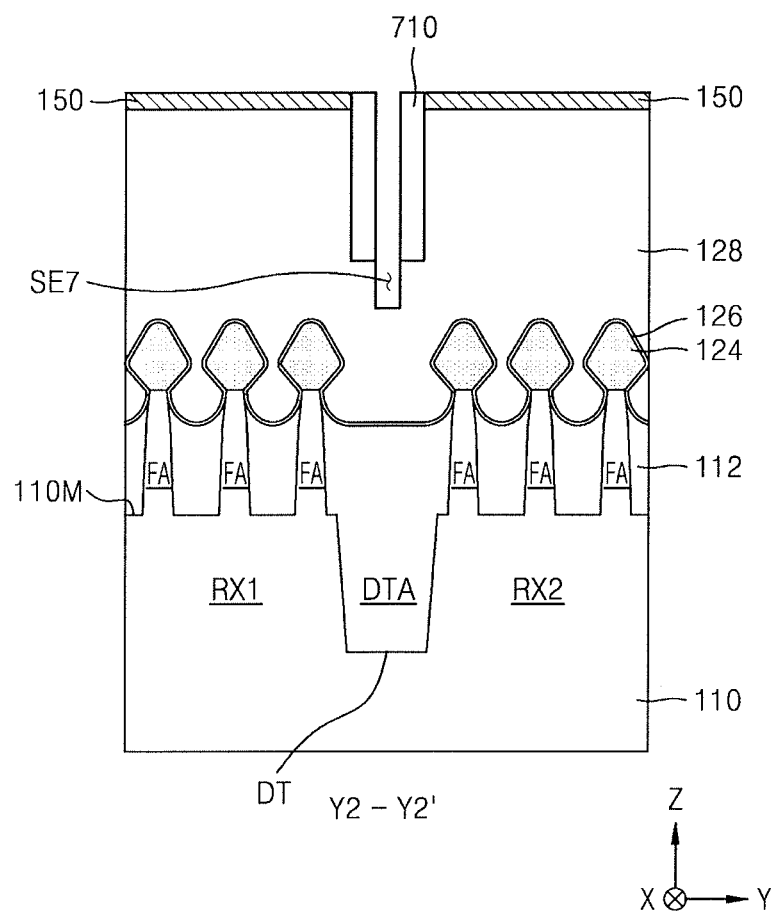

FIGS. 40A to 42A, 40B to 42B, and 40C to 42C are cross-sectional views of stages in a method of manufacturing an IC device, according to some embodiments. FIGS. 40A, 41A, and 42A each show a sectional configuration along line X2-X2' of FIG. 1. FIGS. 40B, 41B, and 42B each show a sectional configuration along line Y1-Y1' of FIG. 1. FIGS. 40C, 41C, and 42C each show a sectional configuration along line Y2-Y2' of FIG. 1. A method of manufacturing the IC device 700 shown in FIGS. 38 and 39A to 39C will be described with reference to FIGS. 40A to 42C. In FIGS. 40A to 42C, same reference numerals are used to denote same elements as in FIGS. 1-39C, and detailed descriptions thereof will be omitted.

Referring to FIGS. 40A, 40B, and 40C, the gate insulating capping layer 140 may be etched using a method similar to that described with reference to FIGS. 35A-35C to expose the gate structure GS, and a groove GR7 may be then formed in the vicinity of the gate line GL. However, in the present example embodiment, a mask pattern M3 having a different planar shape from the mask pattern M1 may be used. The mask pattern M3 may have an opening OP3. A planar shape of the opening OP3 may correspond to a planar shape of the isolation insulating pattern 760 shown in FIG. 38. The mask pattern M3 may have a single layer or a multilayered structure including a plurality of hard mask layers that are stacked. In some embodiments, the mask pattern M3 may include a silicon nitride film. In some embodiments, the mask pattern M3 may include a combination of a silicon nitride film and a silicon oxide film.

While the gate insulating capping layer 140 is being removed using the mask pattern M3 as an etch mask, portions of insulating spacers 120, which cover sidewalls of the gate insulating capping layer 140, may also be removed together. An upper portion of the gate structure GS may also be etched using an over etching process. As a result, an upper space US7 including the groove GR7 may be formed in an upper portion of the gate structure GS and in the inter-gate dielectric film 128.

Referring to FIGS. 41A, 41B, and 41C, by using a method similar to that described with reference to FIGS. 36A-36C, a spacer insulating film may be formed to conformally cover exposed surfaces of the resultant structure including the upper space US7 to a substantially uniform thickness. Thereafter, the spacer insulating film may be etched back so that isolation insulating spacers 710 may be formed on inner sidewalls of the upper space US7 and inside the groove GR7. The spacer insulating film may include a silicon nitride film.

Referring to FIGS. 42A, 42B, and 42C, by using a method similar to that described with reference to FIGS. 37A-37C, the gate line GL exposed through the upper space US7 may be etched using an insulating thin film 150 and isolation insulating spacers 610 as etch masks. Thus, a separation space SE7 including the plurality of isolation recesses 112R may be formed on the substrate 110.

Thereafter, by using the same method as the method of forming the isolation insulating pattern 160 with reference to FIGS. 15A-16C, the inner isolation insulating film 720 may be formed in the separation space SE7, and the interlayer insulating film 170 may be formed to cover the insulating thin film 150 and the isolation insulating pattern 660. Thus, the IC device 700 shown in FIGS. 38 and 39A-39C may be formed.

Figure 43A:
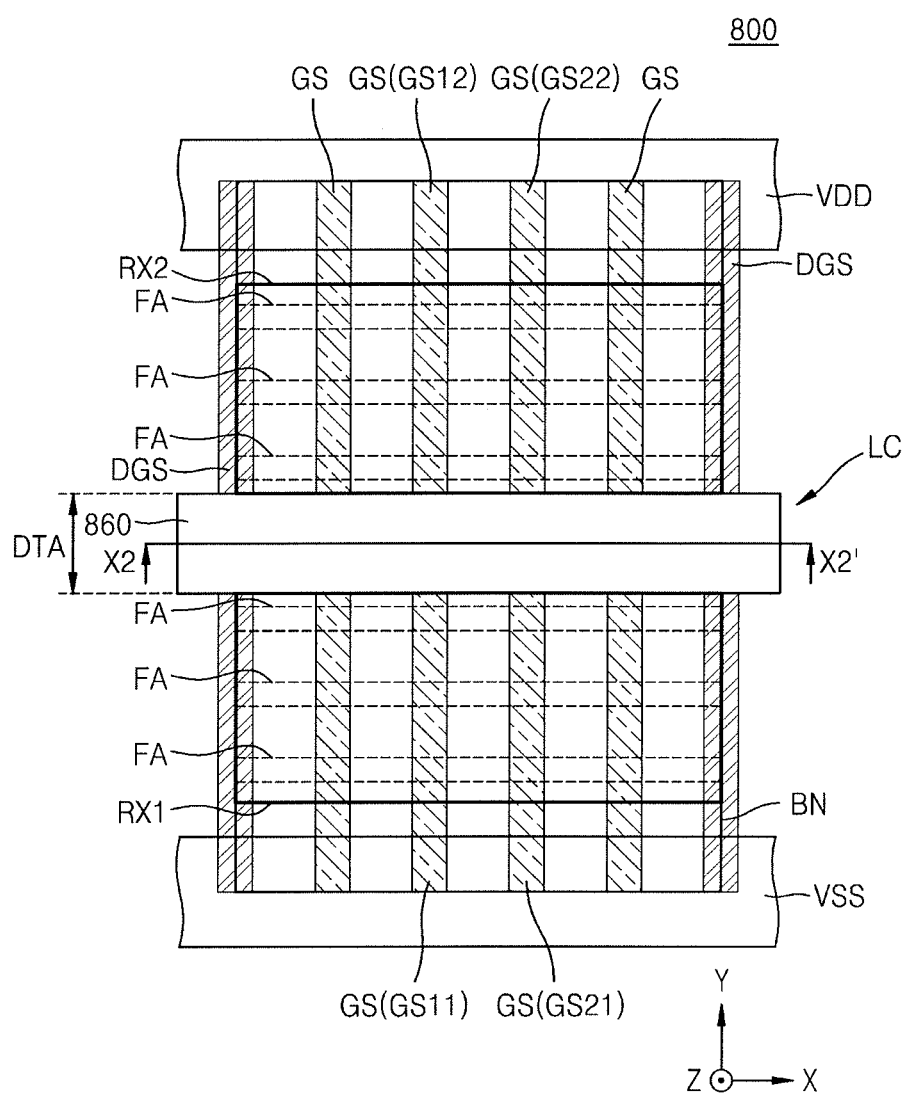
FIG. 43A illustrates a plan layout of an IC device according to embodiments.
Figure 43B:
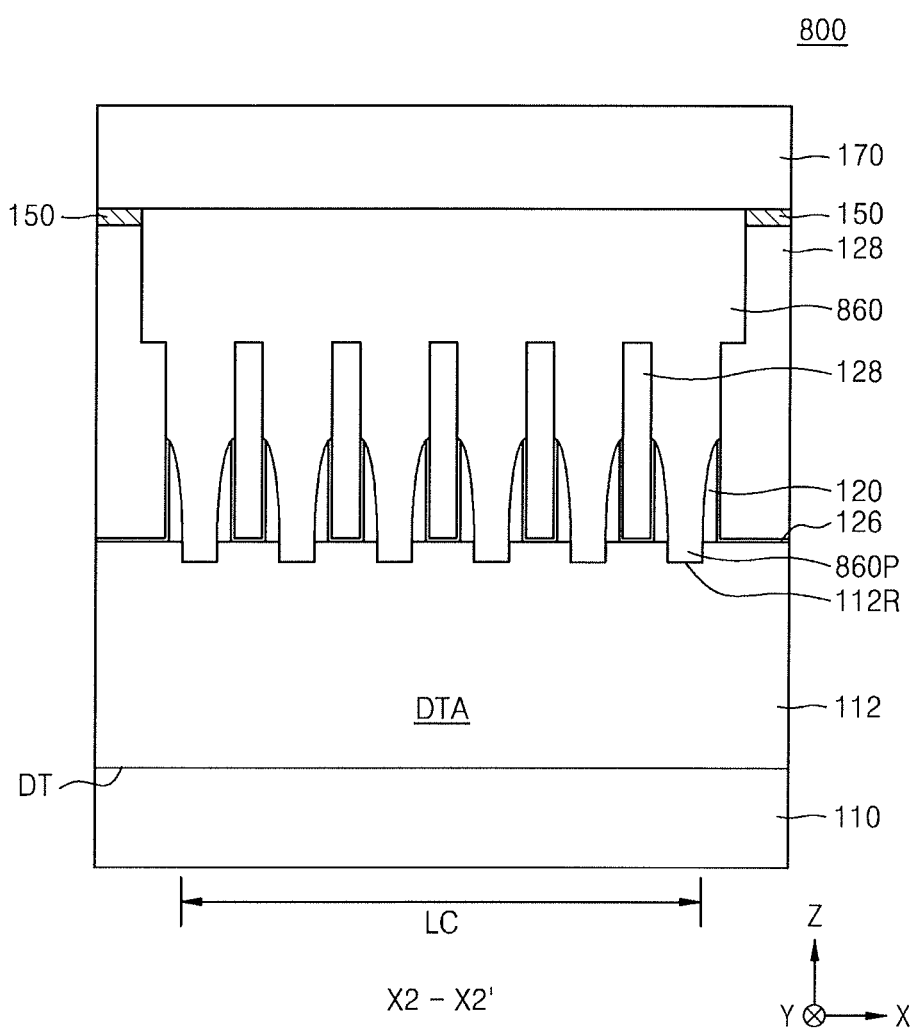
FIG. 43B illustrates a cross-sectional view taken along line X2-X2' of FIG. 43A.

FIGS. 43A and 43B are diagrams of an IC device 800 according to embodiments. FIG. 43A is a plan layout diagram of main components of the IC device 800 according to the embodiments. FIG. 43B is a cross-sectional view along line X2-X2' of FIG. 43A. The IC device 800 shown in FIGS. 43A and 43B may include a logic cell LC including a FinFET device.

Referring to FIGS. 43A and 43B, the IC device 800 may have substantially the same configuration as the IC device 100 shown in FIGS. 1 and 2A-2E. However, the IC device 800 may include an isolation insulating pattern 860, which may be formed on the inter-device isolation region DTA between the first device region RX1 and the second device region RX2 of the logic cell LC. The isolation insulating pattern 860 may extend to have a width greater than a width of the logic cell LC in the widthwise direction (X direction) of the logic cell LC. The isolation insulating pattern 860 may include a portion extending inside the logic cell LC and a portion extending outside the logic cell LC.

The isolation insulating pattern 860 may include a plurality of protrusions 860P, which may protrude toward the substrate 110. The plurality of protrusions 860P may be arranged in line in the widthwise direction (X direction) of the logic cell LC. The device isolation film 112 may include the plurality of isolation recesses 112R, which may surround the plurality of protrusions 860P formed in the isolation insulating pattern 860.

Figure 44A:
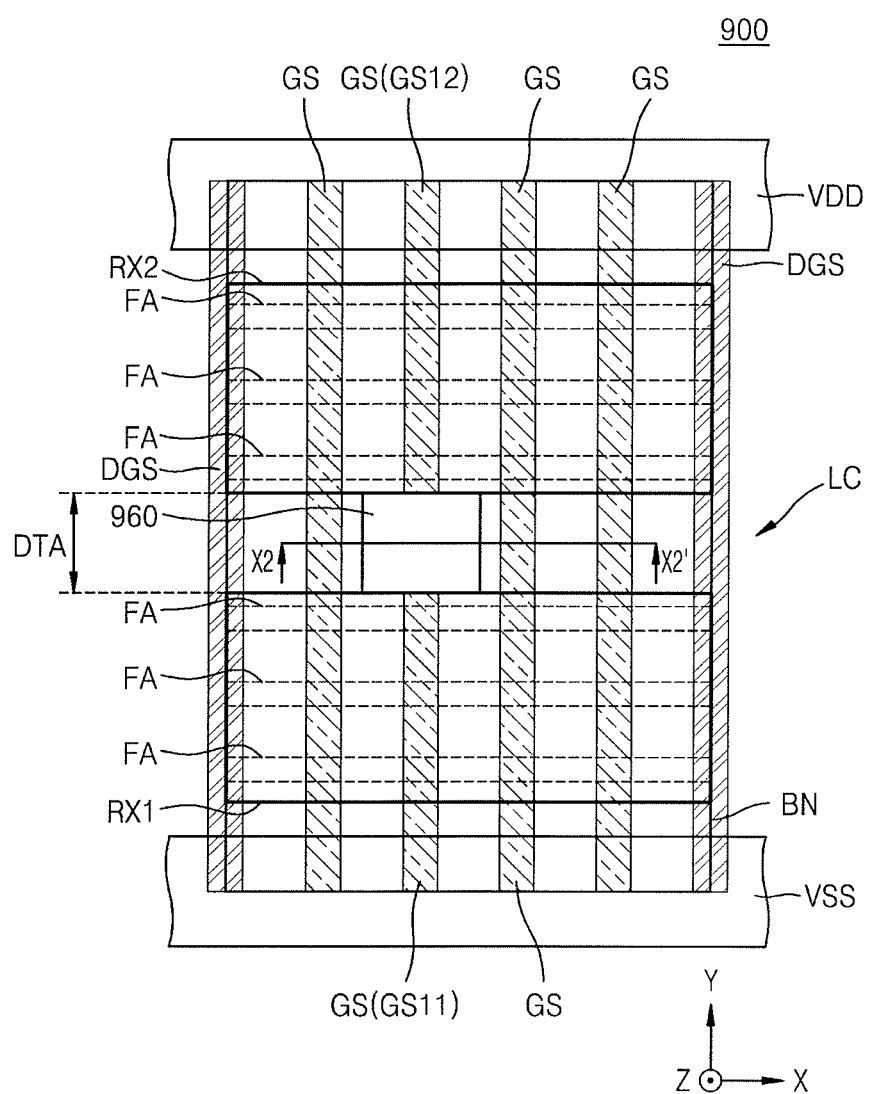
FIG. 44A illustrates a plan layout of an IC device according to embodiments.
Figure 44B:
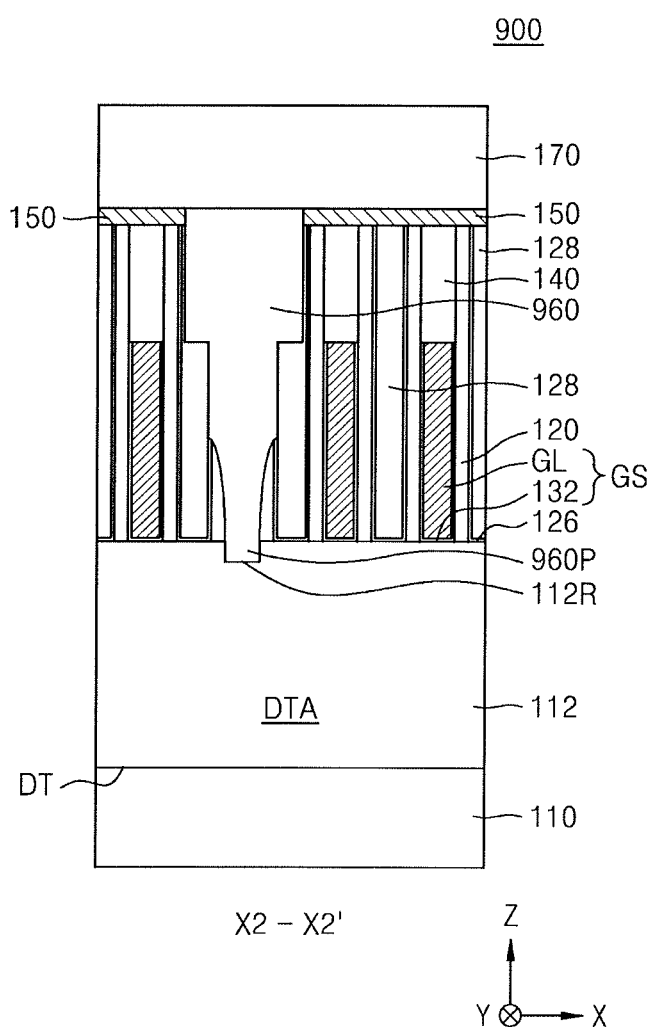
FIG. 44B illustrates a cross-sectional view taken along line X2-X2' of FIG. 44A.

FIGS. 44A and 44B are diagrams of an IC device 900 according to some embodiments. FIG. 44A is a plan layout diagram of main components of the IC device 900 according to some embodiments. FIG. 44B is a cross-sectional view along line X2-X2' of FIG. 44A. The IC device 900 shown in FIGS. 44A and 44B may include a logic cell LC including a FinFET device.

Referring to FIGS. 44A and 44B, the IC device 900 may have substantially the same configuration as the IC device 100 shown in FIGS. 1 and 2A-2E. However, the IC device 900 may include an isolation insulating pattern 960 formed to extend across only one gate structure GS in the widthwise direction (X direction) of the logic cell LC.

As shown in FIG. 44A, the plurality of gate structures GS may include the first gate structure GS11 and the second gate structure GS12, which may be spaced apart from each other in the lengthwise direction (Y direction) of the logic cell LC with the isolation insulating pattern 960 therebetween and extend in a straight line in the Y direction. The isolation insulating pattern 960 may have a width greater than a width of each of the first gate structure GS11 and the second gate structure GS12 in the widthwise direction (X direction) of the logic cell LC.

A position of the isolation insulating pattern 960 in the logic cell LC is not limited to that shown in FIG. 44A and may be arbitrarily selected according to a desired design. For example, the isolation insulating pattern 960 may be located at a position across an outermost gate structure GS from among the plurality of gate structures GS located in the logic cell LC.

The isolation insulating pattern 960 may include a protrusion 960P, which may protrude toward the substrate 110. The device isolation film 112 may have the isolation recess 112R, which may surround the protrusion 960P included in the isolation insulating pattern 960. Specific configurations of the isolation insulating pattern 960 and the protrusion 960P may be substantially the same as those of the isolation insulating pattern 160 and the protrusion 160P described with reference to FIGS. 1 and 2A to 2E.

Although FIGS. 43A and 43B and FIGS. 44A and 44B illustrate cases in which each of the isolation insulating pattern 860 and the isolation insulating pattern 960 is a single-layered structure, embodiments are not limited thereto. For example, each of the isolation insulating pattern 860 and the isolation insulating pattern 960 may have a multilayered structure so as to have a configuration similar to the isolation insulating pattern 162 illustrated in FIGS. 3A-3C, the isolation insulating pattern 262 illustrated in FIGS. 18A-18C, the isolation insulating pattern 360 illustrated in FIGS. 22 and 23A-23C, the isolation insulating pattern 460 illustrated in FIGS. 27 and 28A-28C, the isolation insulating pattern 560 illustrated in FIGS. 32 and 33A-33C, the isolation insulating pattern 660 illustrated in FIGS. 34A-34C, or the isolation insulating pattern 760 illustrated in FIGS. 38 and 39A-39C. Also, each of the isolation insulating pattern 860 and the isolation insulating pattern 960 may have other multilayered structures that have been changed or modified from these configurations within the spirit and scope of the embodiments.

By way of summation and review, embodiments include a downscaled integrated circuit (IC) device having a device region with a reduced area, while maintaining a stable insulation distance between adjacent conductive regions in a minimum area even if the density of interconnections and contact regions formed at a same level increases. That is, according to embodiments, a gate cut structure may be formed after forming a metal gate, e.g., as opposed to after forming a dummy poly gate, and a recess in an interlayer insulating film may be formed to have a reduced depth during cutting, e.g., removal of a portion, of the metal gate, e.g., due to selective etching, thereby preventing damage to source/drain regions on active fins. After the metal gate cut process, the metal gate may be completely cut, and an isolation region between the cut metal gate portions may be formed to have a planar top surface (between the cut metal gate portions) and a non-uniform height bottom surface relative to a bottom of the substrate. Since during metal cutting the interlayer insulating film is recessed to a reduced depth due to the selective etching, deeper portions of the isolation region correspond to gate positions, while shallower portions of the isolation region correspond to the reduced recess depth of the interlayer insulating film and source/drain regions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit (IC) device, comprising:
   fin patterns on a substrate along a first direction;
   gate electrodes along a second direction perpendicular to the first direction;
   source/drain regions on the fin patterns; and
   an isolation region extending in the first direction between and in parallel with two adjacent fin patterns of the fin patterns, the isolation region separating at least one gate electrode of the gate electrodes into first and second gate electrodes,
   wherein the isolation region includes a first portion between the first and second gate electrodes, and a second portion separated from the first portion along the first direction and having a non-overlapping relationship with the first and second gate electrodes, a thickness of the lowermost part of the first portion relative to a bottom of the substrate being larger than a thickness of the lowermost part of the second portion relative to a bottom of the substrate, and a lower part of the second portion having a decreasing width at a bottom thereof.

2. The IC device as claimed in claim 1, further comprising:
a gate capping insulating layer on the gate electrodes, respectively; and
an inter-gate dielectric film between the gate electrodes, the inter-gate dielectric film including a material having a lower etch rate than a material of the gate capping insulating layer.

3. The IC device as claimed in claim 1, further comprising a spacer surrounding sidewalls of the isolation region.

4. The IC device as claimed in claim 3, wherein the spacer is only on upper sidewalls of the isolation region, a distance between the bottom of the substrate and a bottom of the spacer being larger than a distance between the bottom of the substrate and tops of source/drain regions on the fin patterns.

5. The IC device as claimed in claim 1, wherein:
side surfaces of the first portion of the isolation region spaced apart from each other along the second direction face the first and second gate electrodes, respectively, and
side surfaces of the second portion of the isolation region spaced apart from each other along the second direction face a dielectric layer that covers the source/drain regions, respectively.

6. An integrated circuit (IC) device, comprising:
a first region and a second region adjacent to each other along a first direction on a substrate;
fin patterns in each of the first region and the second region, the fin patterns extending along a second direction perpendicular to the first direction;
gate electrodes extending along the first direction and intersecting the fin patterns; and
an isolation region extending continuously in the second direction between two or more gate electrodes and between the first region and the second region, a bottom of the isolation region having a non-uniform height relative to a bottom of the substrate along the second direction.

7. The IC device as claimed in claim 6, wherein:
the isolation region separates at least one gate electrode of the gate electrodes into first and second gate electrodes,
the isolation region includes a first portion between the first and second gate electrodes, and a second portion having a non-overlapping relationship with the first and second gate electrodes, and
the first portion and the second portion are integral with each other in a single, seamless structure, top surfaces of the first portion and the second portion being level with each other.

8. The IC device as claimed in claim 6, wherein:
the isolation region separates at least one gate electrode of the gate electrodes into first and second gate electrodes,
the isolation region includes a first portion between the first and second gate electrodes, and a second portion having a non-overlapping relationship with the first and second gate electrodes, and
a distance between the bottom of the substrate and a bottom of the first portion is smaller than a distance between the bottom of the substrate and a bottommost surface of each of the first and second gate electrodes.

9. The IC device as claimed in claim 6, wherein:
the isolation region includes a first portion and a second portion, the first portion having a prismatic shape, and the second portion including protrusions extending from the prismatic shape toward the substrate, and
the protrusions are spaced apart from each other along the second direction.

10. The IC device as claimed in claim 6, wherein the isolation region has a non-overlapping relationship with the gate electrodes in a top view.

11. The IC device as claimed in claim 6, wherein the isolation region is a continuous insulating structure, an entirety of the isolation region being between two adjacent fin patterns of the fin patterns.

12. The IC device as claimed in claim 6, further comprising:
a gate capping insulating layer on the gate electrodes, respectively; and
an inter-gate dielectric film between the gate electrodes, the inter-gate dielectric film including a material different from a material of the gate capping insulating layer.

13. The IC device as claimed in claim 6, further comprising a spacer surrounding sidewalls of the isolation region.

14. The IC device as claimed in claim 13, wherein the spacer is only on upper sidewalls of the isolation region, a distance between the bottom of the substrate and a bottom of the spacer is larger than a distance between the bottom of the substrate and tops of source/drain regions on the fin patterns.

15. The IC device as claimed in claim 6, wherein:
the isolation region separates at least one gate electrode of the gate electrodes into first and second gate electrodes, and
side surfaces of the isolation region spaced apart from each other along the first direction face the first and second gate electrodes, respectively.

16. An integrated circuit (IC) device, comprising:
a first region and a second region adjacent to each other along a first direction on a substrate;
fin patterns in each of the first region and the second region, the fin patterns extending along a second direction perpendicular to the first direction;
gate electrodes extending along the first direction and intersecting the fin patterns; and
an isolation region extending continuously in the second direction between two or more gate electrodes and between the first region and the second region, an entirety of a width of the isolation region along the first direction being between two of the fin patterns that are directly adjacent to each other along the first direction,
wherein a bottom of the isolation region extending in the second direction has a non-uniform height relative to a bottom of the substrate along the second direction.

17. The IC device as claimed in claim 16, wherein:
the isolation region separates at least one gate electrode of the gate electrodes into first and second gate electrodes,
the isolation region includes a first portion between the first and second gate electrodes, and a second portion having a non-overlapping relationship with the first and second gate electrodes, and
the first portion and the second portion are integral with each other in a single, seamless structure, top surfaces of the first portion and the second portion being level with each other.

18. The IC device as claimed in claim 16, wherein a lower part of the isolation region has a smaller width as the lower part approaches the substrate.

19. The IC device as claimed in claim 16, wherein:
the isolation region separates at least one gate electrode of the gate electrodes into first and second gate electrodes, and side surfaces of the isolation region spaced apart from each other along the first direction face the first and second gate electrodes, respectively.

\* \* \* \* \*